United States Patent
Ba et al.

(10) Patent No.: US 12,312,933 B2
(45) Date of Patent: May 27, 2025

(54) APPROACHES TO DIRECTIONAL DRILLING

(71) Applicant: Schlumberger Technology Corporation, Sugar Land, TX (US)

(72) Inventors: Samba Ba, Beijing (CN); Lu Jiang, Beijing (CN); Adrien Chassard, Houston, TX (US); Magnus Hedlund, Houston, TX (US); Maja Ignova, Stonehouse (GB); Katharine Mantle, Stonehouse (GB); Jinsoo Kim, Houston, TX (US); Tao Yu, Beijing (CN); Farid Toghi, Beijing (CN); Hendrik Suryadi, Beijing (CN); Qing Liu, Beijing (CN); Diego Medina, Beijing (CN)

(73) Assignee: Schlumberger Technology Corporation, Sugar Land, TX (US)

( * ) Notice: Subject to any disclaimer, the term of this patent is extended or adjusted under 35 U.S.C. 154(b) by 325 days.

(21) Appl. No.: 17/653,404

(22) Filed: Mar. 3, 2022

(65) Prior Publication Data

US 2022/0290550 A1  Sep. 15, 2022

Related U.S. Application Data

(60) Provisional application No. 63/280,058, filed on Nov. 16, 2021, provisional application No. 63/200,380, (Continued)

(51) Int. Cl.
*E21B 44/00* (2006.01)
*E21B 7/06* (2006.01)
*E21B 47/022* (2012.01)

(52) U.S. Cl.
CPC .............. *E21B 44/00* (2013.01); *E21B 7/068* (2013.01); *E21B 47/022* (2013.01); *E21B 2200/20* (2020.05)

(58) Field of Classification Search
CPC ........ E21B 44/00; E21B 7/068; E21B 47/022; E21B 2200/20; G06F 30/20
See application file for complete search history.

(56) References Cited

U.S. PATENT DOCUMENTS

2007/0204994 A1* 9/2007 Wimmersperg .... E21B 43/2401
166/302
2015/0330209 A1  11/2015 Panchal et al.
(Continued)

FOREIGN PATENT DOCUMENTS

CN  108952569 B  * 12/2020 ............. E21B 44/00
WO  2016172006 A1  10/2016
WO  2019132929 A1  7/2019

OTHER PUBLICATIONS

Ba, S. et al., "Autonomous Directional Drilling Planning and Execution Using an Industry 4.0 Platform", SPE-204607-MS, 2021, presented at the SPE Middle East Oil & Gas Show and Conference, Manama, Bahrain, 16 pages.
(Continued)

*Primary Examiner* — Catherine T. Rastovski
*Assistant Examiner* — Lal C Mang
(74) *Attorney, Agent, or Firm* — Jeffrey D. Frantz

(57) ABSTRACT

A method can include receiving data for a bottom hole assembly of a drillstring and a drill plan; generating candidate trajectories using at least a portion of the data; generating drill command schedules for the candidate trajectories; ranking the candidate trajectories based at least in part on the
(Continued)

drill command schedules; and outputting at least a top ranked candidate trajectory and its corresponding drill command schedule.

20 Claims, 56 Drawing Sheets

Related U.S. Application Data filed on Mar. 3, 2021, provisional application No. 63/200,376, filed on Mar. 3, 2021.

(56) References Cited

U.S. PATENT DOCUMENTS

| | | | |
|---|---|---|---|
| 2017/0211372 A1 | 7/2017 | Samuel | |
| 2017/0306702 A1* | 10/2017 | Summers | E21B 7/10 |
| 2018/0051552 A1* | 2/2018 | Li | E21B 47/024 |
| 2019/0128067 A1* | 5/2019 | Viens | E21B 7/04 |
| 2020/0011167 A1* | 1/2020 | Zhao | E21B 44/00 |
| 2020/0109618 A1* | 4/2020 | Flanagan | E21B 7/10 |
| 2020/0256181 A1* | 8/2020 | Jamieson | E21B 7/00 |
| 2023/0279727 A1* | 9/2023 | Reagan | E21B 47/09 |
| | | | 700/275 |

OTHER PUBLICATIONS

Search Report and Written Opinion of International Patent Application No. PCT/US2022/018728 dated Jun. 16, 2022, 8 pages.

* cited by examiner

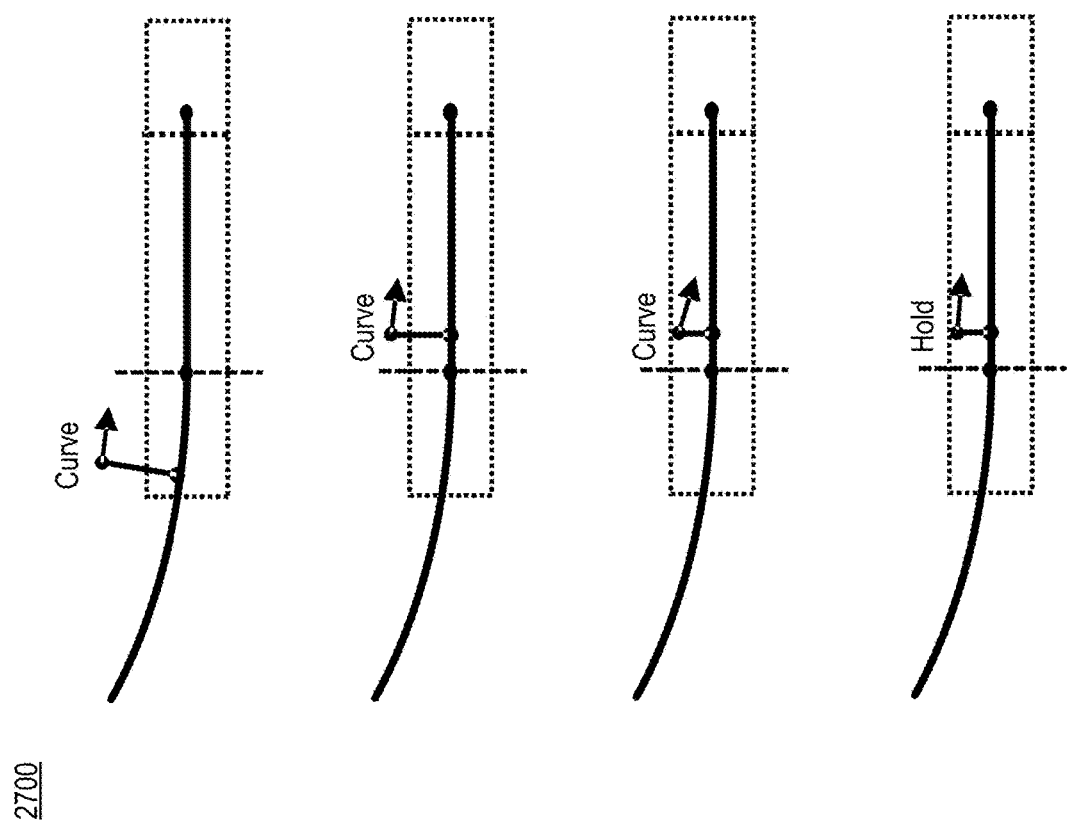
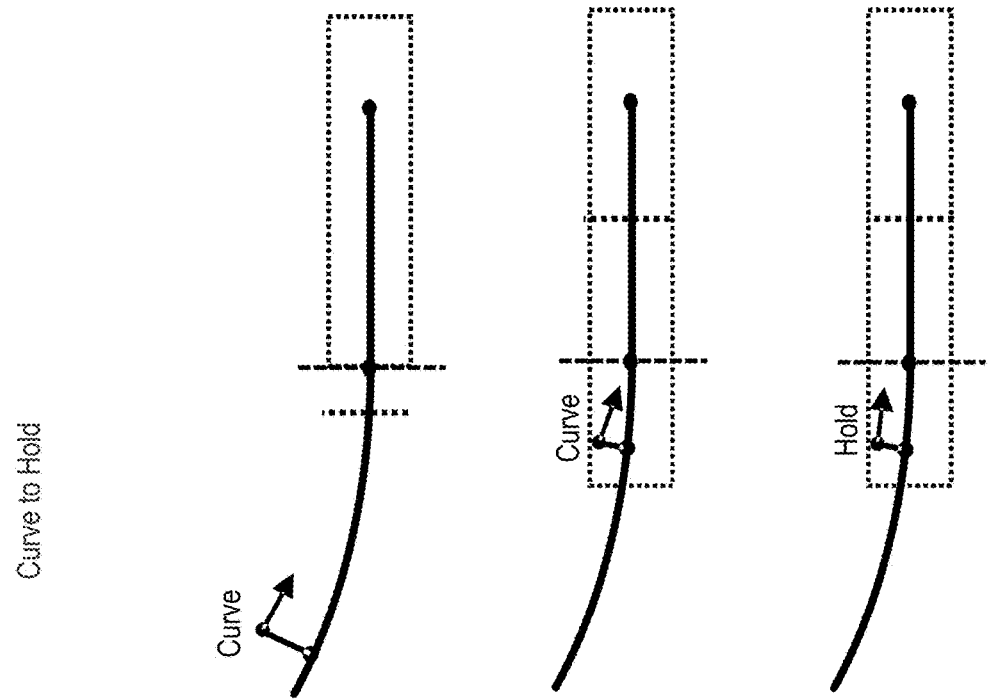
Fig. 27

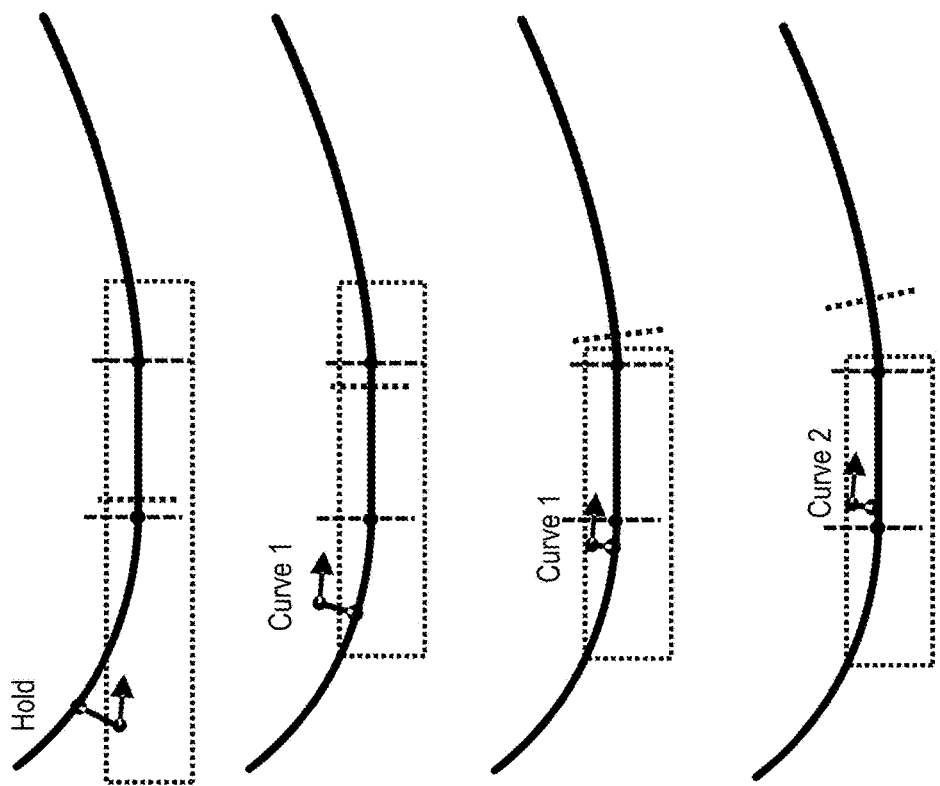
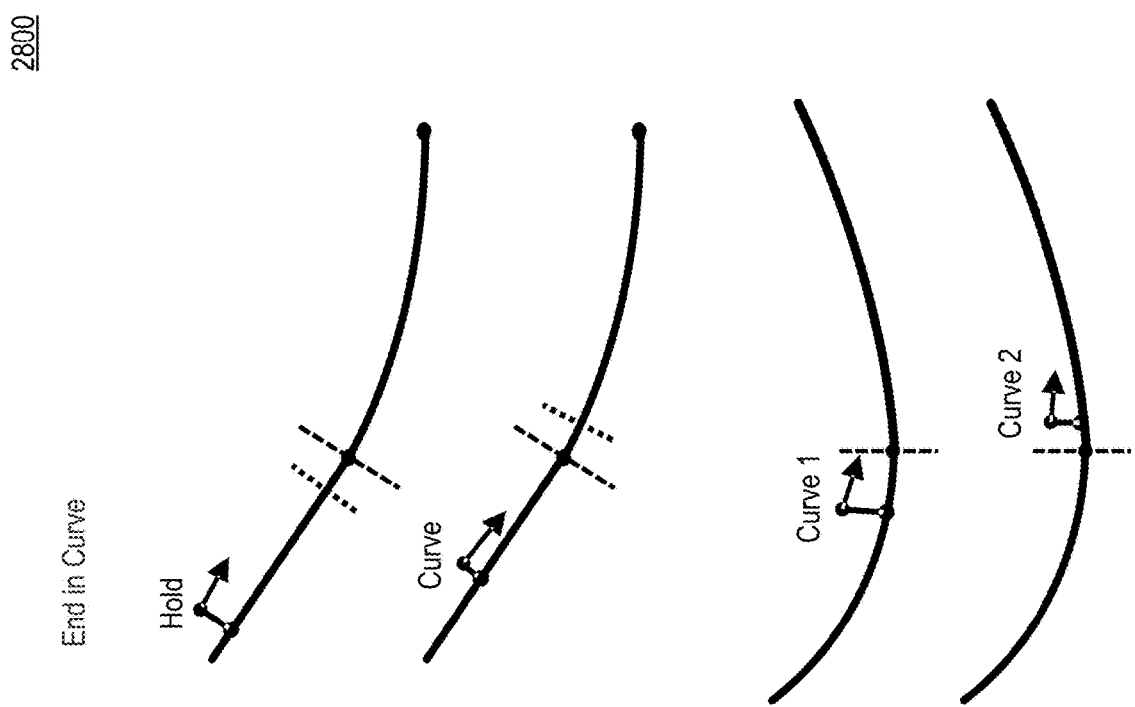
Fig. 28

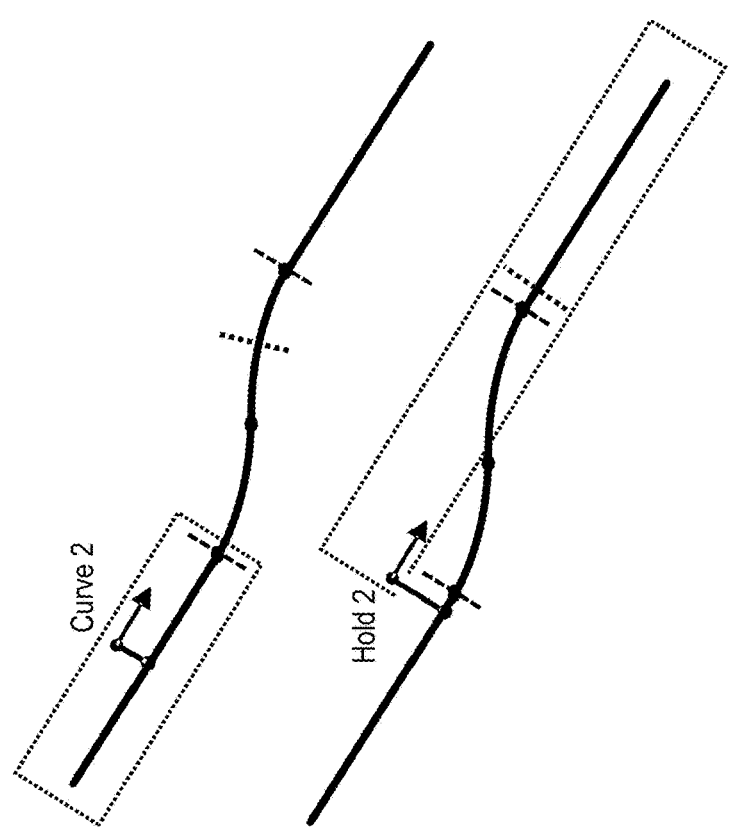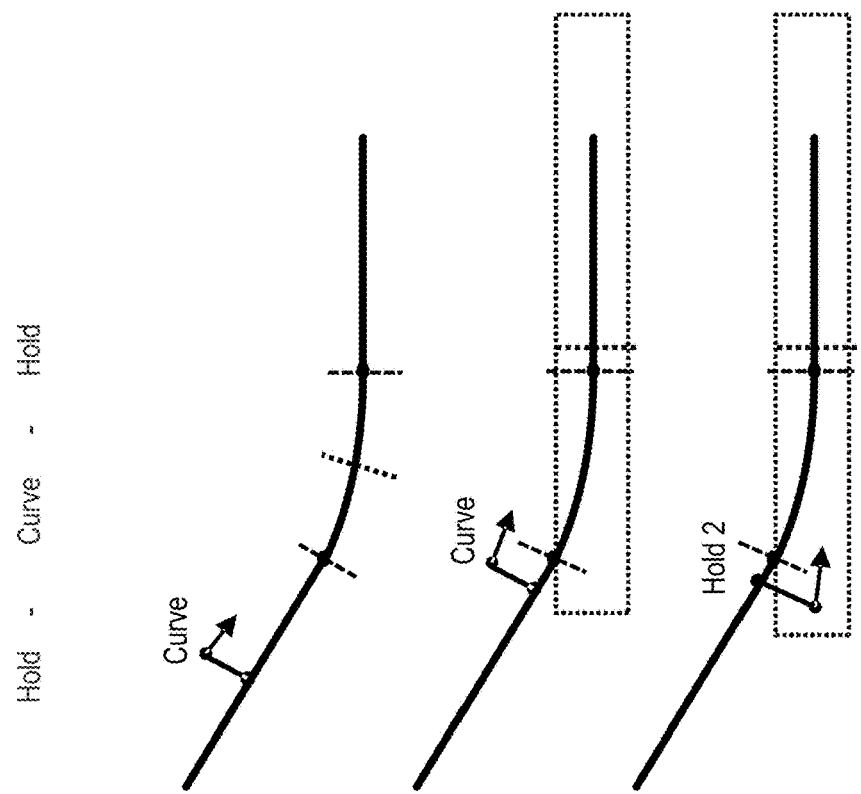
Fig. 29

3500

Drill to Depth Energy

$$E = \int_0^t P(t)d_t$$

$$= \int_0^t Q \cdot SPP(t)d_t$$

$$= \int_0^t Q \cdot SPP(MD, Q, Rop, Rpm) \, d\left(\frac{MD - RunStart}{Rop}\right)$$

$$= \int_{RunStart}^{RunEnd} \frac{Q}{Rop} \cdot SPP(MD, Q, Rop, Rpm, Density) \, d(MD)$$

$$E = \frac{Q_1}{Rop_1} \sum_{RunStart}^{MD1}(SPP_i * \Delta MD) +$$

$$\frac{Q_2}{Rop_2} \sum_{MD1}^{MD2}(SPP_i * \Delta MD) + \cdots$$

$$+ \frac{Q_n}{Rop_n} \sum_{MD_n}^{RunEnd}(SPP_i * \Delta MD)$$

Trip Out Energy

$$E = \int_0^t P(t)d_t$$

$$= \int_0^t V_{trip} \cdot HL(t)d_t$$

$$= \int_0^t V_{trip} \cdot HL(MD, DLS, BHA, Density \ldots) \, d\left(\frac{MD - RunStart}{Rop}\right)$$

$$= \int_{RunStart}^{RunEnd} \frac{V_{trip}}{Rop} \cdot HL(MD, DLS, BHA, Density \ldots) \, d(MD)$$

Mechanical Energy

$$E = \int_0^t P(t)d_t$$

$$= \int_0^t RPM \cdot Torque(t)d_t$$

$$= \int_0^t RPM \cdot Torque(MD, \ldots) \, d\left(\frac{MD - RunStart}{Rop}\right)$$

$$= \int_{RunStart}^{RunEnd} \frac{RPM}{Rop} \cdot Torque(MD, \ldots) \, d(MD)$$

Fig. 35

3710
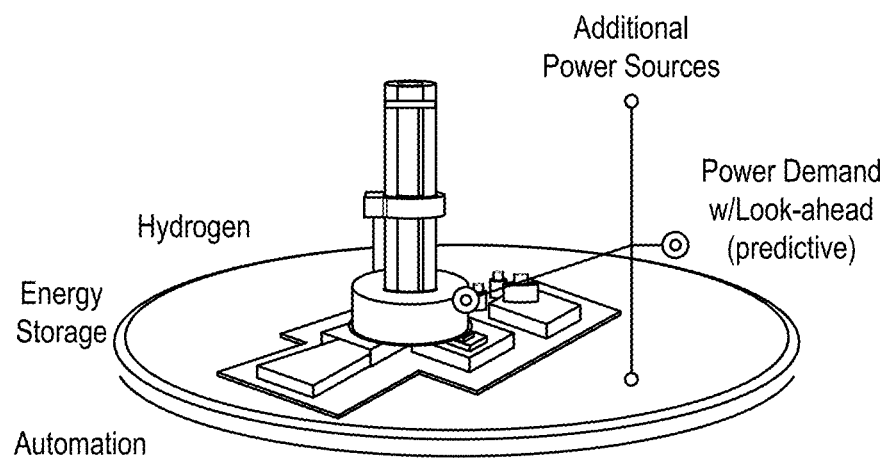
3720
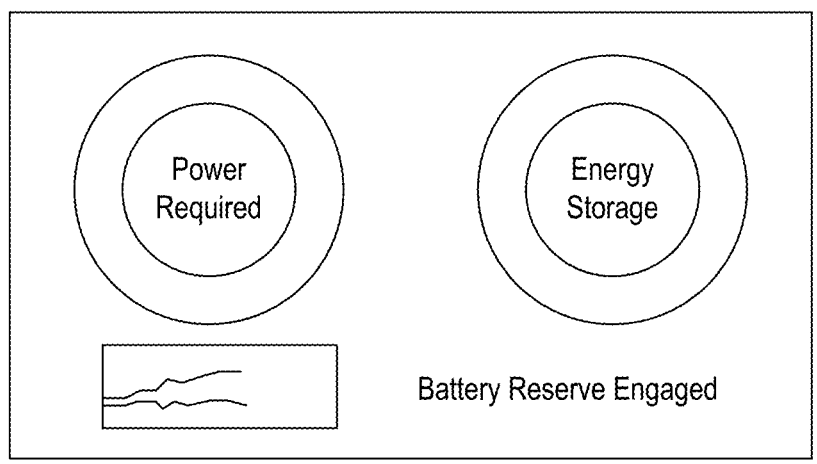
Fig. 37

Fig. 39

CANDIDATES

WEIGHTS
- TRAJLENGTH: 200
- TOTALSL: 20
- AVGSR: 20
- MAXSR: 40
- AVGDEV: 70
- MAXDEV: 60

PENALTIES
- RIGHT: 30
- LEFT: 30
- INCHIGH: 70
- INCLOW: 70
- MAXDLS: 30
- MINSL: 0
- CYLINER: 50
- ABOVEPLAN: 10
- BELOWPLAN: 80

RECALCULATE

3900

| # | ID | COST | TRAJLEN | SLTOT | SRAVG | SRMAX | DEVAVG | DEVMAX | VIOLATIONS |
|---|---|---|---|---|---|---|---|---|---|
| 0 | 4 | 682.51 | 161.29 | 27.39 | 16.14 | 36.34 | 172.07 | 214.92 | |
| 1 | 6 | 685.92 | 166.23 | 26.94 | 15.57 | 34.82 | 173.69 | 214.92 | |
| 2 | 8 | 689.83 | 171.57 | 26.49 | 14.99 | 33.31 | 175.44 | 214.92 | |
| 3 | 50 | 689.91 | 168.32 | 27.31 | 15.64 | 34.82 | 174.44 | 214.92 | |
| 4 | 52 | 693.70 | 173.60 | 26.83 | 15.06 | 33.31 | 176.17 | 214.92 | |
| 5 | 10 | 694.33 | 177.35 | 26.03 | 14.42 | 31.80 | 177.33 | 214.92 | |
| 6 | 94 | 697.96 | 175.83 | 27.21 | 15.13 | 33.31 | 176.98 | 214.92 | |
| 7 | 54 | 698.06 | 179.33 | 26.35 | 14.48 | 31.80 | 178.05 | 214.92 | |
| 8 | 12 | 699.47 | 183.64 | 25.57 | 13.84 | 30.28 | 179.39 | 214.92 | |
| 9 | 178 | 700.25 | 199.19 | 26.41 | 13.53 | 28.77 | 184.79 | 216.93 | [AZRIGHT] |
| 10 | 96 | 702.17 | 181.50 | 26.71 | 14.55 | 31.80 | 178.83 | 214.92 | |
| 11 | 56 | 703.07 | 185.58 | 25.87 | 13.90 | 30.28 | 180.08 | 214.09 | |
| 12 | 14 | 705.37 | 190.50 | 25.10 | 13.27 | 28.77 | 181.64 | 214.09 | |
| 13 | 138 | 706.74 | 183.90 | 27.10 | 14.62 | 31.80 | 179.71 | 214.09 | |
| 14 | 98 | 707.03 | 187.67 | 26.20 | 13.97 | 30.28 | 180.85 | 214.09 | |
| 15 | 214 | 708.37 | 202.03 | 26.84 | 13.61 | 28.77 | 185.82 | 220.03 | [AZRIGHT] |
| 16 | 58 | 708.82 | 192.38 | 25.38 | 13.32 | 28.77 | 182.31 | 214.09 | |
| 17 | 138 | 711.44 | 190.00 | 26.58 | 14.04 | 30.28 | 181.70 | 214.09 | |
| 18 | 100 | 712.63 | 194.40 | 25.68 | 13.38 | 28.77 | 183.05 | 214.09 | |
| 19 | 16 | 712.80 | 198.02 | 24.62 | 12.70 | 27.25 | 184.10 | 215.61 | |
| 20 | 180 | 714.04 | 206.42 | 25.83 | 12.93 | 27.25 | 187.14 | 224.77 | [AZRIGHT] |
| 21 | 176 | 716.36 | 192.60 | 26.98 | 14.12 | 30.28 | 182.64 | 214.92 | |
| 22 | 140 | 716.87 | 196.66 | 26.02 | 13.45 | 28.77 | 183.87 | 214.92 | |
| 23 | 60 | 718.07 | 199.81 | 24.88 | 12.75 | 27.25 | 184.75 | 217.57 | |
| 24 | 216 | 721.86 | 209.17 | 26.24 | 13.01 | 27.25 | 188.14 | 227.77 | [AZRIGHT] |
| 25 | 144 | 722.94 | 212.03 | 24.93 | 12.28 | 25.74 | 188.89 | 230.85 | [AZRIGHT] |
| 26 | 102 | 723.88 | 201.79 | 25.16 | 12.80 | 27.25 | 185.46 | 219.72 | |
| 27 | 18 | 729.52 | 206.29 | 24.14 | 12.12 | 25.74 | 186.82 | 224.59 | |
| 28 | 182 | 729.60 | 214.39 | 25.28 | 12.34 | 25.74 | 188.14 | 233.41 | [AZRIGHT] |
| 29 | 142 | 730.33 | 203.98 | 25.48 | 12.86 | 27.25 | 189.74 | 222.11 | |
| 30 | 250 | 730.75 | 212.29 | 26.70 | 13.11 | 27.25 | 189.28 | 231.17 | |

5100

| Slide Detection Estimation Errors (ft) | |
|---|---|
| Start Average Error | 0.3 |
| End Average Error | 0.25 |
| Length Average Error | 0.35 |

| Bit Position Estimation Errors (Deg) | |
|---|---|
| Inclination Average Error | 1.2 |
| Azimuth Average Error | 3.5 |
| Steering Capacity Estimation Errors (Deg/100ft) | 1.52 |

| Wells | Number of Recommendations | Valid | Invalid |
|---|---|---|---|
| Well 1 | 91 | 84 | 7 |
| Well 2 | 11 | 11 | 0 |
| Well 3 | 60 | 60 | 0 |
| Well 4 | 15 | 10 | 5 |
| Well 5 | 18 | 18 | 0 |
| Well 6 | 68 | 67 | 1 |
| Well 7 | 87 | 82 | 5 |
| Well 8 | 67 | 64 | 3 |
| Well 9 | 70 | 68 | 2 |
| Well 10 | 64 | 64 | 0 |
| Total | 551 | 528 | 23 |

Fig. 51

5200
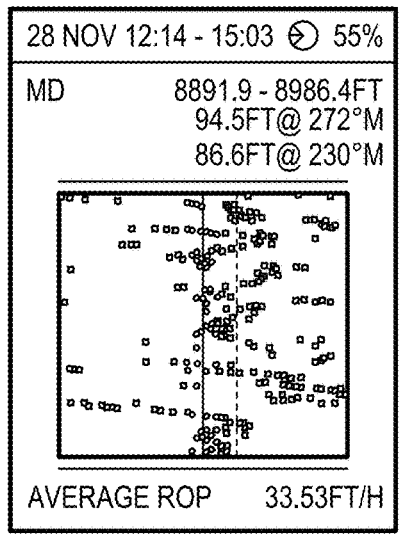
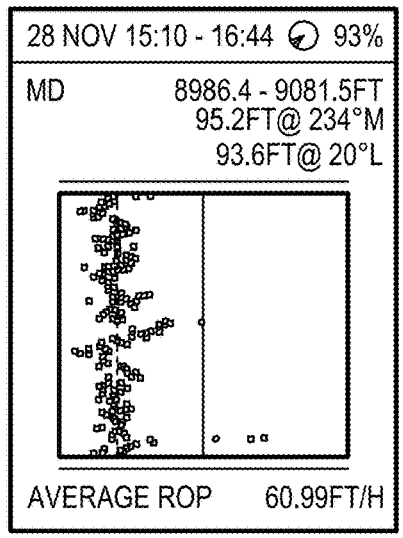
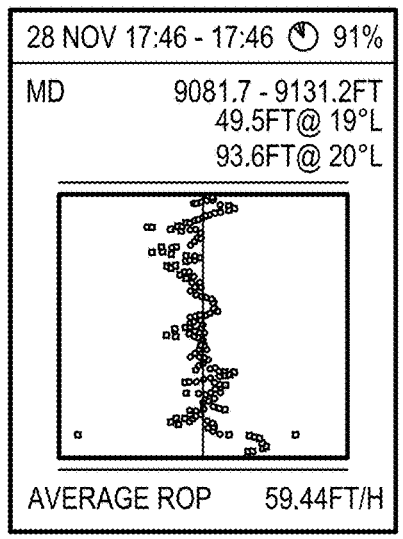
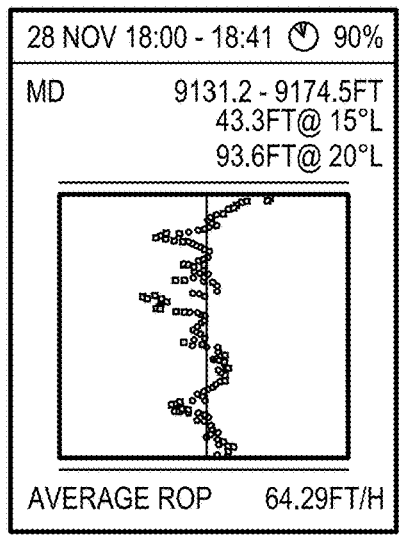
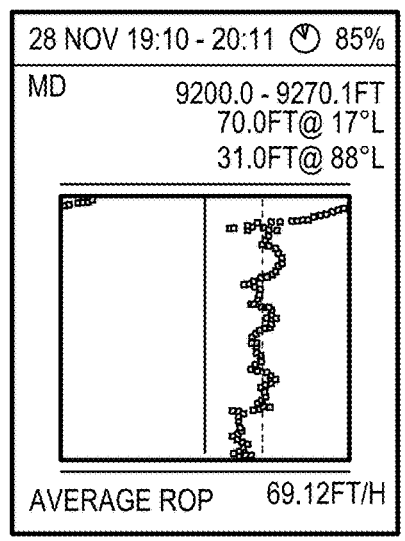
Fig. 52

APPROACHES TO DIRECTIONAL DRILLING

RELATED APPLICATIONS

This application claims priority to and the benefit of a U.S. Provisional Application having Ser. No. 63/200,376, filed 3 Mar. 2021, which is incorporated by reference herein; a U.S. Provisional Application having Ser. No. 63/200,380, filed 3 Mar. 2021, which is incorporated by reference herein; and a U.S. Provisional Application having Ser. No. 63/280,058, filed 16 Nov. 2021, which is incorporated by reference herein.

BACKGROUND

A reservoir can be a subsurface formation that can be characterized at least in part by its porosity and fluid permeability. As an example, a reservoir may be part of a basin such as a sedimentary basin. A basin can be a depression (e.g., caused by plate tectonic activity, subsidence, etc.) in which sediments accumulate. As an example, where hydrocarbon source rocks occur in combination with appropriate depth and duration of burial, a petroleum system may develop within a basin, which may form a reservoir that includes hydrocarbon fluids (e.g., oil, gas, etc.).

In oil and gas exploration, interpretation is a process that involves analysis of data to identify and locate various subsurface structures (e.g., horizons, faults, geobodies, etc.) in a geologic environment. Various types of structures (e.g., stratigraphic formations) may be indicative of hydrocarbon traps or flow channels, as may be associated with one or more reservoirs (e.g., fluid reservoirs). In the field of resource extraction, enhancements to interpretation can allow for construction of a more accurate model of a subsurface region, which, in turn, may improve characterization of the subsurface region for purposes of resource extraction. Characterization of one or more subsurface regions in a geologic environment can guide, for example, performance of one or more operations (e.g., field operations, etc.). As an example, a more accurate model of a subsurface region may make a drilling operation more accurate as to a borehole's trajectory where the borehole is to have a trajectory that penetrates a reservoir, etc., where fluid may be produced via the borehole (e.g., as a completed well, etc.). As an example, one or more workflows may be performed using one or more computational frameworks and/or one or more pieces of equipment that include features for one or more of analysis, acquisition, model building, control, etc., for exploration, interpretation, drilling, fracturing, production, etc.

SUMMARY

A method can include receiving data for a bottom hole assembly of a drillstring and a drill plan; generating candidate trajectories using at least a portion of the data; generating drill command schedules for the candidate trajectories; ranking the candidate trajectories based at least in part on the drill command schedules; and outputting at least a top ranked candidate trajectory and its corresponding drill command schedule. A system can include one or more processors; memory accessible to at least one of the one or more processors; processor-executable instructions stored in the memory and executable to instruct the system to: receive data for a bottom hole assembly of a drillstring and a drill plan; generate candidate trajectories using at least a portion of the data; generate drill command schedules for the candidate trajectories; rank the candidate trajectories based at least in part on the drill command schedules; and output at least a top ranked candidate trajectory and its corresponding drill command schedule. One or more computer-readable storage media can include processor-executable instructions to instruct a computing system to: receive data for a bottom hole assembly of a drillstring and a drill plan; generate candidate trajectories using at least a portion of the data; generate drill command schedules for the candidate trajectories; rank the candidate trajectories based at least in part on the drill command schedules; and output at least a top ranked candidate trajectory and its corresponding drill command schedule. Various other apparatuses, systems, methods, etc., are also disclosed.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

The following detailed description refers to the accompanying drawings. Wherever convenient Features and advantages of the described implementations can be more readily understood by reference to the following description taken in conjunction with the accompanying drawings.

FIG. 27 shows examples of plots;
FIG. 28 shows examples of plots;
FIG. 29 shows examples of plots;
FIG. 35 shows examples of equations;
FIG. 37 shows examples of graphical user interfaces.

FIG. 39 shows an example of a graphical user interface;
FIG. 51 shows examples of tables;
FIG. 52 shows examples of graphical user interfaces.

DETAILED DESCRIPTION

Figure 1:
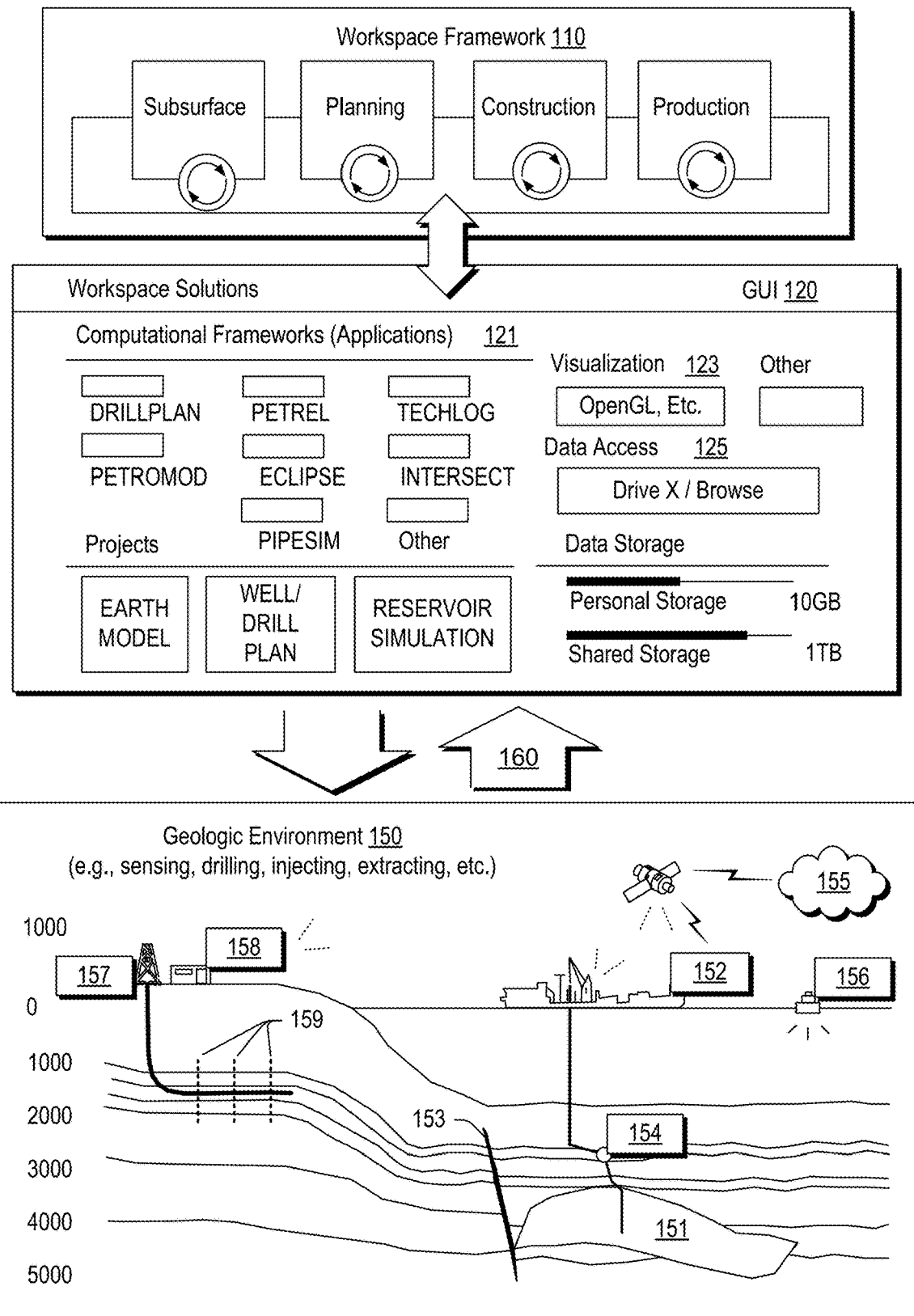
FIG. 1 shows an example of a system.

The following detailed description refers to the accompanying drawings. Wherever convenient, the same reference numbers are used in the drawings and the following description to refer to the same or similar parts. While several embodiments and features of the present disclosure are described herein, modifications, adaptations, and other implementations are possible, without departing from the spirit and scope of the present disclosure.

Although the terms "first", "second", etc. may be used herein to describe various elements, these terms are used to distinguish one element from another. For example, a first object or step could be termed a second object or step, and, similarly, a second object or step could be termed a first object or step, without departing from the scope of the present disclosure. The first object or step, and the second object or step, are both, objects or steps, respectively, but they are not to be considered the same object or step.

The terminology used in the description herein is for the purpose of describing particular embodiments and is not intended to be limiting. As used in this description and the appended claims, the singular forms "a," "an" and "the" are intended to include the plural forms as well, unless the context clearly indicates otherwise. It will also be understood that the term "and/or" as used herein refers to and encompasses any possible combinations of one or more of the associated listed items. It will be further understood that the terms "includes," "including," "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Further, as used herein, the term "if" may be construed to mean "when" or "upon" or "in response to determining" or "in response to detecting," depending on the context.

Directional drilling is often considered a mix between science and art to be performed by experts in the field. As an example, an autonomous directional drilling framework can combine planning and execution to achieve consistent performant directional drilling operations accessible for easy remote operations.

In one embodiment, a method can include combining the planning, the execution of autonomous decision making, the monitoring of users either on the rig or in town, and the downhole intelligence when available. At a planning phase, instead of simply delivering a plan to be followed by the execution, learning can be utilized that leverages offset analysis, including trajectory optimization models, machine learning models to derive steering tendencies, and risks, along with the specificities and efficiencies analysis of the BHA. As an example, an execution system can provide for some level of autonomous decision making. As such, it can interact with planning features for execution, whether a user is at a rig site or in town. As an example, a rig control system, a driller, and downhole tools may be accessible via telemetry uplink and downlink. As an example, an execution workflow can combine data analytics, physics-based simulation, and offset analysis to achieve a consistent directional drilling performance.

As an example, a system may provide a self-driving BHA for directional drilling operations. For example, consider a workflow that involves automatic evaluation of the current bit position with respect to the initial plan; automatic evaluation of the maximum dogleg capability of the BHA depending on the current location; automatic projection of the changes of this dogleg capability all the way to the target location; accurate identification of the location of the drill bit including its location and its current orientations; capability to monitor the risk factors that can affect the performance; and capability to examine the health of the BHA tools and automatic derivation of an optimized working plan. Such an approach can help to guarantee getting to the target location with a minimized risk of failure and/or one or more other desired outcomes (e.g., reduced emissions, etc.). As an example, a system level approach may be utilized with interdependencies between the different components considered.

As an example, an autonomous directional drilling framework can help to provide more consistent performance with improved cost per distance, reduced HSE risks, leveraged expertise via remote operations, and lastly, a reduced overall carbon footprint by promoting sustainability. A system can help provide for efficient, fast, and controlled directional drilling without compromising durability or reliability of the equipment.

In the example of FIG. 1, the workspace framework 110 may be tailored to a particular geologic environment such as an example geologic environment 150. For example, the geologic environment 150 may include layers (e.g., stratification) that include a reservoir 151 and that may be intersected by a fault 153. As an example, the geologic environment 150 may be outfitted with a variety of sensors, detectors, actuators, etc. For example, equipment 152 may include communication circuitry to receive and to transmit information with respect to one or more networks 155. Such information may include information associated with downhole equipment 154, which may be equipment to acquire information, to assist with resource recovery, etc. Other equipment 156 may be located remote from a wellsite and include sensing, detecting, emitting or other circuitry. Such equipment may include storage and communication circuitry to store and to communicate data, instructions, etc. As an example, one or more satellites may be provided for purposes of communications, data acquisition, etc. For example, FIG. 1 shows a satellite in communication with the network 155 that may be configured for communications, noting that the satellite may additionally or alternatively include circuitry for imagery (e.g., spatial, spectral, temporal, radiometric, etc.).

FIG. 1 also shows the geologic environment 150 as optionally including equipment 157 and 158 associated with a well that includes a substantially horizontal portion that may intersect with one or more fractures 159. For example, consider a well in a shale formation that may include natural fractures, artificial fractures (e.g., hydraulic fractures) or a combination of natural and artificial fractures. As an example, a well may be drilled for a reservoir that is laterally extensive. In such an example, lateral variations in properties, stresses, etc. may exist where an assessment of such variations may assist with planning, operations, etc. to develop a laterally extensive reservoir (e.g., via fracturing, injecting, extracting, etc.). As an example, the equipment 157 and/or 158 may include components, a system, systems, etc. for fracturing, seismic sensing, analysis of seismic data, assessment of one or more fractures, etc.

In the example of FIG. 1, the GUI 120 shows some examples of computational frameworks 121, including the DRILLPLAN, PETREL, TECHLOG, PETROMOD, ECLIPSE, PIPESIM, and INTERSECT frameworks (Schlumberger Limited, Houston, Texas).

The DRILLPLAN framework provides for digital well construction planning and includes features for automation of repetitive tasks and validation workflows, enabling improved quality drilling programs (e.g., digital drilling plans, etc.) to be produced quickly with assured coherency.

The PETREL framework can be part of the DELFI environment for utilization in geosciences and geoengineering, for example, to analyze subsurface data from exploration to production of fluid from a reservoir. The DELFI cognitive exploration and production (E&P) environment (Schlumberger, Houston, Texas), referred to herein as the DELFI environment or DELFI framework, is a secure, cognitive, cloud-based collaborative environment that integrates data and workflows with digital technologies, such as artificial intelligence and machine learning.

The PETREL framework provides components that allow for optimization of various exploration, development and production operations. The PETREL framework includes seismic to simulation software components that can output information for use in increasing reservoir performance, for example, by improving asset team productivity. Through use of such a framework, various professionals (e.g., geophysicists, geologists, and reservoir engineers) can develop collaborative workflows and integrate operations to streamline processes (e.g., with respect to one or more geologic environments, etc.). Such a framework may be considered an application (e.g., executable using one or more devices) and may be considered a data-driven application (e.g., where data is input for purposes of modeling, simulating, etc.).

The TECHLOG framework can handle and process field and laboratory data for a variety of geologic environments (e.g., deepwater exploration, shale, etc.). The TECHLOG framework can structure wellbore data for analyses, planning, etc.

The PETROMOD framework provides petroleum systems modeling capabilities that can combine one or more of seismic, well, and geological information to model the evolution of a sedimentary basin. The PETROMOD framework can predict if, and how, a reservoir has been charged with hydrocarbons, including the source and timing of hydrocarbon generation, migration routes, quantities, and hydrocarbon type in the subsurface or at surface conditions.

The ECLIPSE framework provides a reservoir simulator (e.g., as a computational framework) with numerical solutions for fast and accurate prediction of dynamic behavior for various types of reservoirs and development schemes.

The INTERSECT framework provides a high-resolution reservoir simulator for simulation of detailed geological features and quantification of uncertainties, for example, by creating accurate production scenarios and, with the integration of precise models of the surface facilities and field operations, the INTERSECT framework can produce reliable results, which may be continuously updated by real-time data exchanges (e.g., from one or more types of data acquisition equipment in the field that can acquire data during one or more types of field operations, etc.). The INTERSECT framework can provide completion configurations for complex wells where such configurations can be built in the field, can provide detailed chemical-enhanced-oil-recovery (EOR) formulations where such formulations can be implemented in the field, can analyze application of steam injection and other thermal EOR techniques for implementation in the field, advanced production controls in terms of reservoir coupling and flexible field management, and flexibility to script customized solutions for improved modeling and field management control. The INTERSECT framework, as with the other example frameworks, may be utilized as part of the DELFI environment, for example, for rapid simulation of multiple concurrent cases. For example, a workflow may utilize one or more of the DELFI environment on demand reservoir simulation features.

The aforementioned DELFI environment provides various features for workflows as to subsurface analysis, planning, construction and production, for example, as illustrated in the workspace framework 110. As shown in FIG. 1, outputs from the workspace framework 110 can be utilized for directing, controlling, etc., one or more processes in the geologic environment 150 and, feedback 160, can be received via one or more interfaces in one or more forms (e.g., acquired data as to operational conditions, equipment conditions, environment conditions, etc.).

As an example, a workflow may progress to a geology and geophysics ("G&G") service provider, which may generate a well trajectory, which may involve execution of one or more G&G frameworks (e.g., consider the PETREL framework, etc.).

In the example of FIG. 1, the visualization features 123 may be implemented via the workspace framework 110, for example, to perform tasks as associated with one or more of subsurface regions, planning operations, constructing wells and/or surface fluid networks, and producing from a reservoir.

As an example, a visualization process can implement one or more of various features that can be suitable for one or more web applications. For example, a template may involve use of the JAVASCRIPT object notation format (JSON) and/or one or more other languages/formats. As an example, a framework may include one or more converters. For example, consider a JSON to PYTHON converter and/or a PYTHON to JSON converter. Such an approach can provide for compatibility of devices, frameworks, etc., with respect to one or more sets of instructions.

As an example, visualization features can provide for visualization of various earth models, properties, etc., in one or more dimensions. As an example, visualization features can provide for rendering of information in multiple dimensions, which may optionally include multiple resolution rendering. In such an example, information being rendered may be associated with one or more frameworks and/or one or more data stores. As an example, visualization features may include one or more control features for control of equipment, which can include, for example, field equipment that can perform one or more field operations. As an example, a workflow may utilize one or more frameworks to generate information that can be utilized to control one or more types of field equipment (e.g., drilling equipment, wireline equipment, fracturing equipment, etc.).

As to a reservoir model that may be suitable for utilization by a simulator, consider acquisition of seismic data as acquired via reflection seismology, which finds use in geophysics, for example, to estimate properties of subsurface formations. As an example, reflection seismology may provide seismic data representing waves of elastic energy (e.g., as transmitted by P-waves and S-waves, in a frequency range of approximately 1 Hz to approximately 100 Hz). Seismic data may be processed and interpreted, for example, to understand better composition, fluid content, extent and geometry of subsurface rocks. Such interpretation results can be utilized to plan, simulate, perform, etc., one or more operations for production of fluid from a reservoir (e.g., reservoir rock, etc.).

Field acquisition equipment may be utilized to acquire seismic data, which may be in the form of traces where a trace can include values organized with respect to time and/or depth (e.g., consider 1D, 2D, 3D or 4D seismic data). For example, consider acquisition equipment that acquires digital samples at a rate of one sample per approximately 4 ms. Given a speed of sound in a medium or media, a sample rate may be converted to an approximate distance. For example, the speed of sound in rock may be on the order of around 5 km per second. Thus, a sample time spacing of approximately 4 ms would correspond to a sample "depth" spacing of about 10 meters (e.g., assuming a path length from source to boundary and boundary to sensor). As an example, a trace may be about 4 seconds in duration; thus, for a sampling rate of one sample at about 4 ms intervals, such a trace would include about 1000 samples where latter acquired samples correspond to deeper reflection boundaries. If the 4 second trace duration of the foregoing example is divided by two (e.g., to account for reflection), for a vertically aligned source and sensor, a deepest boundary depth may be estimated to be about 10 km (e.g., assuming a speed of sound of about 5 km per second).

As an example, a model may be a simulated version of a geologic environment. As an example, a simulator may include features for simulating physical phenomena in a geologic environment based at least in part on a model or models. A simulator, such as a reservoir simulator, can simulate fluid flow in a geologic environment based at least in part on a model that can be generated via a framework that receives seismic data. A simulator can be a computerized system (e.g., a computing system) that can execute instructions using one or more processors to solve a system of equations that describe physical phenomena subject to various constraints. In such an example, the system of equations may be spatially defined (e.g., numerically discretized) according to a spatial model that includes layers of rock, geobodies, etc., that have corresponding positions that can be based on interpretation of seismic and/or other data. A spatial model may be a cell-based model where cells are defined by a grid (e.g., a mesh). A cell in a cell-based model can represent a physical area or volume in a geologic environment where the cell can be assigned physical properties (e.g., permeability, fluid properties, etc.) that may be germane to one or more physical phenomena (e.g., fluid volume, fluid flow, pressure, etc.). A reservoir simulation model can be a spatial model that may be cell-based.

A simulator can be utilized to simulate the exploitation of a real reservoir, for example, to examine different productions scenarios to find an optimal one before production or further production occurs. A reservoir simulator does not provide an exact replica of flow in and production from a reservoir at least in part because the description of the reservoir and the boundary conditions for the equations for flow in a porous rock are generally known with an amount of uncertainty. Certain types of physical phenomena occur at a spatial scale that can be relatively small compared to size of a field. A balance can be struck between model scale and computational resources that results in model cell sizes being of the order of meters; rather than a lesser size (e.g., a level of detail of pores). A modeling and simulation workflow for multiphase flow in porous media (e.g., reservoir rock, etc.) can include generalizing real micro-scale data from macro scale observations (e.g., seismic data and well data) and upscaling to a manageable scale and problem size. Uncertainties can exist in input data and solution procedure such that simulation results too are to some extent uncertain. A process known as history matching can involve comparing simulation results to actual field data acquired during production of fluid from a field. Information gleaned from history matching, can provide for adjustments to a model, data, etc., which can help to increase accuracy of simulation.

As an example, a simulator may utilize various types of constructs, which may be referred to as entities. Entities may include earth entities or geological objects such as wells, surfaces, reservoirs, etc. Entities can include virtual representations of actual physical entities that may be reconstructed for purposes of simulation. Entities may include entities based on data acquired via sensing, observation, etc. (e.g., consider entities based at least in part on seismic data and/or other information). As an example, an entity may be characterized by one or more properties (e.g., a geometrical pillar grid entity of an earth model may be characterized by a porosity property, etc.). Such properties may represent one or more measurements (e.g., acquired data), calculations, etc.

As an example, a simulator may utilize an object-based software framework, which may include entities based on pre-defined classes to facilitate modeling and simulation. As an example, an object class can encapsulate reusable code and associated data structures. Object classes can be used to instantiate object instances for use by a program, script, etc. For example, borehole classes may define objects for representing boreholes based on well data. A model of a basin, a reservoir, etc. may include one or more boreholes where a borehole may be, for example, for measurements, injection, production, etc. As an example, a borehole may be a wellbore of a well, which may be a completed well (e.g., for production of a resource from a reservoir, for injection of material, etc.).

While several simulators are illustrated in the example of FIG. 1, one or more other simulators may be utilized, additionally or alternatively. For example, consider the VISAGE geomechanics simulator (Schlumberger Limited, Houston Texas) or the PIPESIM network simulator (Schlumberger Limited, Houston Texas), etc. The VISAGE simulator includes finite element numerical solvers that may provide simulation results such as, for example, results as to compaction and subsidence of a geologic environment, well and completion integrity in a geologic environment, caprock and fault-seal integrity in a geologic environment, fracture behavior in a geologic environment, thermal recovery in a geologic environment, CO2 disposal, etc. The PIPESIM simulator includes solvers that may provide simulation results such as, for example, multiphase flow results (e.g., from a reservoir to a wellhead and beyond, etc.), flowline and surface facility performance, etc. The PIPESIM simulator may be integrated, for example, with the AVOCET production operations framework (Schlumberger Limited, Houston Texas). As an example, a reservoir or reservoirs may be simulated with respect to one or more enhanced recovery techniques (e.g., consider a thermal process such as steam-assisted gravity drainage (SAGD), etc.). As an example, the PIPESIM simulator may be an optimizer that can optimize one or more operational scenarios at least in part via simulation of physical phenomena. The MANGROVE simulator (Schlumberger Limited, Houston, Texas) provides for optimization of stimulation design (e.g., stimulation treatment operations such as hydraulic fracturing) in a reservoir-centric environment. The MANGROVE framework can combine scientific and experimental work to predict geomechanical propagation of hydraulic fractures, reactivation of natural fractures, etc., along with production forecasts within 3D reservoir models (e.g., production from a drainage area of a reservoir where fluid moves via one or more types of fractures to a well and/or from a well). The MANGROVE framework can provide results pertaining to heterogeneous interactions between hydraulic and natural fracture networks, which may assist with optimization of the number and location of fracture treatment stages (e.g., stimulation treatment(s)), for example, to increase perforation efficiency and recovery.

As an example, data can include geochemical data. For example, consider data acquired using X-ray fluorescence (XRF) technology, Fourier transform infrared spectroscopy (FTIR) technology and/or wireline geochemical technology.

As an example, one or more probes may be deployed in a bore via a wireline or wirelines. As an example, a probe may emit energy and receive energy where such energy may be analyzed to help determine mineral composition of rock surrounding a bore. As an example, nuclear magnetic resonance may be implemented (e.g., via a wireline, downhole NMR probe, etc.), for example, to acquire data as to nuclear magnetic properties of elements in a formation (e.g., hydrogen, carbon, phosphorous, etc.).

As an example, lithology scanning technology may be employed to acquire and analyze data. For example, consider the LITHO SCANNER technology (Schlumberger Limited, Houston, Texas). As an example, a LITHO SCANNER tool may be or include a gamma ray spectroscopy tool.

As an example, a tool may be positioned to acquire information in a portion of a borehole. Analysis of such information may reveal vugs, dissolution planes (e.g., dissolution along bedding planes), stress-related features, dip events, etc. As an example, a tool may acquire information that may help to characterize a fractured reservoir, optionally where fractures may be natural and/or artificial (e.g., hydraulic fractures). Such information may assist with completions, stimulation treatment, etc. As an example, information acquired by a tool may be analyzed using a framework such as the aforementioned TECHLOG framework.

As an example, a workflow may utilize one or more types of data for one or more processes (e.g., stratigraphic modeling, basin modeling, completion designs, drilling, production, injection, etc.). As an example, one or more tools may provide data that can be used in a workflow or workflows that may implement one or more frameworks (e.g., PETREL, TECHLOG, PETROMOD, ECLIPSE, etc.).

In the example of FIG. 1, drilling may be performed in the geologic environment 150, for example, to access the reservoir 151, which may be accessed from land or offshore. In FIG. 1, the downhole equipment 154 may be, for example, part of a bottom hole assembly (BHA). The BHA may be used to drill a well. The downhole equipment 154 may communicate information to equipment at the surface, and may receive instructions and information from the equipment at the surface. During a well construction process, a variety of operations (such as cementing, wireline evaluation, testing, etc.) may be conducted. In such embodiments, data collected by tools and sensors and used for reasons such as reservoir characterization may be collected and transmitted.

A well may include a substantially horizontal portion (e.g., lateral portion) that may intersect with one or more fractures. For example, a well in a shale formation may pass through natural fractures, artificial fractures (e.g., hydraulic fractures), or a combination thereof. Such a well may be constructed using directional drilling techniques as described herein. However, these same techniques may be used in connection with other types of directional wells (such as slant wells, S-shaped wells, deep inclined wells, and others) and are not limited to horizontal wells.

Figure 2:
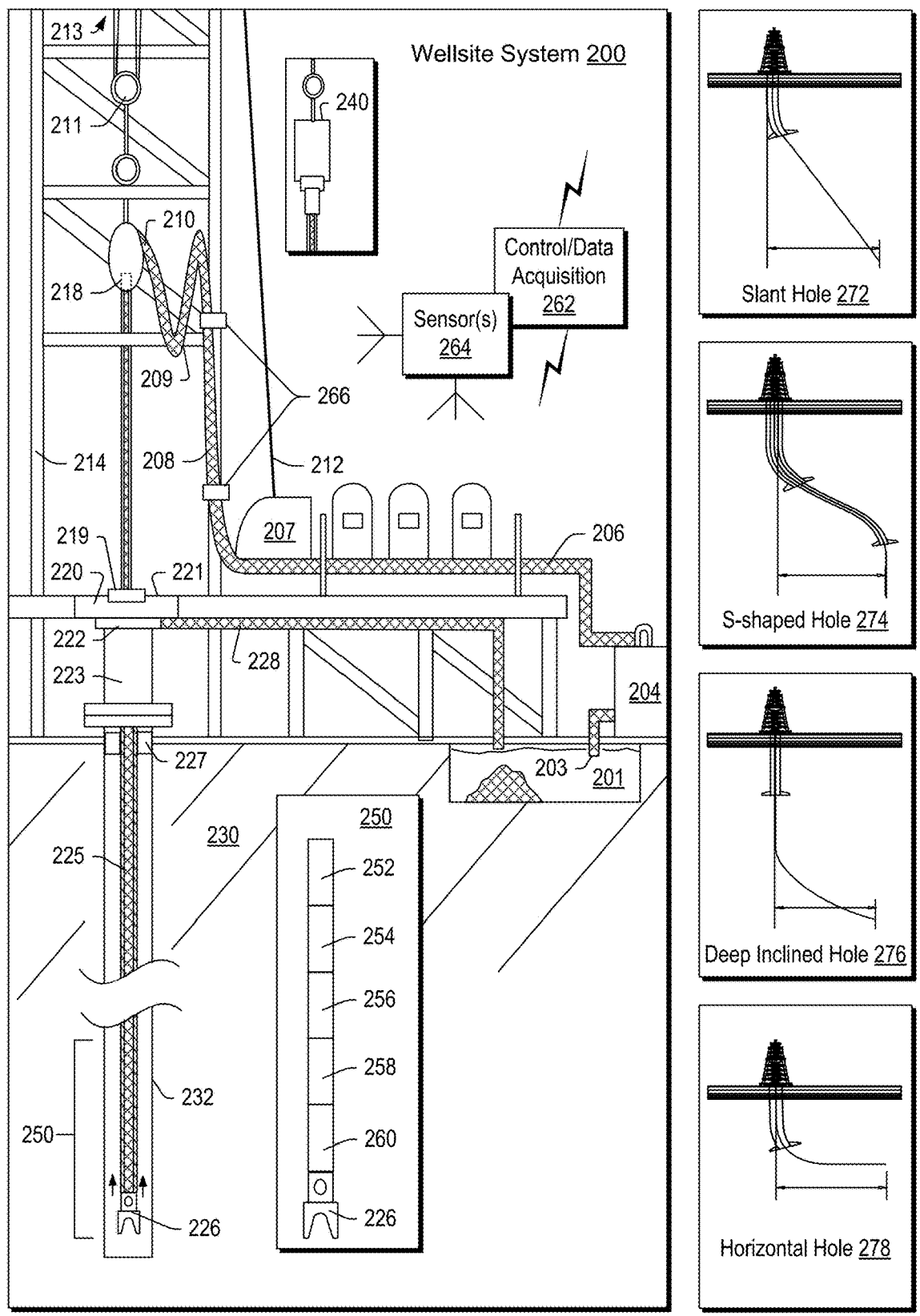
FIG. 2 shows an example of a system.

FIG. 2 shows an example of a wellsite system 200 (e.g., at a wellsite that may be onshore or offshore). As shown, the wellsite system 200 can include a mud tank 201 for holding mud and other material (e.g., where mud can be a drilling fluid), a suction line 203 that serves as an inlet to a mud pump 204 for pumping mud from the mud tank 201 such that mud flows to a vibrating hose 206, a drawworks 207 for winching drill line or drill lines 212, a standpipe 208 that receives mud from the vibrating hose 206, a kelly hose 209 that receives mud from the standpipe 208, a gooseneck or goosenecks 210, a traveling block 211, a crown block 213 for carrying the traveling block 211 via the drill line or drill lines 212, a derrick 214, a kelly 218 or a top drive 240, a kelly drive bushing 219, a rotary table 220, a drill floor 221, a bell nipple 222, one or more blowout preventors (BOPs) 223, a drillstring 225, a drill bit 226, a casing head 227 and a flow pipe 228 that carries mud and other material to, for example, the mud tank 201.

In the example system of FIG. 2, a borehole 232 is formed in subsurface formations 230 by rotary drilling; noting that various example embodiments may also use one or more directional drilling techniques, equipment, etc.

As shown in the example of FIG. 2, the drillstring 225 is suspended within the borehole 232 and has a drillstring assembly 250 that includes the drill bit 226 at its lower end. As an example, the drillstring assembly 250 may be a bottom hole assembly (BHA).

The wellsite system 200 can provide for operation of the drillstring 225 and other operations. As shown, the wellsite system 200 includes the traveling block 211 and the derrick 214 positioned over the borehole 232. As mentioned, the wellsite system 200 can include the rotary table 220 where the drillstring 225 pass through an opening in the rotary table 220.

As shown in the example of FIG. 2, the wellsite system 200 can include the kelly 218 and associated components, etc., or a top drive 240 and associated components. As to a kelly example, the kelly 218 may be a square or hexagonal metal/alloy bar with a hole drilled therein that serves as a mud flow path. The kelly 218 can be used to transmit rotary motion from the rotary table 220 via the kelly drive bushing 219 to the drillstring 225, while allowing the drillstring 225 to be lowered or raised during rotation. The kelly 218 can pass through the kelly drive bushing 219, which can be driven by the rotary table 220. As an example, the rotary table 220 can include a master bushing that operatively couples to the kelly drive bushing 219 such that rotation of the rotary table 220 can turn the kelly drive bushing 219 and hence the kelly 218. The kelly drive bushing 219 can include an inside profile matching an outside profile (e.g., square, hexagonal, etc.) of the kelly 218; however, with slightly larger dimensions so that the kelly 218 can freely move up and down inside the kelly drive bushing 219.

As to a top drive example, the top drive 240 can provide functions performed by a kelly and a rotary table. The top drive 240 can turn the drillstring 225. As an example, the top drive 240 can include one or more motors (e.g., electric and/or hydraulic) connected with appropriate gearing to a short section of pipe called a quill, that in turn may be screwed into a saver sub or the drillstring 225 itself. The top drive 240 can be suspended from the traveling block 211, so the rotary mechanism is free to travel up and down the derrick 214. As an example, a top drive 240 may allow for drilling to be performed with more joint stands than a kelly/rotary table approach.

In the example of FIG. 2, the mud tank 201 can hold mud, which can be one or more types of drilling fluids. As an example, a wellbore may be drilled to produce fluid, inject fluid or both (e.g., hydrocarbons, minerals, water, etc.).

In the example of FIG. 2, the drillstring 225 (e.g., including one or more downhole tools) may be composed of a series of pipes threadably connected together to form a long tube with the drill bit 226 at the lower end thereof. As the drillstring 225 is advanced into a wellbore for drilling, at some point in time prior to or coincident with drilling, the mud may be pumped by the pump 204 from the mud tank 201 (e.g., or other source) via the lines 206, 208 and 209 to a port of the kelly 218 or, for example, to a port of the top drive 240. The mud can then flow via a passage (e.g., or passages) in the drillstring 225 and out of ports located on the drill bit 226 (see, e.g., a directional arrow). As the mud exits the drillstring 225 via ports in the drill bit 226, it can then circulate upwardly through an annular region between an outer surface(s) of the drillstring 225 and surrounding wall(s) (e.g., open borehole, casing, etc.), as indicated by directional arrows. In such a manner, the mud lubricates the drill bit 226 and carries heat energy (e.g., frictional or other energy) and formation cuttings to the surface where the mud (e.g., and cuttings) may be returned to the mud tank 201, for example, for recirculation (e.g., with processing to remove cuttings, etc.).

The mud pumped by the pump 204 into the drillstring 225 may, after exiting the drillstring 225, form a mudcake that lines the wellbore which, among other functions, may reduce friction between the drillstring 225 and surrounding wall(s) (e.g., borehole, casing, etc.). A reduction in friction may facilitate advancing or retracting the drillstring 225. During a drilling operation, the entire drillstring 225 may be pulled from a wellbore and optionally replaced, for example, with a new or sharpened drill bit, a smaller diameter drillstring, etc. As mentioned, the act of pulling a drillstring out of a hole or replacing it in a hole is referred to as tripping. A trip may be referred to as an upward trip or an outward trip or as a downward trip or an inward trip depending on trip direction.

As an example, consider a downward trip where upon arrival of the drill bit 226 of the drillstring 225 at a bottom of a wellbore, pumping of the mud commences to lubricate the drill bit 226 for purposes of drilling to enlarge the wellbore. As mentioned, the mud can be pumped by the pump 204 into a passage of the drillstring 225 and, upon filling of the passage, the mud may be used as a transmission medium to transmit energy, for example, energy that may encode information as in mud-pulse telemetry.

As an example, mud-pulse telemetry equipment may include a downhole device configured to effect changes in pressure in the mud to create an acoustic wave or waves upon which information may modulated. In such an example, information from downhole equipment (e.g., one or more modules of the drillstring 225) may be transmitted uphole to an uphole device, which may relay such information to other equipment for processing, control, etc.

As an example, telemetry equipment may operate via transmission of energy via the drillstring 225 itself. For example, consider a signal generator that imparts coded energy signals to the drillstring 225 and repeaters that may receive such energy and repeat it to further transmit the coded energy signals (e.g., information, etc.).

As an example, the drillstring 225 may be fitted with telemetry equipment 252 that includes a rotatable drive shaft, a turbine impeller mechanically coupled to the drive shaft such that the mud can cause the turbine impeller to rotate, a modulator rotor mechanically coupled to the drive shaft such that rotation of the turbine impeller causes said modulator rotor to rotate, a modulator stator mounted adjacent to or proximate to the modulator rotor such that rotation of the modulator rotor relative to the modulator stator creates pressure pulses in the mud, and a controllable brake for selectively braking rotation of the modulator rotor to modulate pressure pulses. In such example, an alternator may be coupled to the aforementioned drive shaft where the alternator includes at least one stator winding electrically coupled to a control circuit to selectively short the at least one stator winding to electromagnetically brake the alternator and thereby selectively brake rotation of the modulator rotor to modulate the pressure pulses in the mud.

In the example of FIG. 2, an uphole control and/or data acquisition system 262 may include circuitry to sense pressure pulses generated by telemetry equipment 252 and, for example, communicate sensed pressure pulses or information derived therefrom for process, control, etc.

The assembly 250 of the illustrated example includes a logging-while-drilling (LWD) module 254, a measurement-while-drilling (MWD) module 256, an optional module 258, a rotary-steerable system (RSS) and/or motor 260, and the drill bit 226. Such components or modules may be referred to as tools where a drillstring can include a plurality of tools.

As to a RSS, it involves technology utilized for directional drilling. Directional drilling involves drilling into the Earth to form a deviated bore such that the trajectory of the bore is not vertical; rather, the trajectory deviates from vertical along one or more portions of the bore. As an example, consider a target that is located at a lateral distance from a surface location where a rig may be stationed. In such an example, drilling can commence with a vertical portion and then deviate from vertical such that the bore is aimed at the target and, eventually, reaches the target. Directional drilling may be implemented where a target may be inaccessible from a vertical location at the surface of the Earth, where material exists in the Earth that may impede drilling or otherwise be detrimental (e.g., consider a salt dome, etc.), where a formation is laterally extensive (e.g., consider a relatively thin yet laterally extensive reservoir), where multiple bores are to be drilled from a single surface bore, where a relief well is desired, etc.

One approach to directional drilling involves a mud motor; however, a mud motor can present some challenges depending on factors such as rate of penetration (ROP), transferring weight to a bit (e.g., weight on bit, WOB) due to friction, etc. A mud motor can be a positive displacement motor (PDM) that operates to drive a bit (e.g., during directional drilling, etc.). A PDM operates as drilling fluid is pumped through it where the PDM converts hydraulic power of the drilling fluid into mechanical power to cause the bit to rotate.

As an example, a mud motor (e.g., PDM) can be operated in different modes, which can include a rotating mode and a sliding mode. A sliding mode involves drilling with a mud motor rotating the bit downhole without rotating the drillstring from the surface. Such an operation can be conducted when a BHA has been fitted with a bent sub or a bent housing mud motor, or both, for directional drilling. Sliding can be used in building and controlling or adjusting hole angle. In directional drilling, pointing of a bit can be accomplished through a bent sub, which can have a relative small angle offset from the axis of a drillstring, and a measurement device to determine the direction of offset. Without turning the drillstring, the bit can be rotated with mud flow through the mud motor to drill in the direction it is pointed. With steerable motors, when a desired wellbore direction is attained, the entire drillstring can be rotated to drill straight rather than at an angle. By controlling the amount of hole drilled in the sliding mode versus the rotating mode, a wellbore trajectory can be controlled rather precisely.

As an example, a PDM may operate in a combined rotating mode where surface equipment is utilized to rotate a bit of a drillstring (e.g., a rotary table, a top drive, etc.) by rotating the entire drillstring and where drilling fluid is utilized to rotate the bit of the drillstring. In such an example, a surface RPM (SRPM) may be determined by use of the surface equipment and a downhole RPM of the mud motor may be determined using various factors related to flow of drilling fluid, mud motor type, etc. As an example, in the combined rotating mode, bit RPM can be determined or estimated as a sum of the SRPM and the mud motor RPM, assuming the SRPM and the mud motor RPM are in the same direction.

As an example, a PDM mud motor can operate in a so-called sliding mode, when the drillstring is not rotated from the surface. In such an example, a bit RPM can be determined or estimated based on the RPM of the mud motor.

A RSS can drill directionally where there is continuous rotation from surface equipment, which can alleviate the sliding of a steerable motor (e.g., a PDM). A RSS may be deployed when drilling directionally (e.g., deviated, horizontal, or extended-reach wells). A RSS can aim to minimize interaction with a borehole wall, which can help to preserve borehole quality. A RSS can aim to exert a relatively consistent side force akin to stabilizers that rotate with the drillstring or orient the bit in the desired direction while continuously rotating at the same number of rotations per minute as the drillstring.

The LWD module 254 may be housed in a suitable type of drill collar and can contain one or a plurality of selected types of logging tools. It will also be understood that more than one LWD and/or MWD module can be employed, for example, as represented at by the MWD module 256 of the drillstring assembly 250. Where the position of an LWD module is mentioned, as an example, it may refer to a module at the position of the LWD module 254, the MWD module 256, etc. An LWD module can include capabilities for measuring, processing, and storing information, as well as for communicating with the surface equipment. In the illustrated example, the LWD module 254 may include a seismic measuring device.

The MWD module 256 may be housed in a suitable type of drill collar and can contain one or more devices for measuring characteristics of the drillstring 225 and the drill bit 226. As an example, the MWD tool 256 may include equipment for generating electrical power, for example, to power various components of the drillstring 225. As an example, the MWD tool 256 may include the telemetry equipment 252, for example, where the turbine impeller can generate power by flow of the mud; it being understood that other power and/or battery systems may be employed for purposes of powering various components. As an example, the MWD module 256 may include one or more of the following types of measuring devices: a weight-on-bit measuring device, a torque measuring device, a vibration measuring device, a shock measuring device, a stick slip measuring device, a direction measuring device, and an inclination measuring device.

FIG. 2 also shows some examples of types of holes that may be drilled. For example, consider a slant hole 272, an S-shaped hole 274, a deep inclined hole 276 and a horizontal hole 278.

As an example, a drilling operation can include directional drilling where, for example, at least a portion of a well includes a curved axis. For example, consider a radius that defines curvature where an inclination with regard to the vertical may vary until reaching an angle between about 30 degrees and about 60 degrees or, for example, an angle to about 90 degrees or possibly greater than about 90 degrees.

As an example, a directional well can include several shapes where each of the shapes may aim to meet particular operational demands. As an example, a drilling process may be performed on the basis of information as and when it is relayed to a drilling engineer. As an example, inclination and/or direction may be modified based on information received during a drilling process.

As an example, deviation of a bore may be accomplished in part by use of a downhole motor and/or a turbine. As to a motor, for example, a drillstring can include a positive displacement motor (PDM).

As an example, a system may be a steerable system and include equipment to perform method such as geosteering. As mentioned, a steerable system can be or include an RSS. As an example, a steerable system can include a PDM or of a turbine on a lower part of a drillstring which, just above a drill bit, a bent sub can be mounted. As an example, above a PDM, MWD equipment that provides real time or near real time data of interest (e.g., inclination, direction, pressure, temperature, real weight on the drill bit, torque stress, etc.) and/or LWD equipment may be installed. As to the latter, LWD equipment can make it possible to send to the surface various types of data of interest, including for example, geological data (e.g., gamma ray log, resistivity, density and sonic logs, etc.).

The coupling of sensors providing information on the course of a well trajectory, in real time or near real time, with, for example, one or more logs characterizing the formations from a geological viewpoint, can allow for implementing a geosteering method. Such a method can include navigating a subsurface environment, for example, to follow a desired route to reach a desired target or targets.

As an example, a drillstring can include an azimuthal density neutron (ADN) tool for measuring density and porosity; a MWD tool for measuring inclination, azimuth and shocks; a compensated dual resistivity (CDR) tool for measuring resistivity and gamma ray related phenomena; one or more variable gauge stabilizers; one or more bend joints; and a geosteering tool, which may include a motor and optionally equipment for measuring and/or responding to one or more of inclination, resistivity and gamma ray related phenomena.

As an example, geosteering can include intentional directional control of a wellbore based on results of downhole geological logging measurements in a manner that aims to keep a directional wellbore within a desired region, zone (e.g., a pay zone), etc. As an example, geosteering may include directing a wellbore to keep the wellbore in a particular section of a reservoir, for example, to minimize gas and/or water breakthrough and, for example, to maximize economic production from a well that includes the wellbore.

Referring again to FIG. 2, the wellsite system 200 can include one or more sensors 264 that are operatively coupled to the control and/or data acquisition system 262. As an example, a sensor or sensors may be at surface locations. As an example, a sensor or sensors may be at downhole locations. As an example, a sensor or sensors may be at one or more remote locations that are not within a distance of the order of about one hundred meters from the wellsite system 200. As an example, a sensor or sensor may be at an offset wellsite where the wellsite system 200 and the offset wellsite are in a common field (e.g., oil and/or gas field).

As an example, one or more of the sensors 264 can be provided for tracking pipe, tracking movement of at least a portion of a drillstring, etc.

As an example, the system 200 can include one or more sensors 266 that can sense and/or transmit signals to a fluid conduit such as a drilling fluid conduit (e.g., a drilling mud conduit). For example, in the system 200, the one or more sensors 266 can be operatively coupled to portions of the standpipe 208 through which mud flows. As an example, a downhole tool can generate pulses that can travel through the mud and be sensed by one or more of the one or more sensors 266. In such an example, the downhole tool can include associated circuitry such as, for example, encoding circuitry that can encode signals, for example, to reduce demands as to transmission. As an example, circuitry at the surface may include decoding circuitry to decode encoded information transmitted at least in part via mud-pulse telemetry. As an example, circuitry at the surface may include encoder circuitry and/or decoder circuitry and circuitry downhole may include encoder circuitry and/or decoder circuitry. As an example, the system 200 can include a transmitter that can generate signals that can be transmitted downhole via mud (e.g., drilling fluid) as a transmission medium.

As an example, one or more portions of a drillstring may become stuck. The term stuck can refer to one or more of varying degrees of inability to move or remove a drillstring from a bore. As an example, in a stuck condition, it might be possible to rotate pipe or lower it back into a bore or, for example, in a stuck condition, there may be an inability to move the drillstring axially in the bore, though some amount of rotation may be possible. As an example, in a stuck condition, there may be an inability to move at least a portion of the drillstring axially and rotationally.

As to the term "stuck pipe", this can refer to a portion of a drillstring that cannot be rotated or moved axially. As an example, a condition referred to as "differential sticking" can be a condition whereby the drillstring cannot be moved (e.g., rotated or reciprocated) along the axis of the bore. Differential sticking may occur when high-contact forces caused by low reservoir pressures, high wellbore pressures, or both, are exerted over a sufficiently large area of the drillstring. Differential sticking can have time and financial cost.

As an example, a sticking force can be a product of the differential pressure between the wellbore and the reservoir and the area that the differential pressure is acting upon. This means that a relatively low differential pressure (delta p) applied over a large working area can be just as effective in sticking pipe as can a high differential pressure applied over a small area.

As an example, a condition referred to as "mechanical sticking" can be a condition where limiting or prevention of motion of the drillstring by a mechanism other than differential pressure sticking occurs. Mechanical sticking can be caused, for example, by one or more of junk in the hole, wellbore geometry anomalies, cement, keyseats or a buildup of cuttings in the annulus.

Figure 3:
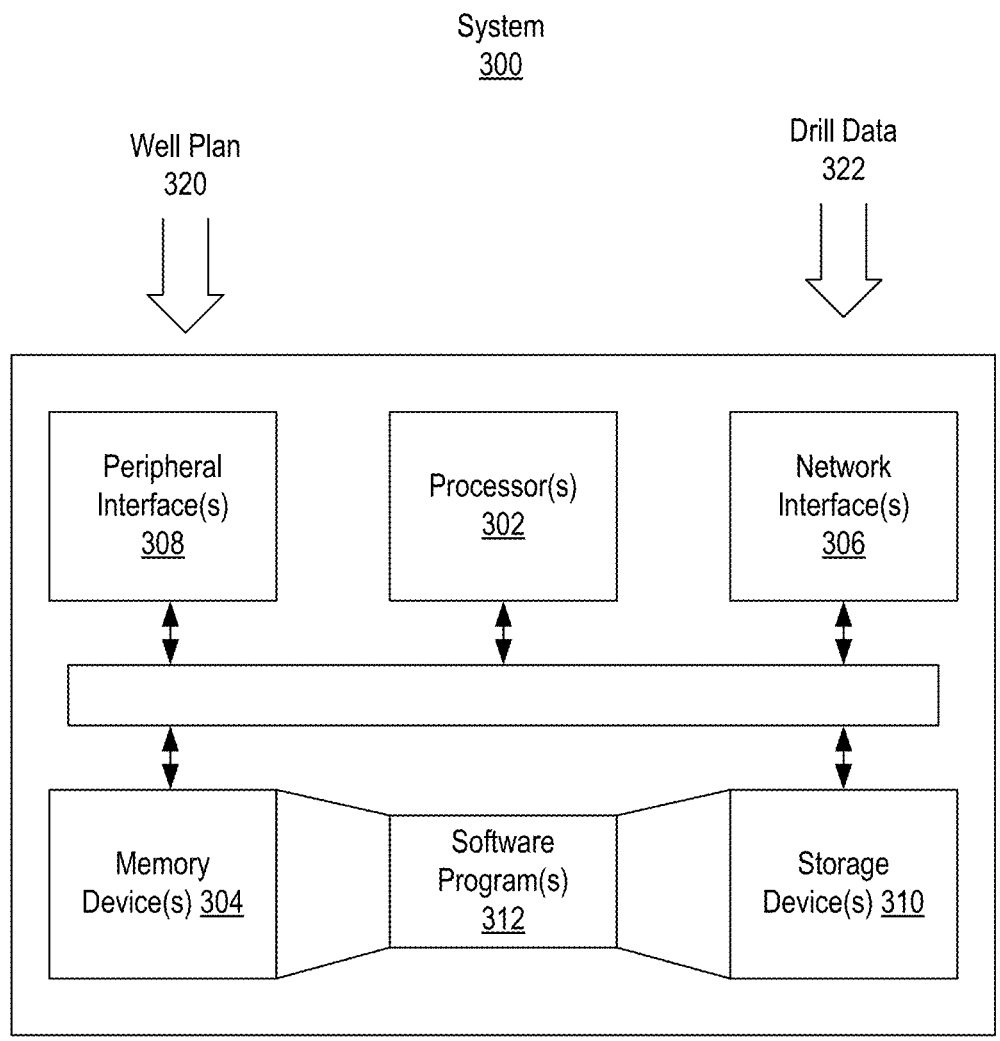
FIG. 3 shows an example of a system.

FIG. 3 shows a schematic view of a computing or processor system 300, according to an embodiment. The processor system 300 may include one or more processors 302 of varying core configurations (including multiple cores) and clock frequencies. The one or more processors 302 may be operable to execute instructions, apply logic, etc. It will be appreciated that these functions may be provided by multiple processors or multiple cores on a single chip operating in parallel and/or communicably linked together. In at least one embodiment, the one or more processors 302 may be or include one or more GPUs.

The processor system 300 may also include a memory system, which may be or include one or more memory devices and/or computer-readable media 304 of varying physical dimensions, accessibility, storage capacities, etc., such as flash drives, hard drives, disks, random access memory, etc., for storing data, such as images, files, and program instructions for execution by the processor 302. In an embodiment, the computer-readable media 304 may store instructions that, when executed by the processor 302, are configured to cause the processor system 300 to perform operations. For example, execution of such instructions may cause the processor system 300 to implement one or more portions and/or embodiments of the method(s) described above.

The processor system 300 may also include one or more network interfaces 306. The network interfaces 306 may include any hardware, applications, and/or other software. Accordingly, the network interfaces 306 may include Ethernet adapters, wireless transceivers, PCI interfaces, and/or serial network components, for communicating over wired or wireless media using protocols, such as Ethernet, wireless Ethernet, etc.

As an example, the processor system 300 may be a mobile device that includes one or more network interfaces for communication of information. For example, a mobile device may include a wireless network interface (e.g., operable via one or more IEEE 802.11 protocols, ETSI GSM, BLUETOOTH, satellite, etc.). As an example, a mobile device may include components such as a main processor, memory, a display, display graphics circuitry (e.g., optionally including touch and gesture circuitry), a SIM slot, audio/video circuitry, motion processing circuitry (e.g., accelerometer, gyroscope), wireless LAN circuitry, smart card circuitry, transmitter circuitry, GPS circuitry, and a battery. As an example, a mobile device may be configured as a cell phone, a tablet, etc. As an example, a method may be implemented (e.g., wholly or in part) using a mobile device. As an example, a system may include one or more mobile devices.

The processor system 300 may further include one or more peripheral interfaces 308, for communication with a display, projector, keyboards, mice, touchpads, sensors, other types of input and/or output peripherals, and/or the like. In some implementations, the components of processor system 300 need not be enclosed within a single enclosure or even located in close proximity to one another, but in other implementations, the components and/or others may be provided in a single enclosure. As an example, a system may be a distributed environment, for example, a so-called "cloud" environment where various devices, components, etc. interact for purposes of data storage, communications, computing, etc. As an example, a method may be implemented in a distributed environment (e.g., wholly or in part as a cloud-based service).

As an example, information may be input from a display (e.g., a touchscreen), output to a display or both. As an example, information may be output to a projector, a laser device, a printer, etc. such that the information may be viewed. As an example, information may be output stereographically or holographically. As to a printer, consider a 2D or a 3D printer. As an example, a 3D printer may include one or more substances that can be output to construct a 3D object. For example, data may be provided to a 3D printer to construct a 3D representation of a subterranean formation. As an example, layers may be constructed in 3D (e.g., horizons, etc.), geobodies constructed in 3D, etc. As an example, holes, fractures, etc., may be constructed in 3D (e.g., as positive structures, as negative structures, etc.).

The memory device 304 may be physically or logically arranged or configured to store data on one or more storage devices 310. The storage device 310 may include one or more file systems or databases in any suitable format. The storage device 310 may also include one or more software programs 312, which can contain interpretable and/or executable instructions for performing one or more of the disclosed processes. When requested by the processor 302, one or more of the software programs 312, or a portion thereof, may be loaded from the storage devices 310 to the memory devices 304 for execution by the processor 302.

Those skilled in the art will appreciate that the above-described componentry is merely one example of a hardware configuration, as the processor system 300 may include any type of hardware components, including any accompanying firmware or software, for performing the disclosed implementations. The processor system 300 may also be implemented in part or in whole by electronic circuit components or processors, such as application-specific integrated circuits (ASICs) or field-programmable gate arrays (FPGAs).

The processor system 300 may be configured to receive a directional drilling well plan 320. As discussed above, a well plan is to the description of the proposed wellbore to be used by the drilling team in drilling the well. The well plan typically includes information about the shape, orientation, depth, completion, and evaluation along with information about the equipment to be used, actions to be taken at different points in the well construction process, and other information the team planning the well believes will be relevant/helpful to the team drilling the well. A directional drilling well plan will also include information about how to steer and manage the direction of the well.

The processor system 300 may be configured to receive drilling data 322. The drilling data 322 may include data collected by one or more sensors associated with surface equipment or with downhole equipment. The drilling data 322 may include information such as data relating to the position of the BHA (such as survey data or continuous position data), drilling parameters (such as weight on bit (WOB), rate of penetration (ROP), torque, or others), text information entered by individuals working at the wellsite, or other data collected during the construction of the well.

In one embodiment, the processor system 300 is part of a rig control system (RCS) for the rig (e.g., including downhole equipment operatively coupled to the rig). In another embodiment, the processor system 300 is a separately installed computing unit including a display that is installed at the rig site and receives data from the RCS. In such an embodiment, the software on the processor system 300 may be installed on the computing unit, brought to the wellsite, and installed and communicatively connected to the rig control system in preparation for constructing the well or a portion thereof.

In another embodiment, the processor system 300 may be at a location remote from the wellsite and receives the drilling data 322 over a communications medium using a protocol such as well-site information transfer specification or standard (WITS) and markup language (WITSML). In such an embodiment, the software on the processor system 300 may be a web-native application that is accessed by users using a web browser. In such an embodiment, the processor system 300 may be remote from the wellsite where the well is being constructed, and the user may be at the wellsite or at a location remote from the wellsite.

A well plan 320 typically includes information about the directional and shape of the well to be drilled. The well plan 320 may include information about parameters and tools to use to achieve the desired shape and position. However, as the well is being drilled, the actual trajectory may deviate from the plan or unanticipated conditions may be encountered. In such instances, and others, the plan may need to be adjusted to account for changing conditions and circumstances.

In one embodiment, a system includes a well plan component for monitoring and updating the well plan where the well plan can be in a digital format, for example, as a digital data structured stored in memory of a computing device, a computing system, etc. For example, consider a controller that includes memory that can store a well plan as a digital file or digital files. The well plan component may derive a working plan when a team takes a survey or otherwise determines a position of a well. In one embodiment, the working plan is, in effect, a spatial trajectory in multiple dimensions to construct a path from a current bit location (e.g., hole bottom position) to a next location, which can be referred to as a target, which may be an intermediate target or a final target. The construction of the path takes into account a variety of considerations. These may include, but are not limited to: the target; the allowable deviation from the original plan in terms of position and/or angular deviation; the maximum dogleg capability of the steering assembly; constraints set by the user at the beginning based on preference; allowable tortuosity, risk measures, hole quality, confidence level, etc.; and others.

The generation of the working plan may involve generating a range of trajectory candidates that satisfy a number of the different conditions specified and evaluating the candidates based on the trajectory context, different properties, constraint violations, and rank. The trajectories may be ranked according to different optimization objectives. The user may have the system present one or more of the available candidates for selection.

In one embodiment, the ranking system uses one or more of the following candidate properties: trajectory length; total steering length; average steering ratio; maximum steering ratio; average deviation from the plan; maximum deviation from the plan; snaking; risk level; target constraints; angular deviation; total time; DDI; tortuosity; key performance indicators (KPIs); communication; confidence level; hole quality; tool wear; and geomechanics.

In one embodiment, the properties are assigned a user-defined weight $W_i$ based on the trajectory context. The weight may be associated with the cost function of the candidate to produce the cost for the candidates. In one embodiment, the approach below is used:

Weight Factor: A user-defined weight $W_i$ indicating the importance of this property where setting $W_i=0$ means that property is ignored.

Cost function: Produces a single scalar cost value $C_i$; noting that it can be normalized such that $0 \leq C_i$ and $C_i \sim 1$ where, a value may exceed 1, but can be normalized to keep it around 1; and noting that a lower $C_i$ indicates a lower cost for the property where zero indicates an idealized solution, which may not necessarily be achievable.

The total cost property cost for each candidate can be defined as:

$$C_{prop} = \sum_i C_i W_i$$

A similar approach may be formulated for constraints (e.g., constraint violations, etc.) and/or one or more other factors.

In terms of trajectory context, information such as one or more of the following may be included: default; curve for motor & curve for RSS; autocurve for RSS; landing; vertical for motor & vertical for RSS; horizontal for motor & horizontal for RSS; tangent (non V/H) for motor & tangent (non V/H) for RSS nudge; nudge back to vertical for motor & nudge back to vertical for RSS; horizontal nudge for motor & horizontal nudge for RSS; and long slow nudge (e.g., nudge DLS<4 & delta MD>500 ft).

For the different contexts, the approach may associate a set of default weights. In certain embodiments, these weights may be adjustable by the user and/or may be adjustable automatically.

TABLE 1

Example of property weight definitions for a landing context.

| Property | Weight values |
| --- | --- |
| Trajectory Length | 200 |
| Total Steering length | 20 |
| Avg. Steering Ratio | 20 |
| Max. Steering Ratio | 40 |
| Avg. Deviation | 70 |
| Max. Deviation | 60 |
| Snaking | 30 |
| Target Deviation | 70 |
| Target Inclination | 30 |
| DLS Risk | 50 |

Table 1 shows an example of weight definitions for the properties in the landing context. These weights may be based on the importance attached to each of these properties in the context of the landing. For a different context, one or more of these weights can be different.

TABLE 2

Weight definitions for the violations in the context of landing.

| Violation type | Penalty Weight values |
| --- | --- |
| Max dogleg Severity | 30 |
| Cylinder trajectory constraint | 50 |
| Orientation constraint | 70 |
| Left of plan | 30 |

TABLE 2-continued

Weight definitions for the violations in the context of landing.

| Violation type | Penalty Weight values |
| --- | --- |
| Right of plan | 30 |
| Above plan | 10 |
| Below Plan | 80 |
| ToolFace Range | 50 |

Table 2 provides values for an embodiment of the weight definitions for the landing for each of the violation types considered (e.g., constraints, etc.).

In one embodiment, an artificial intelligence (AI), which can include machine learning (ML), optimization scheme is used to automatically generate weight values based on the historical data and a categorization of the data. As an example, historical data from wells drilled using a motor assembly may be used to generate weights.

To perform machine learning, wells may be labeled based on data categorization. For example, a categorization may be based on two features or more. As to two features, consider the trajectory context and the recommendation validity. In such an example, the recommendation validity may be, in one embodiment, a rating for each recommendation at a downhole survey point with a three level rating: 0 for poor, 1 for acceptable, and 2 for excellent. In such an approach, each of the qualitative levels can correspond to quantitative information (e.g., data, limits, etc.).

In one embodiment, for selecting the wells, the approach may use one or more criteria such as percentage of bad recommendations for the well are not to exceed a certain percentage (e.g., 5 percent, etc.). Such an approach may help ensure that enough acceptable or above recommendations for the AI/ML are available (e.g., to provide a sufficient level of knowledge as to a suitable goal or goals).

Figure 4:
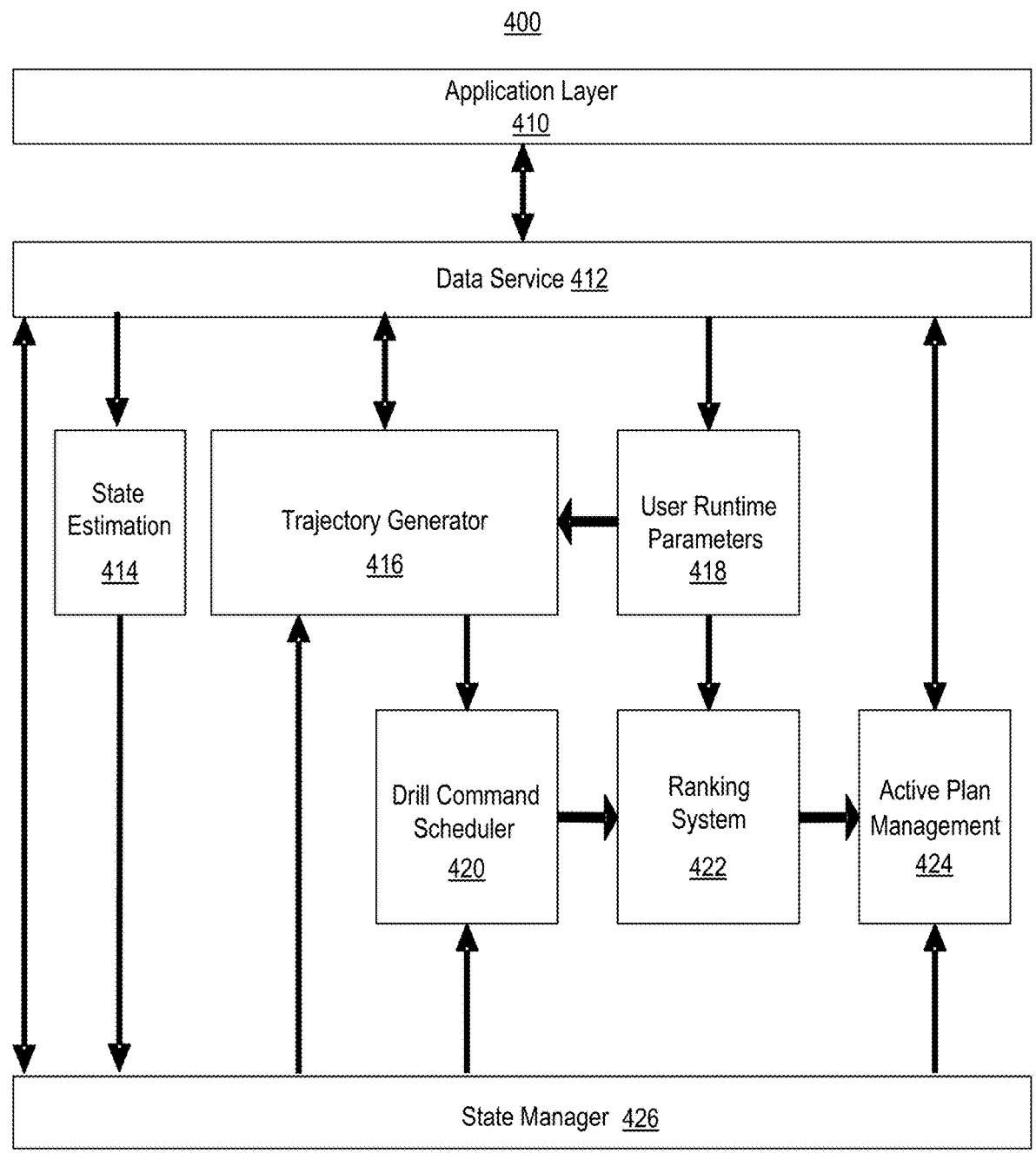
FIG. 4 shows an example of a system.
Figure 5:
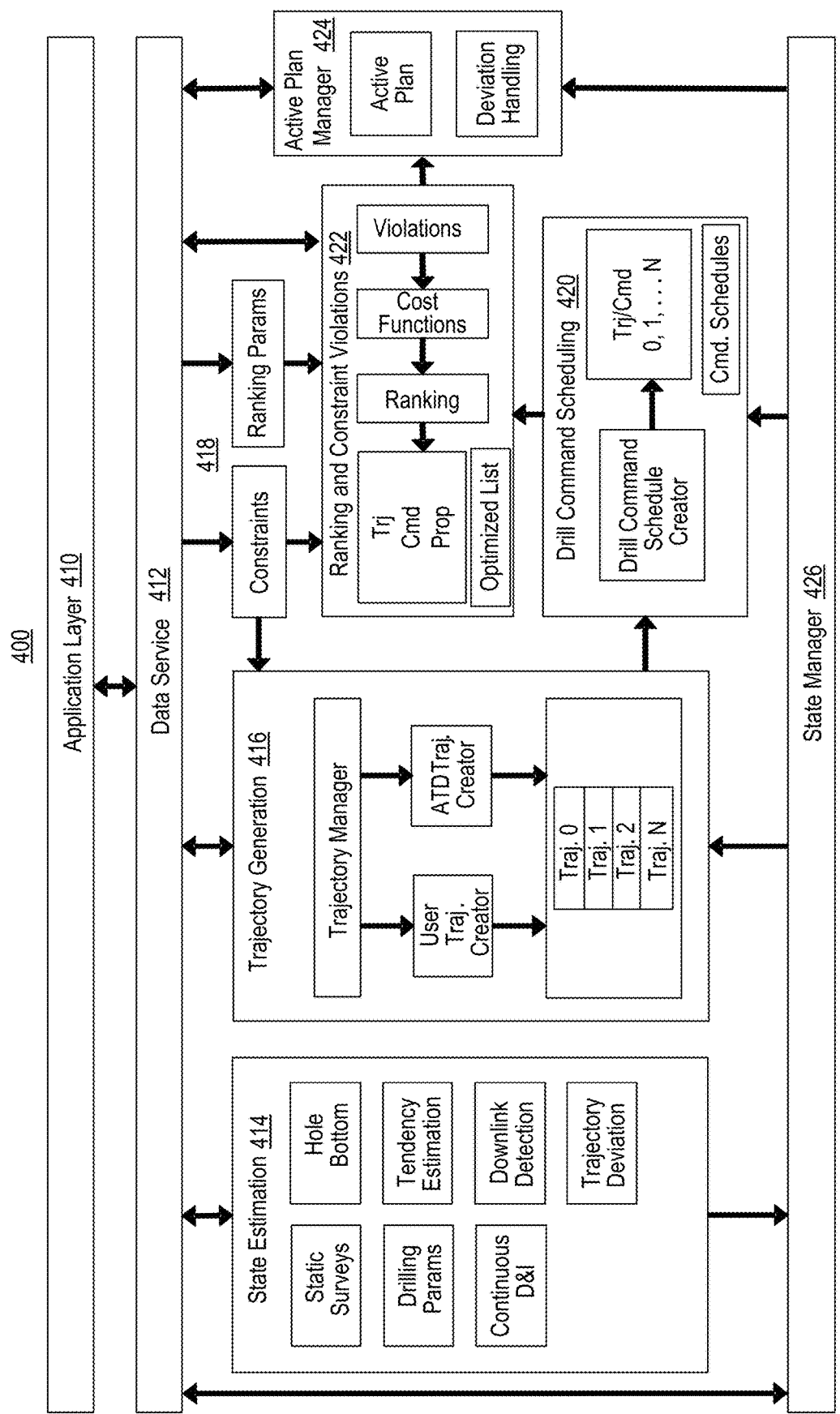
FIG. 5 shows an example of a system.

FIG. 4 and FIG. 5 illustrate one embodiment of a system 400 for working plan generation (e.g., a working plan generator (WPG)). As shown, the system 400 can include an application layer 410, a data service 412, a state estimation component, a trajectory generator component 416, a user runtime parameters component 418, a drill command scheduler component 420, a ranking system component 422, an active plan management component 424 and a stat manager component 426.

In one embodiment, the system 400 includes a state estimation component 414 for inferring the state of a system using incoming data from the data service 412. As an example, the state manager component 426 may be configured to handle multiple parallel states for determining the effects of certain actions that a user (e.g., or machine) may want to take or that may occur and infer the state from these 'what-if' scenarios. In the example of FIG. 4, the trajectory manager component 416 may interface with multiple trajectory creation sources/states and manage multiple trajectory candidates.

As to the drill command scheduler component 420, it may generate hardware specific drill command sequences for each trajectory (e.g., command schedules for each trajectory). As to the ranking system component 422, it may evaluate constraint violations and properties to sort candidates according to user-defined optimization objectives. In the example of FIG. 4, the active plan manager component 424 may monitor in-progress actions and make/suggestion corrections, trigger replanning actions, and request user intervention.

In one embodiment, the following can be taken into account by the system 400:

Major Point: A point in space indicating the beginning or end of a curve or line segment (e.g., including position and orientation vectors (6-pack)).

Trajectory: A list of Major Points representing a path through space, where each pair of adjacent Major Points represents a line/curve segments.

Minor Point: An interpolated point along a trajectory that lies between two Major Points.

Command Schedule: A set of drilling instructions (e.g., commands) associated with a Trajectory that would produce that Trajectory (e.g., via automatic and/or manual implementation).

Constraints: A set of conditions that the Trajectory aims to adhere to without violations.

Geometric Constraints: Constraints that can be evaluated using the Trajectory.

Command Constraints: Constraints that require a Command Schedule to evaluate.

Candidate: A unique set consisting of exactly one Trajectory and one Command.

Schedule (e.g., a Trajectory may have one or more possible Command Schedules).

Constraint Violations: A list of Constraints a Candidate violates.

Candidate Property: A value computed using a cost function indicating quality of a candidate with respect to that property.

Plan: The original planned trajectory provided as input (e.g., via digital input, etc.).

In one embodiment, the trajectory evaluation and ranking approach as illustrated in FIG. 5 can evaluate constraint violations for the generated candidates; noting that it may also evaluate the cost functions for multiple candidate properties. In certain embodiments, a user can prioritize and/or weight parameters being optimized. A component may also generate a prioritized list of candidates for the user to choose from.

In one embodiment, the trajectory evaluation and ranking solver takes as input the trajectories and drill command schedules from the command scheduler; noting that it may also receive constraint configurations, constrain violation penalties, and candidate property weights. The output may be, in one embodiment, a prioritized list of candidates.

As explained, the system can provide for state estimation that estimates state using inference based on data, where such data can include data pertaining to equipment of a drillstring, a drill plan, etc. Such a system can include a state manager that handles multiple parallel states, for example, to assess possible scenarios using parallel state inference algorithms, etc. Such a system can include a trajectory manager that interfaces with multiple trajectory creation sources/states and manages multiple trajectory candidates. Such a system can include a drill command scheduler that generates one or more drill command sequences for each candidate trajectory. Such a system can include a ranking system that evaluates constraint violations and properties, for example, to sort candidate trajectories according to one or more defined optimization objectives. Such a system can include an active plan manager that monitors, for example, in-progress action and makes or suggest adjustments, triggers re-planning, requests user intervention, etc. As an example, such a system may issue instructions to one or more pieces of equipment for purposes of control. For example, consider control at one or more levels of automation (see, e.g., levels 0 to 5 of FIG. 41).

Figure 6:
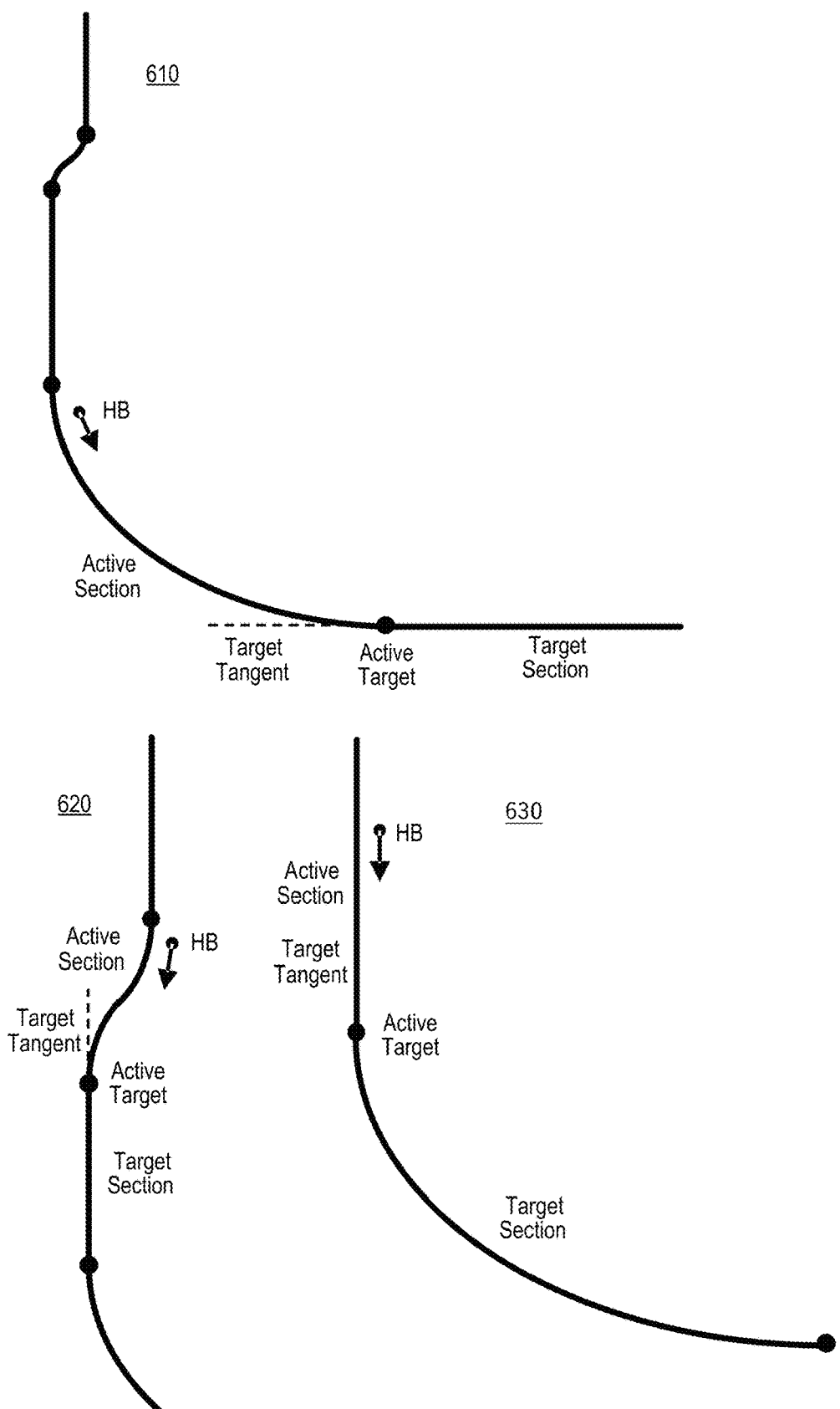
FIG. 6 shows examples of plots.

FIG. 6 illustrates embodiments of candidate trajectories 610, 620 and 630. In one embodiment, trajectories are generated as part of the working plan. The trajectories may be generated using the hole bottom (HB) as a starting point and may also account for the orientation. A constraint may specify that the trajectory end points are to lay on the plan. In certain embodiments, the user may specify an active target, separate from the end target, for the trajectory to land on.

In the example of FIG. 6, the trajectories 610, 620 and 630 are illustrated along with indicators as to active section, target tangent, active target and target section. As shown, HB is labeled in each of the trajectories 610, 620 and 630.

Figure 7A:
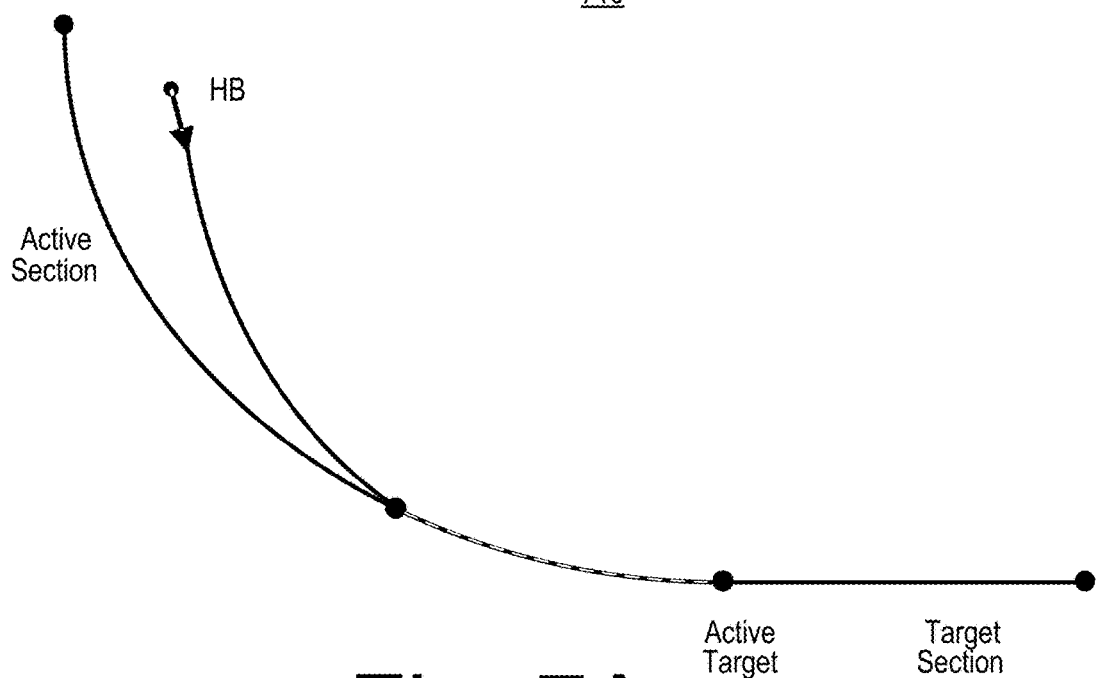
FIG. 7A and FIG. 7B show examples of plots.

FIG. 7A shows a graphic 710 for a solution that may land on an active section, and append the active section to the active target. The HB can be a point with a vector that indicates a general forward direction of a borehole at that point.

Figure 7B:
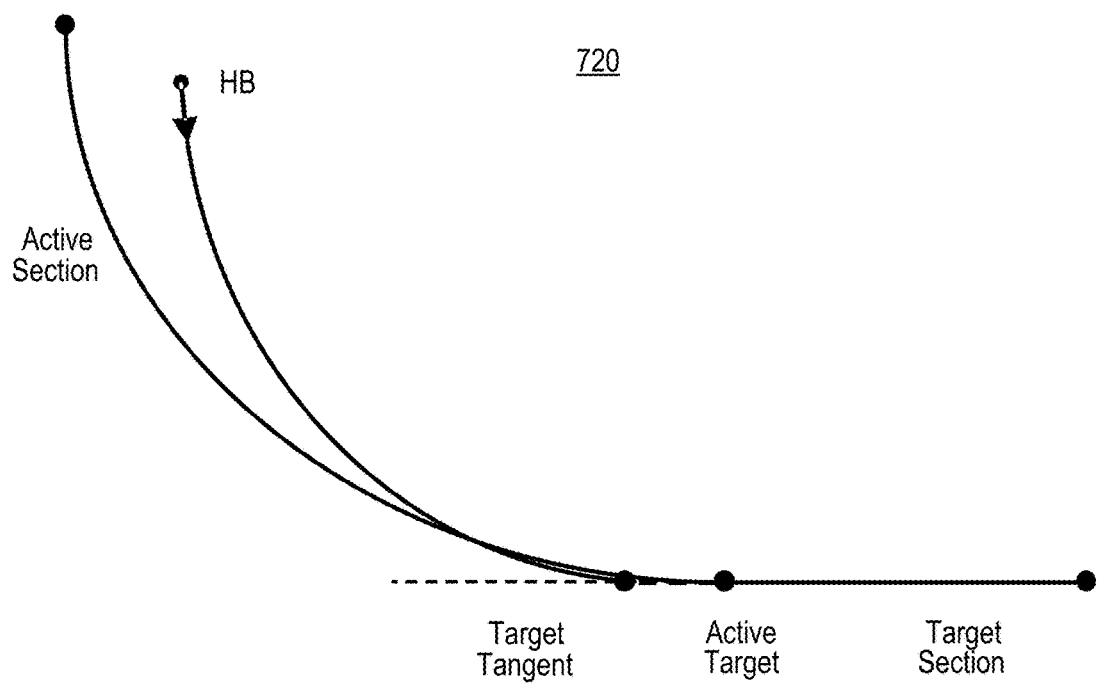

FIG. 7B shows a graphic 720 for a solution that may land on a target tangent and append the target tangent to the active target. The solution may also, in certain embodiments, land on a target section.

Figure 8:
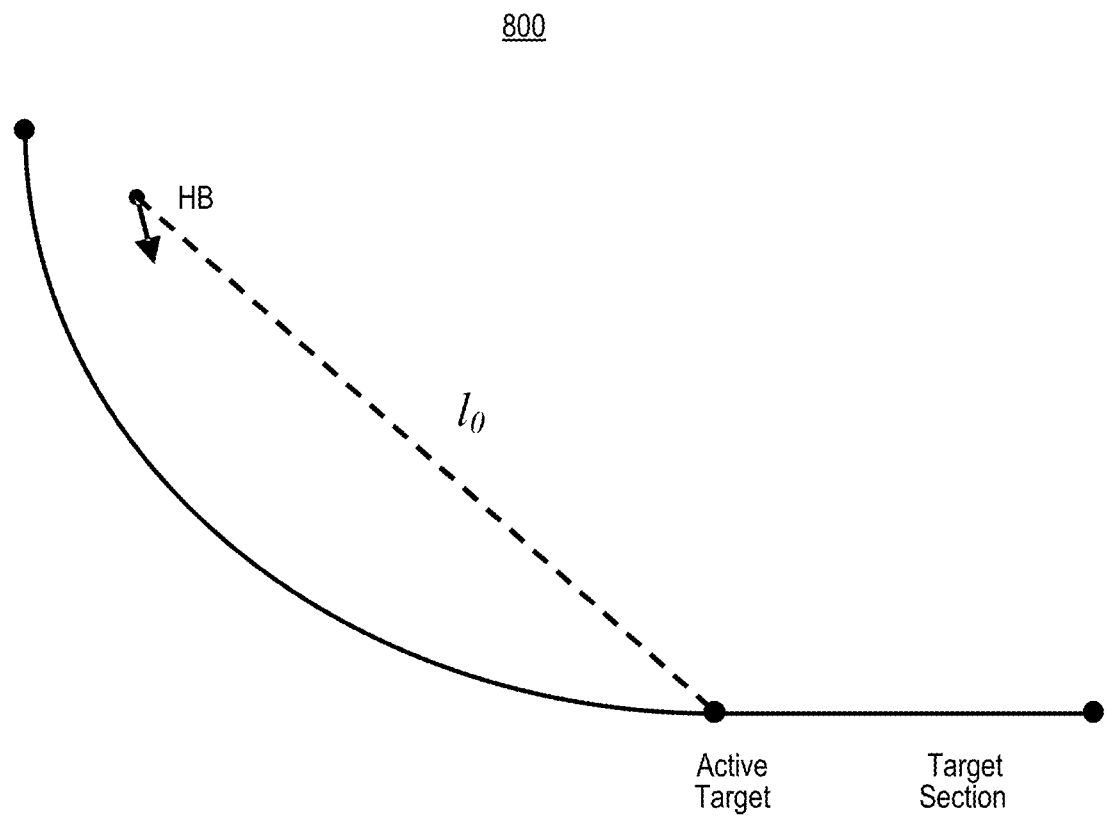
FIG. 8 shows an example of a plot.

FIG. 8 shows a graphic 800 of a trajectory normalization length $l_0$, which may be the cord length between the hole bottom (HB) and the active target (AT). Deviation from the plan may be normalized using a reference cylinder radius $R_0$. In certain embodiments, this value is the same as the cylindrical constraint radius such that $R_0 = C_c$.

A deviation angle derived from target constraints may be indicated by an angular deviation normalization angle $A_0$. In certain embodiments, this is not allowed to be set to a zero value and a lower bound, such as 1 degree, may be set. In certain embodiments, this may be further split into inclination and azimuth components.

Figure 9:
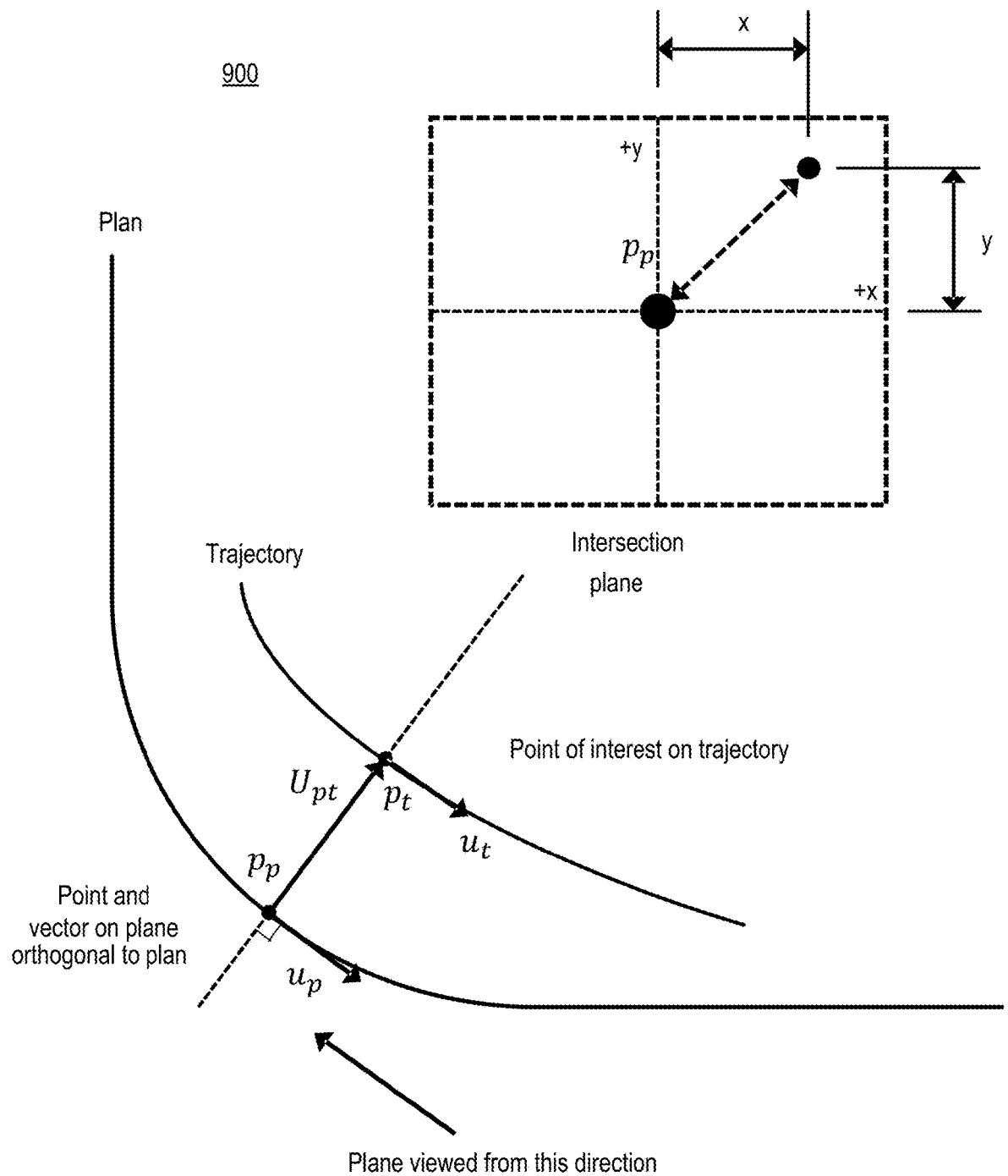
FIG. 9 shows an example of a plot.

FIG. 9 illustrates one embodiment of a plan reference frame 900. In certain embodiments, the reference frame 900 can be used to evaluate deviation cost functions and geometric constraints (e.g., computed in the reference frame of the plan). In one embodiment, the plan reference frame 900 includes a coordinate system that is defined by a plane orthogonal to the plan at that point. For a given point on the trajectory, it may be the plan that intersects that point, and the plan, and is orthogonal to the plan at the point of intersection. In some cases, there may be multiple planes that fit the above conditions; in such cases, the plane with the distance between points $p_p$ and $p_t$ that is the smallest may be selected.

In the example of FIG. 9, the +y direction may be defined by a unit vector $u_{py}$ s.t.

$$\text{inclination}(u_{py}) = \text{inclination}(u_p) + \frac{\pi}{2}$$

$$\text{azimuth}(u_{py}) = \text{azimuth}(u_p)$$

In the example of FIG. 9, the +x direction is defined by a unit vector $u_{px}$ s.t.

$$u_{px} = u_{py} \times u_p$$

As shown in FIG. 9, a method can include defining a position vector from $p_p$ to $p_t$: $U_{pt}$ $$x = U_{pt} \cdot u_{px}$$

$$y = U_{pt} \cdot u_{py}$$

FIG. 9 also illustrates a plan reference plane where deviation of the point $p_t$ from the plan can be defined as:

$$d=\sqrt{x^2+y^2}$$

In the example of FIG. 9, the angular deviation $\alpha_r$ from the plan at the point $p_t$ can be defined as:

$$\alpha_r = \cos^{-1}(u_t \cdot u_p)$$

Figure 10:
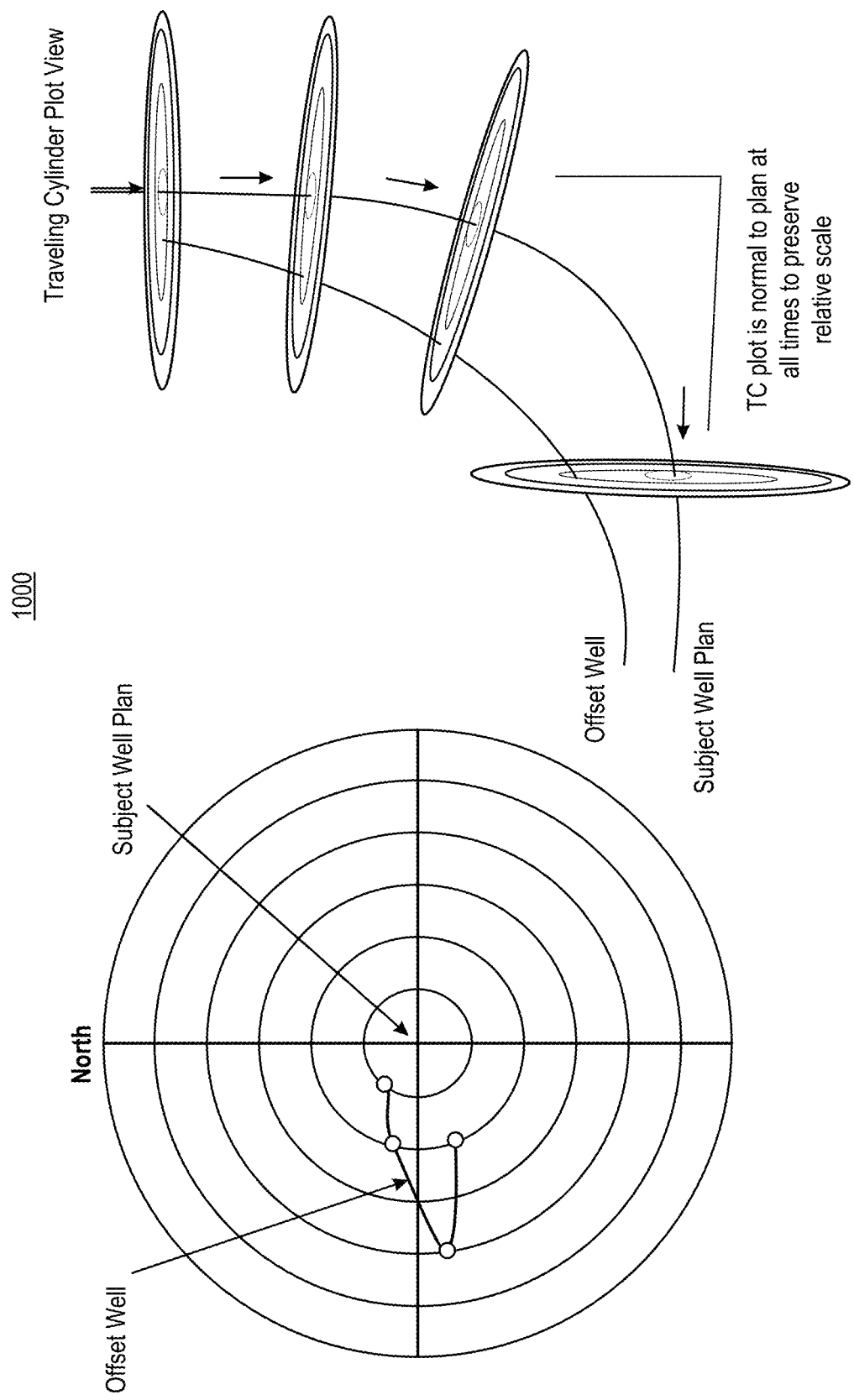
FIG. 10 shows an example of a plot.

FIG. 10 illustrates a traveling cylinder (TC) approach 1000 that can utilize a circle in a plane with a trajectory at the origin of the circle where a cylindrical coordinate system or coordinates of a circle can be defined. Such an approach can be utilized where one or more offset wells exist, for example, to facilitate anti-collision measures that aim to avoid collision of wellbores.

Figure 11A:
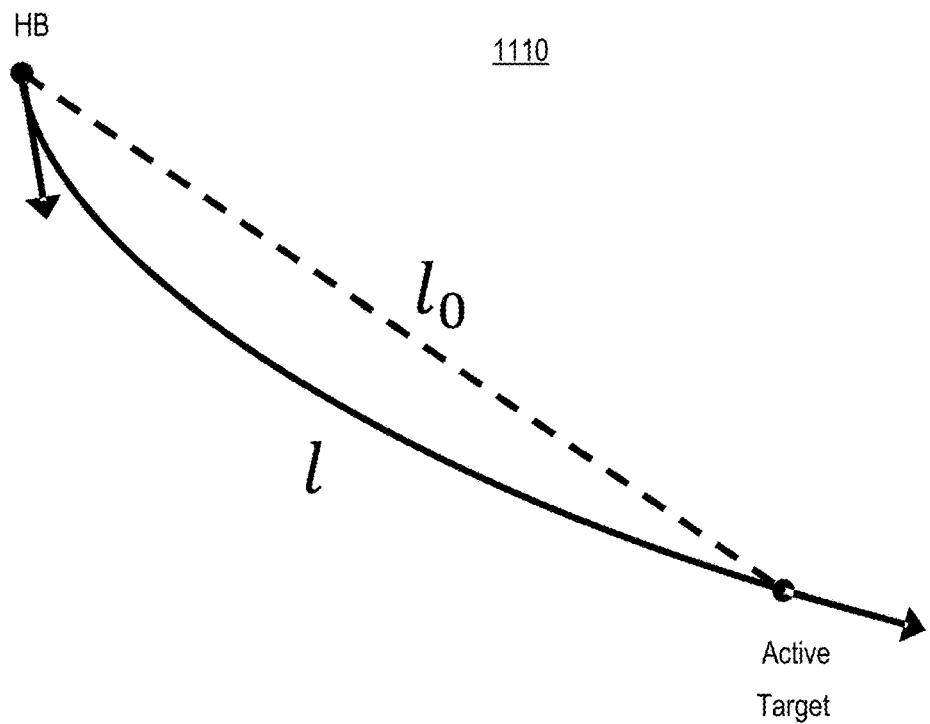
FIG. 11A and FIG. 11B show examples of plots.

FIG. 11A illustrates, via a graphic 1110, one approach to trajectory length cost. In one embodiment, this is normalized using the length of a straight line connecting the end points (HB-AT) without accounting for orientation. In circumstances where the vectors are on the same line, and the candidate is a straight line, the cost function may return 0. A system may prohibit values less than 0. In certain circumstances, where considering trajectories shorter than $l_0$, the length may be assumed to be $l_0$ for computation purposes. As an example, consider the following equation:

$$L = \frac{l}{l_0} - 1$$

Figure 11B:
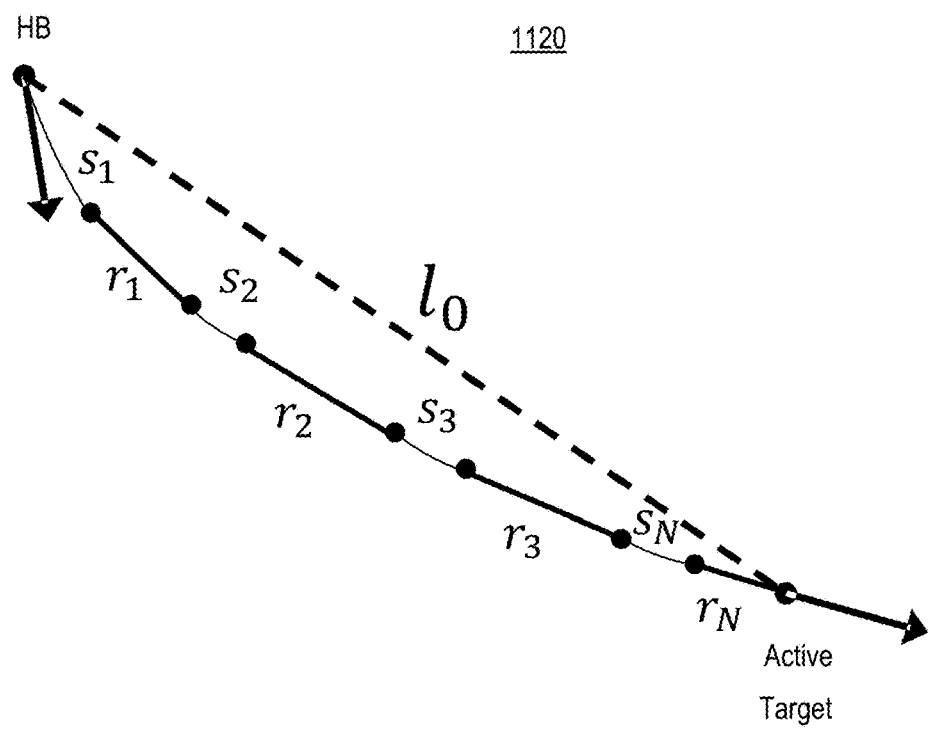

FIG. 11B illustrates, via a graphic 1120, an approach to steering ratio cost. In one embodiment, each drilled unit (DU) is composed of one slide and one rotate section, which may be defined as follows:

$$DU_i = s_i + r_i$$

In such an approach, the steering ratio for a given DU can be defined as:

$$SR_i = \frac{s_i}{DU_i}$$

And, the average slide ratio can be defined as:

$$SR_{avg} = \frac{1}{N}\sum_{i=1}^{N} SR_i$$

As to the maximum slide ratio, the largest SR in the command sequence, consider:

$$SR_{max} = \max(SR_i)$$

Figure 12A:
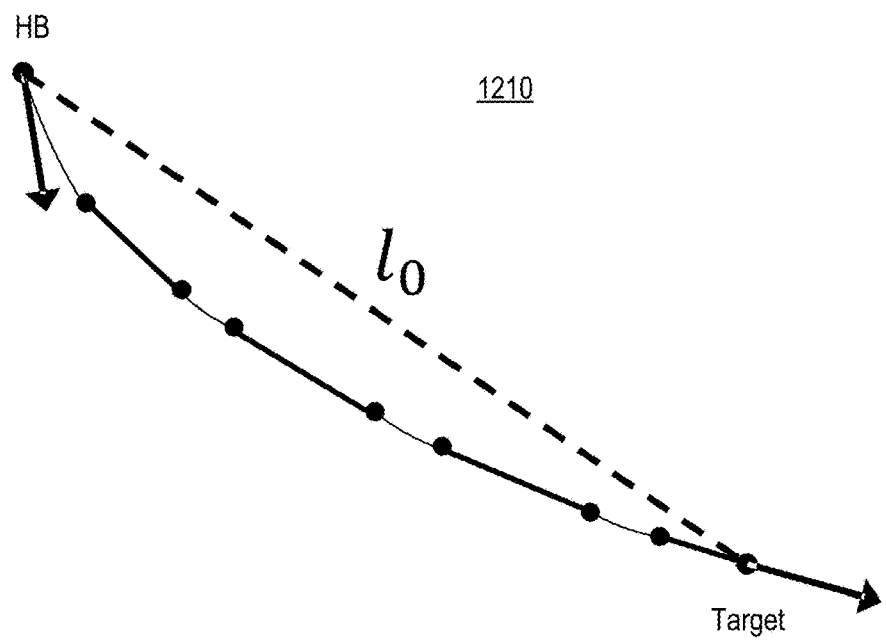
FIG. 12A and FIG. 12B show examples of plots.

FIG. 12A illustrates, via a graphic 1210, an approach to steering length cost. In one embodiment, this cost can be the sum of the lengths of the resulting bore that was generated while steering, normalized using the lengths of a straight line between the end points. For example, consider:

$$SL_{tot} = \frac{1}{l_0}\sum_{i=1}^{N} s_i$$

Figure 12B:
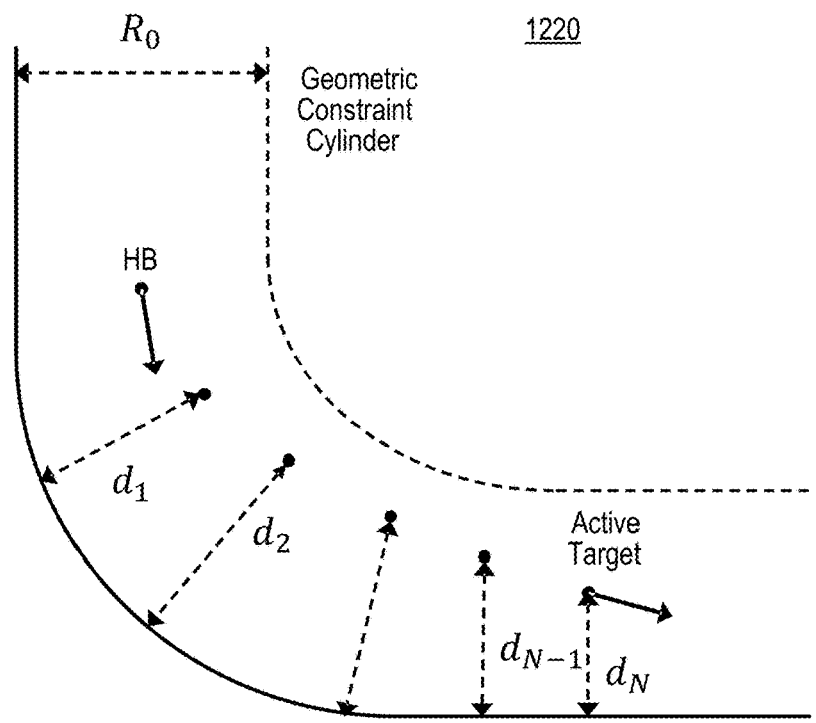

In FIG. 12B, an approach to deviation from plan (average and maximum) is shown via a graphic 1220. In one embodiment, deviation from plan can be represented as the minimum distance between each point and the plan, averaged over the minor points on the candidate trajectory, including the target endpoint, but excluding hole bottom.

As an example, an approach can include normalization via a deviation normalization radius $R_0$ as shown in the graphic 1220. For example, using a constraint cylinder radius may ensure that the cost functions is scaled in a way where 0 is perfect, and indicates already being too far off. For example, consider average and maximum as given by the following equations:

$$D_{avg} = \frac{1}{NR_0}\sum_{i=1}^{N} d_i$$

$$D_{max} = \frac{1}{R_0}\max(d_i)$$

Figure 13A:
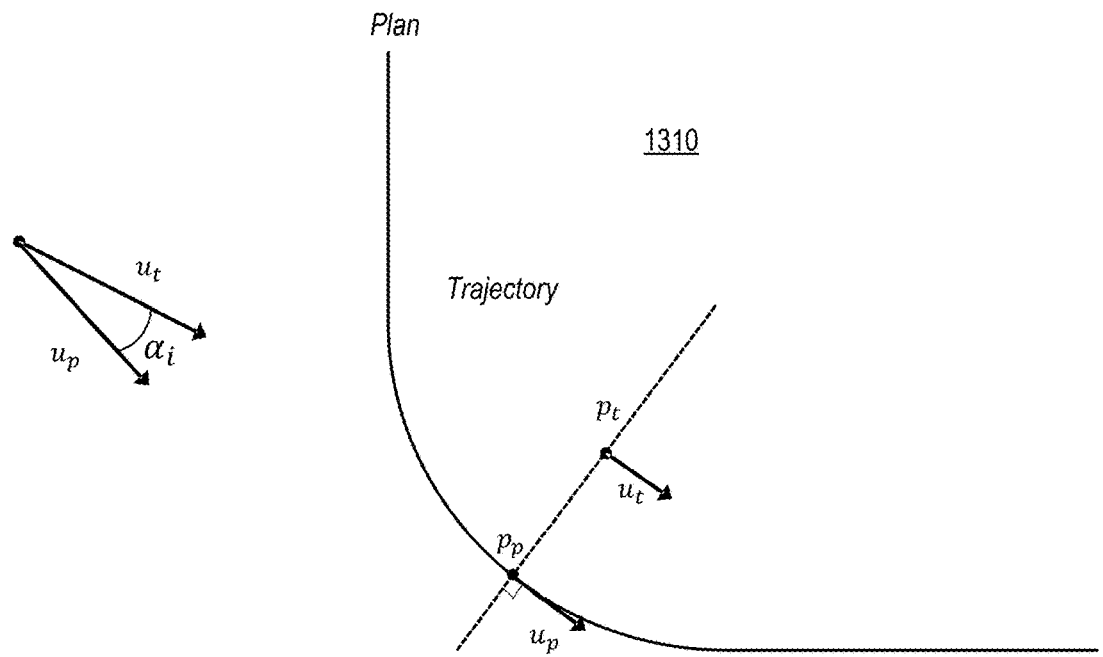
FIG. 13A and FIG. 13B show examples of plots.

FIG. 13A illustrates, via a graphic 1310, an approach to angular deviation where the average and maximum absolute value of the angle $\alpha$ between the vectors $u_p$ and $u_t$ can be formulated as follows:

$$A_{avg} = \frac{1}{NA_0}\sum_{i=1}^{N} |\alpha_i|$$

$$A_{max} = \frac{1}{A_0}\max(|\alpha_i|)$$

Figure 13B:
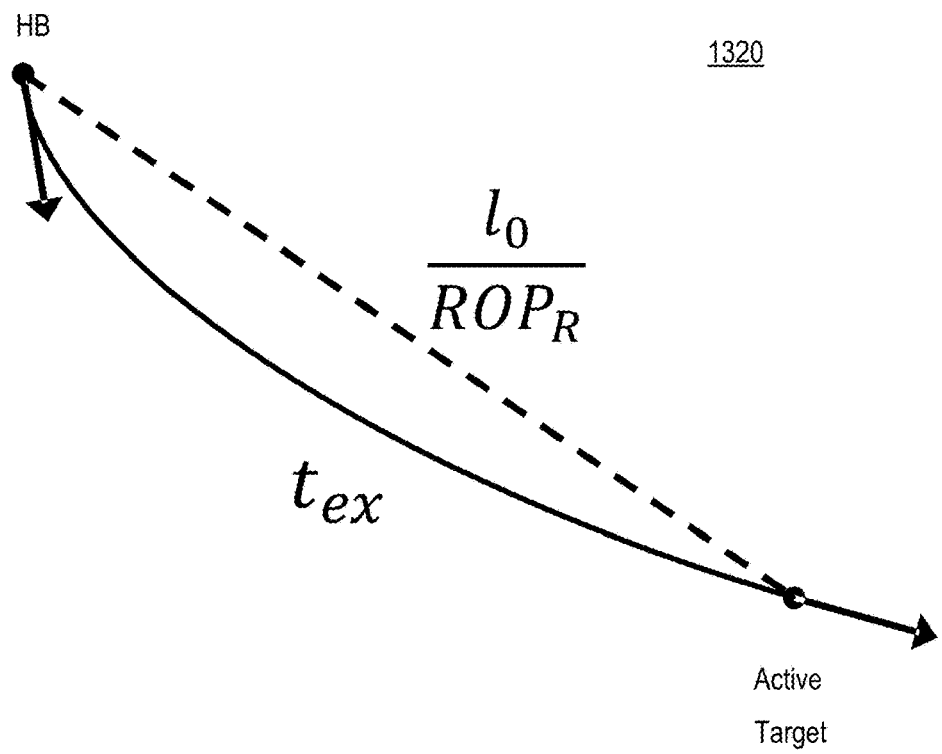

FIG. 13B illustrates, via a graphic 1320, an approach to total time ($T_{tot}$) where:
ROP$_R$: Estimated rate of penetration (ROP) for pure rotation over $\Delta MD = l_0$
$t_{ex}$: Drill command schedule estimated execution time (based on hole propagation model and candidate cmd. schedule)

$$T_{tot} = \frac{t_{ex} \cdot ROP_R}{l_0} - 1$$

$$t_{ex} = \frac{SL_{tot}}{ROP_S} + \frac{RL_{tot}}{ROP_R}$$

Figure 14A:
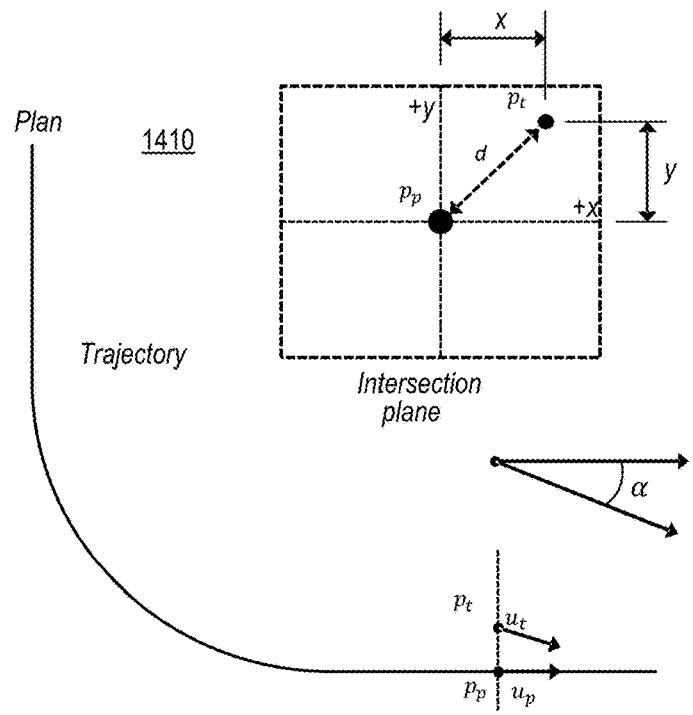
FIG. 14A and FIG. 14B show examples of plots.

FIG. 14A illustrates, via graphic 1410, an approach to trajectory endpoint deviation where the position and angular deviation of the trajectory endpoint relative to the point on the plane at which an orthogonal plane intersects the trajectory end point. In such an example, this cost will be zero if the trajectory terminates on the plan. In one embodiment, each can have its own weight value, and can be high enough in value to severely punish candidates that terminate far away from the plan. For example, consider the following approaches:

$$E_\alpha = \frac{\alpha}{A_0}$$

$$E_d = \frac{d}{R_0}$$

In one embodiment, snaking is taken into consideration. In one approach, for two consecutive stands (e.g., or segments of drill pipe), if the stands are of the same toolface mode, but the toolface difference is larger than +/−90 degrees, then a value of 1 can be added to the snaking cost.

As an example, an approach to trajectory constraint violations may be as follows:

Candidates are evaluated for constraint violations, creating a vector of constraint violation costs $V_i$ where, in one embodiment, each constraint violation has a corresponding violation penalty $P_i$ and the total constraint violation cost is:

$$C_{viol} = \sum_i V_i P_i$$

where, the total cost of a candidate is the sum of property and constraint violation costs, as follows:

$$C_{tot} = C_{prop} + C_{viol}$$

Constraints that may be considered include one or more of: TrueVerticalDepthAbove; TrueVerticalDepthBelow; Distance; Right; Left; InclinationHigh; InclinationLow; AzimuthRight; AzimuthLeft; North; South; East; West; MaxDogLegSeverity; MinimumSlideLength; Cylinder; AbovePlan; and BelowPlan.

In one embodiment, trajectory violation penalties can be computed and weighted for each drilling unit (DU) $u_i$. The DU weighting $w_i$ may be linear (e.g., or nonlinear), and may be normalized such that $\sum_{i=1}^{N} w_i = 1$, which makes the violation cost increase linearly with each drilling unit (DU). The weighting cost for each DU, in one embodiment, can be given as:

$$w_i = \frac{2i}{N(N+1)}, i = 1, 2, 3 \ldots N$$

As an example, the trajectory violation weight may be summed for each DU that violates the constraint:

$$V = \sum_{i=1}^{N} \begin{matrix} w_i, & DU_i \text{violates constraint} \\ 0, & \text{otherwise} \end{matrix}$$

Figure 14B:
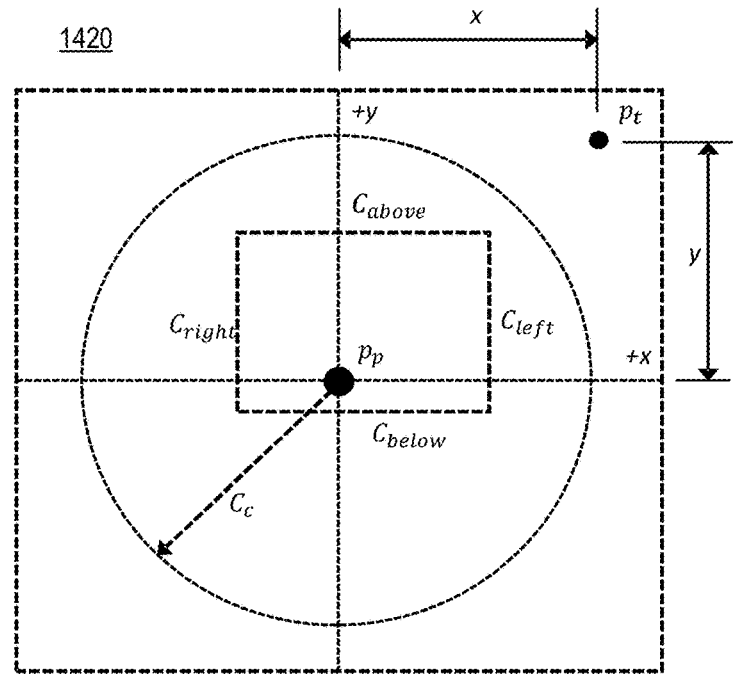

FIG. 14B illustrates, via a graphic 1420, one embodiment of consideration of spatial constraints. In one embodiment, the position relative to the plan is used to evaluate the cylindrical and rectangular spatial (tunnel) constraints, as well as the maximum/average deviation costs.

As an example, consider the following rectangular constraints:

Left: $x < C_{left}$
Right: $x > -C_{right}$
Above: $y < C_{above}$
Below: $y > -C_{below}$ As an example, consider the following cylindrical constraint:

$$D_t < C_c$$

In certain embodiments, rectangular constraints may be relaxed or not used at low inclination.

Figure 15:
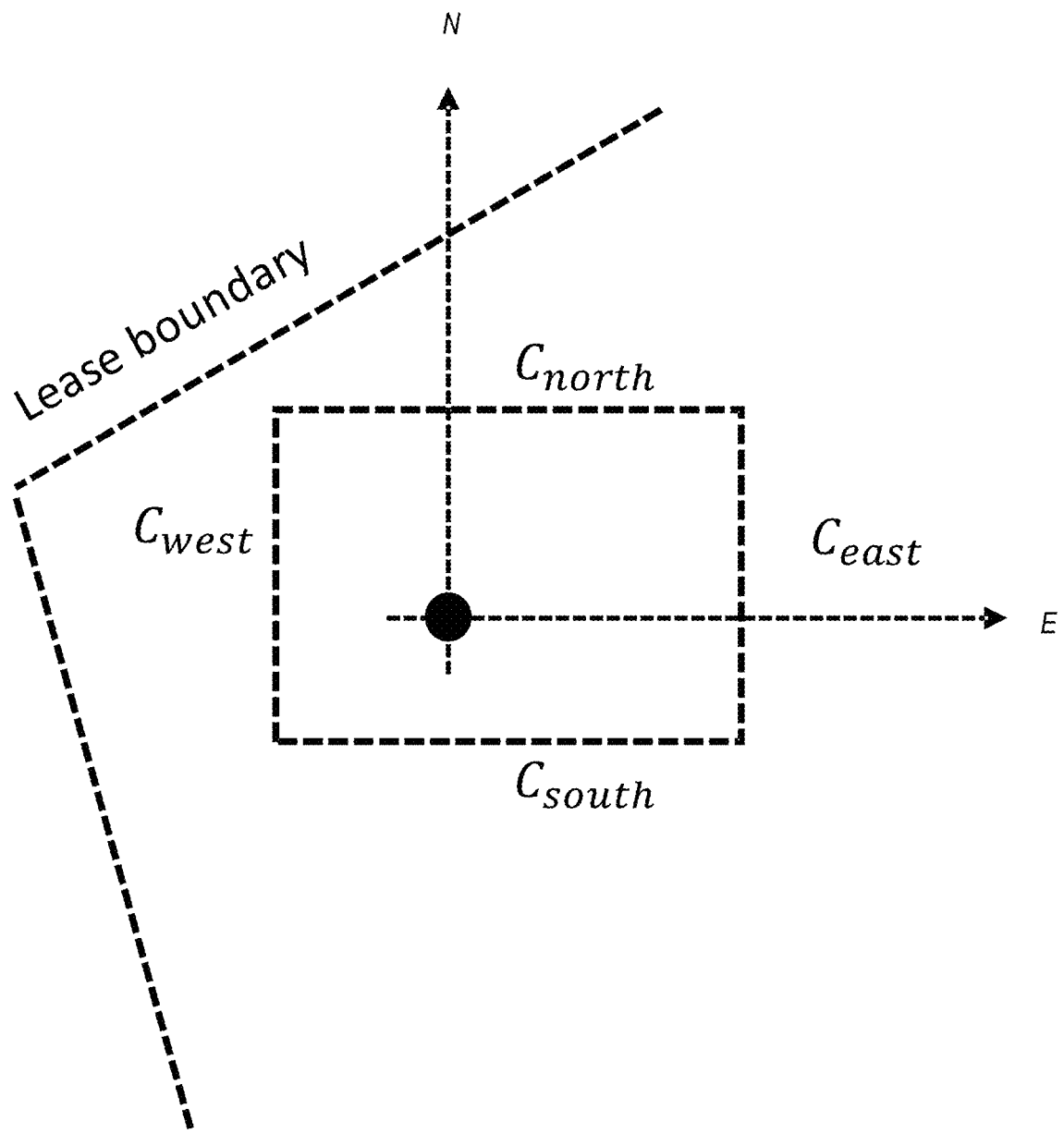
FIG. 15 shows an example of a plot.

FIG. 15 shows a graphic 1500 as to some examples of global constraints, which may also be set. For example, global constraints and a point $p_t$ are violated if the values exceed a given upper or lower boundaries, which may be defined as:

Angular:
InclinationHigh: $inc < C_{IncHigh}$
InclinationLow: $inc > C_{IncLow}$
AzimuthRight: $azimuth < C_{IncRight}$
AzimuthLeft: $azimuth > C_{IncLeft}$ Spatial:
North: $NS < C_{north}$
South: $NS > -C_{south}$
East: $EW < C_{east}$
West: $EW > -C_{west}$ Lease Boundary:
A set of 2D curves in a NS-EW plane may define surfaces representing hard boundaries that are not to be crossed. Candidates that violate this constraint can be disqualified by default.

As an example, a method can include generating a working plan in a manner that enables aiming for multiple targets simultaneously. Such an approach can address one or more challenges such as target shifts and unknown exact current hole bottom (HB) location.

Figure 16:
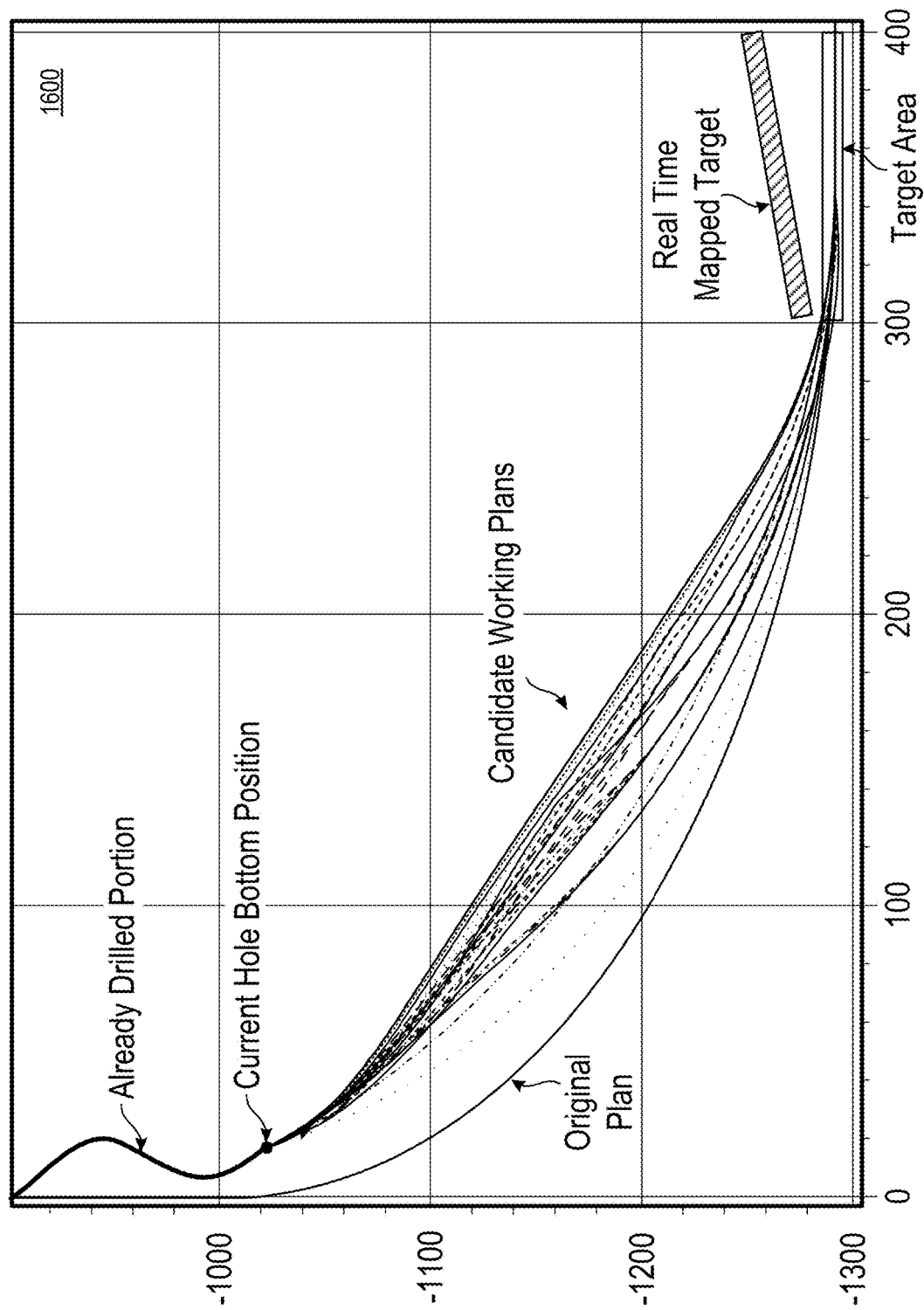
FIG. 16 shows an example of a plot.

FIG. 16 shows an example plot 1600 of examples of trajectory candidates from a working plan generation method where challenges such as target shifts and unknown exact current hole bottom location can occur. In the example of FIG. 16, a portion of the wellbore is already drilled up to a current hole bottom position, which may be known with uncertainty. For example, a survey taken by downhole measurement equipment (MWD, etc.) can provide an indication of position; however, surveys may not be taken at sufficiently short intervals or at the current hole bottom position. For example, consider a drill plan that calls for surveys at every 100 meters such that intervals of 100 meters between surveys have greater uncertainty than at the survey points. As to target shifts, the plot 1600 shows a block that represents real time mapped targets, which can differ from the target area.

In the plot 1600, note that the candidate trajectories do not intersect the original plan except for at or near the target area. In such an approach, a candidate does not consider re-entry to the original plan, where such re-entry is possible. For example, with re-entry, a candidate may intersect the original plan such that the original plan can be re-implemented, which may provide for following a greater portion of the original plan.

As an example, a method can include directional advising in a manner that defines properly one or more strategies for returning back to a plan and aiming for a planned target(s). In such an example, the goal can be to define a working plan moving forward considering efficiency, with performance as well as current context and anticipating future context by assessment of parameter optimization.

As an example, a method can generate a working plan based on automatic trajectory generation augmented with a ranking system that will select the best option(s) for a given set up of properties (e.g., parameters, etc.).

A plan generation system can be quite extensible to consider various different properties that may be added, deleted, etc., for purposes of ranking. While such a system can be implemented for real-time execution (e.g., during drilling operations), such a system may be utilized in a planning phase to derive a plan that meets demands to deliver a plan suitable for use during the execution phase.

Figure 17:
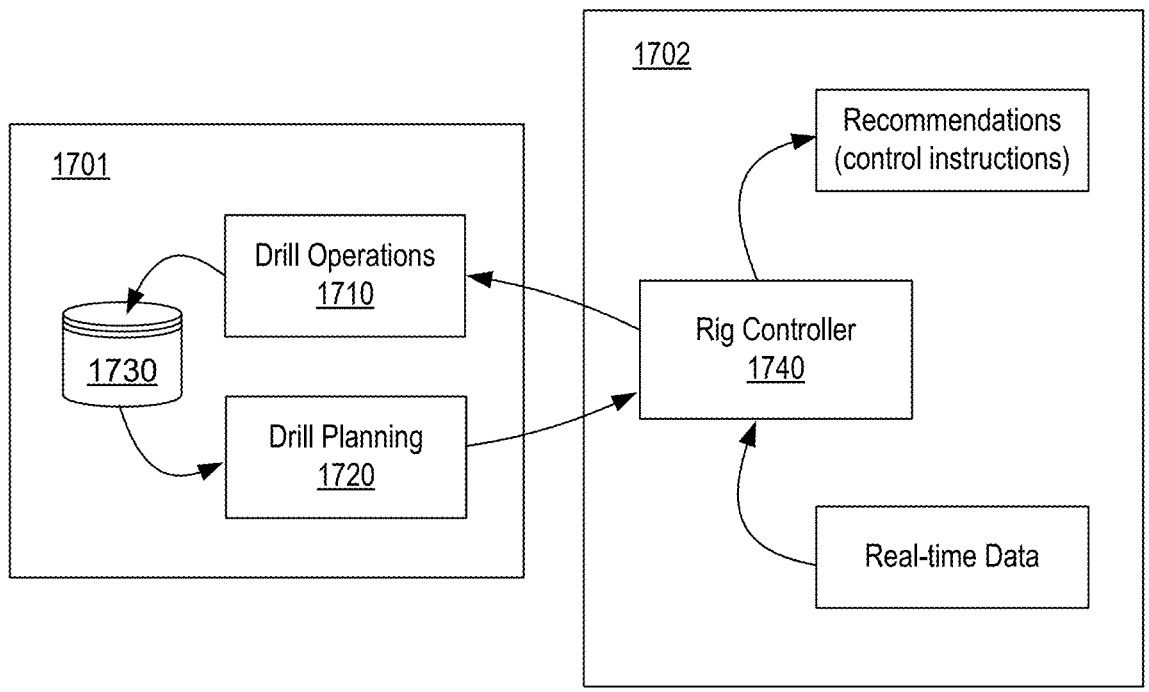
FIG. 17 shows an example of a system.

FIG. 17 shows an example of a system 1700 that includes offsite equipment 1701 (e.g., remote) and onsite equipment 1702 (e.g., local). As shown, the offsite equipment 1701 can include a drill operations framework 1710, a drill planning framework 1720 and a database 1730 and the onsite equipment 1702 can include a controller 1740 that can receive real-time data and output recommendations such as control instructions to control onsite equipment. In such an example, the drill operations framework 1710 can provide for steering sheets, execution parameters, etc., and the drill plan framework 1720 can provide for evaluation of steering responses and statistics. As shown, the controller 1740 can output information to the drill operations framework 1710 and receive information from the drill plan framework 1720. The system 1700 can include plan generation features for real-time plan generation during drilling operations execution phase and/or plan generation during a planning phase. The system 1700 can be utilized for one or more types of drilling (e.g., rotary, mud motor, RSS, etc.). The system 1700 can operate loops, which can include at least one real-time loop that provides for control of equipment to perform drilling operations.

A system such as the system 1700 may utilize various functions and penalties for generation of plans, which may provide for single or multiple target aiming. As explained, a plan can be generated that aims to provide for drilling operations that aim for multiple targets simultaneously. As an example, the system 1700 can include one or more features of the system 400 of FIGS. 4 and 5.

Figure 18:
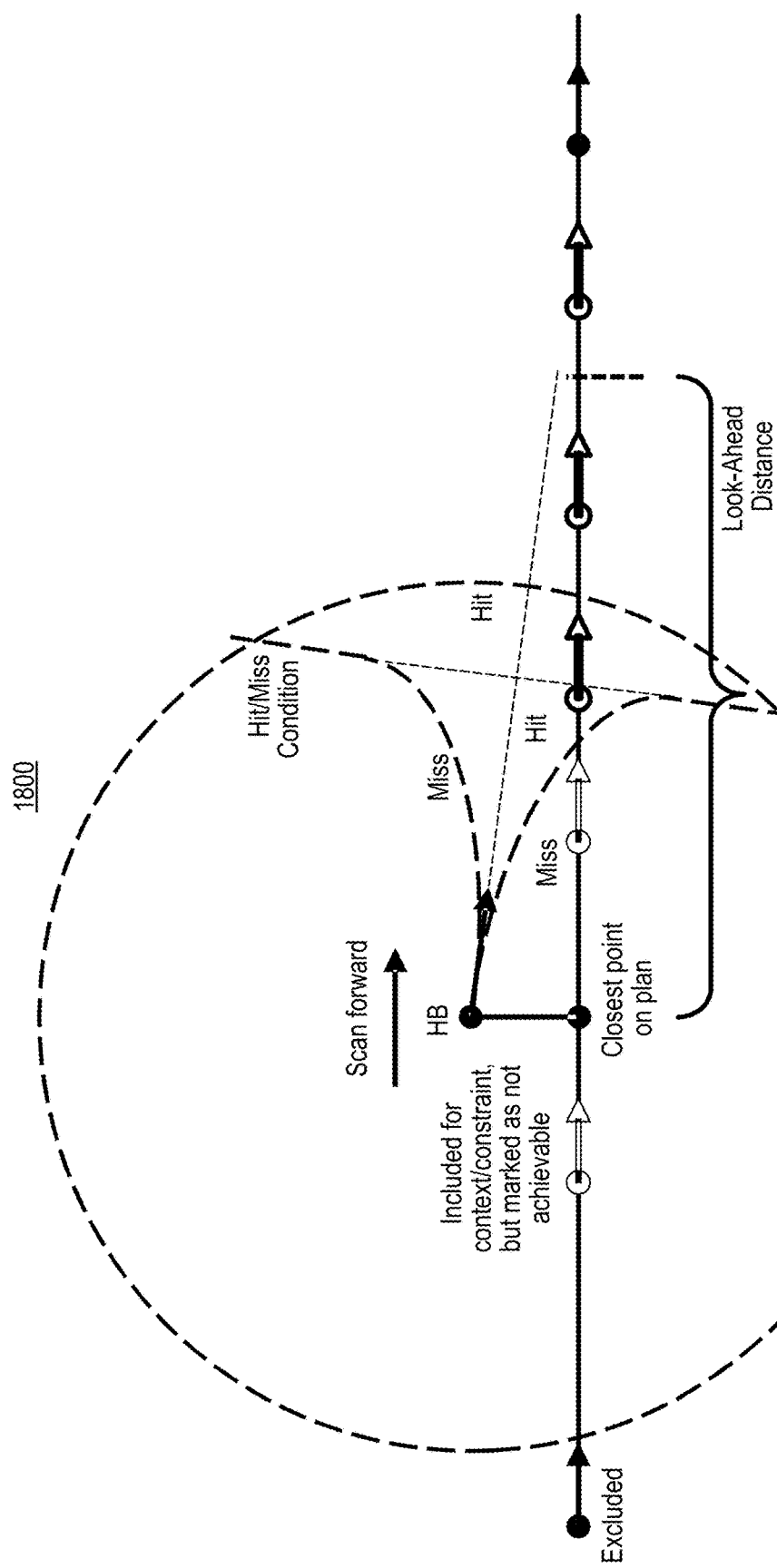
FIG. 18 shows an example of a plot.

FIG. 18 shows an example graphic 1800 that provides for multi-target aiming. In the example of FIG. 18, some of these targets may be targets imposed during a planning phase and may include other targets that might be targets added during execution to provide to a solver an improved chance of taking into account unachievable targets and targets that are further away (e.g., in a space between a current hole bottom and a final target, etc.).

In the graphic 1800, various features are shown such as a circle or sphere about a HB point, a scan forward direction, an excluded target or targets, a closest point on path (e.g., between a plan and a current HB point), a missed target or targets, one or more possible targets that are on the path (e.g., planned trajectory) between the HB point and a final target, where, for example, one or more of the possible targets can be within a defined look-ahead distance. In the example of FIG. 18, a hit region and a miss region are shown where the miss region can be utilized to exclude targets and the hit region can be utilized to include targets. In the example of FIG. 18, a cone approach is shown, noting that one or more other approaches may be utilized.

As an example, a method can include finding a closest point on a plan and scanning forward until encountering at least one achievable target that is at least one look-ahead distance ahead. In such an example, the method can include an initial set of targets that are within proximity and then assess such targets to determine if each of the targets is unachievable or achievable according to one or more hit and/or miss criteria.

In the example of FIG. 18, the open arrows and circles with thick lines represent active section targets passed to a trajectory generator where, for example, a method can proceed if there is at least one where the furthest one is at least in the look-ahead distance. In such an example, one or more of these targets is to pass hit/miss criteria, if within proximity, to be considered.

In the example of FIG. 18, the open arrows and circles with thin lines represent nearby previous target that can be used for context and constraint purposes, for example, without being passed to a trajectory generator. These points can be within proximity though failing one or more of the hit/miss criteria.

In the example of FIG. 18, the filled arrows and circles represent excluded targets that are not considered directly. For example, these can be behind and/or outside the proximity criterion or, for example, ahead and further than appropriate to scan to meet active section demands.

In the example of FIG. 18, the multi-target approach can be implemented as an alternative to or in addition to a single-target approach (e.g., a single active target approach) where the single-target approach utilizes a target-shift algorithm to advance the target as appropriate.

In various instances, a current active target might not be achievable. In such instances, a possible approach would be to aim for the next target that is deemed achievable. However, different targets can have different constraints. For example, consider a landing target where the next target would be the end of a horizontal portion of a wellbore (e.g., a lateral). In such a scenario, if a system aims to the next target and the landing is not completed, this would lead to use of hold constraints and risk failing to finish the landing of the well. Further, even if good candidate trajectories are available, comparing them with trajectories that are aiming much further down the line may lead to not selecting them in a ranking system.

As to some other examples of issues related to a single-target approach, consider lack of consideration of anything past or behind the current target, unreliable/inconsistent handling of section transitions, inability to utilize cost functions for target advancement, inability to compare trajectories properly, as mentioned above, etc.

As to a multi-target approach, consider multi-targets inside a working plan generator that can provide for defining a hit/miss region (e.g., a cone region of hit/miss, etc.), enabling passing of multiple targets to a trajectory generator, adding and/or removing targets as appropriate or desired, removing floating trajectories that may be difficult to rank relative to other trajectories, including unachievable targets in trajectory generation and ranking, extending trajectories to a furthest target by appending sections of a well plan, etc.

As an example, once a working plan generator (WPG) has generated multiple trajectories, it may display multiple options to a user such that the user can select a suitable course for implementation, which may provide for automated control (see, e.g., the controller 1740 of the system 1700).

As an example, a system such as the system 1700 or a portion thereof may automatically propose new trajectory options, which may be rendered to a display. In such an example, if a user does not make a selection after a certain amount of time, the option of making a selection may automatically disappear, for example, until another scenario arises for trajectory generation, ranking, etc.

As an example, a method can provide for multi-target working plan generation using an approach akin to single target working plan generation in that the method involves candidate trajectory generation and ranking. In such an example, trajectory generation can be achieved by providing target points, target lines, target areas and/or target volumes with tolerances to a trajectory generator. From such targets, the trajectory generator will aim at these points with a maximum allowable deviation from them. As to ranking, it can consider context category assignment and/or one or more other techniques.

Figure 19:
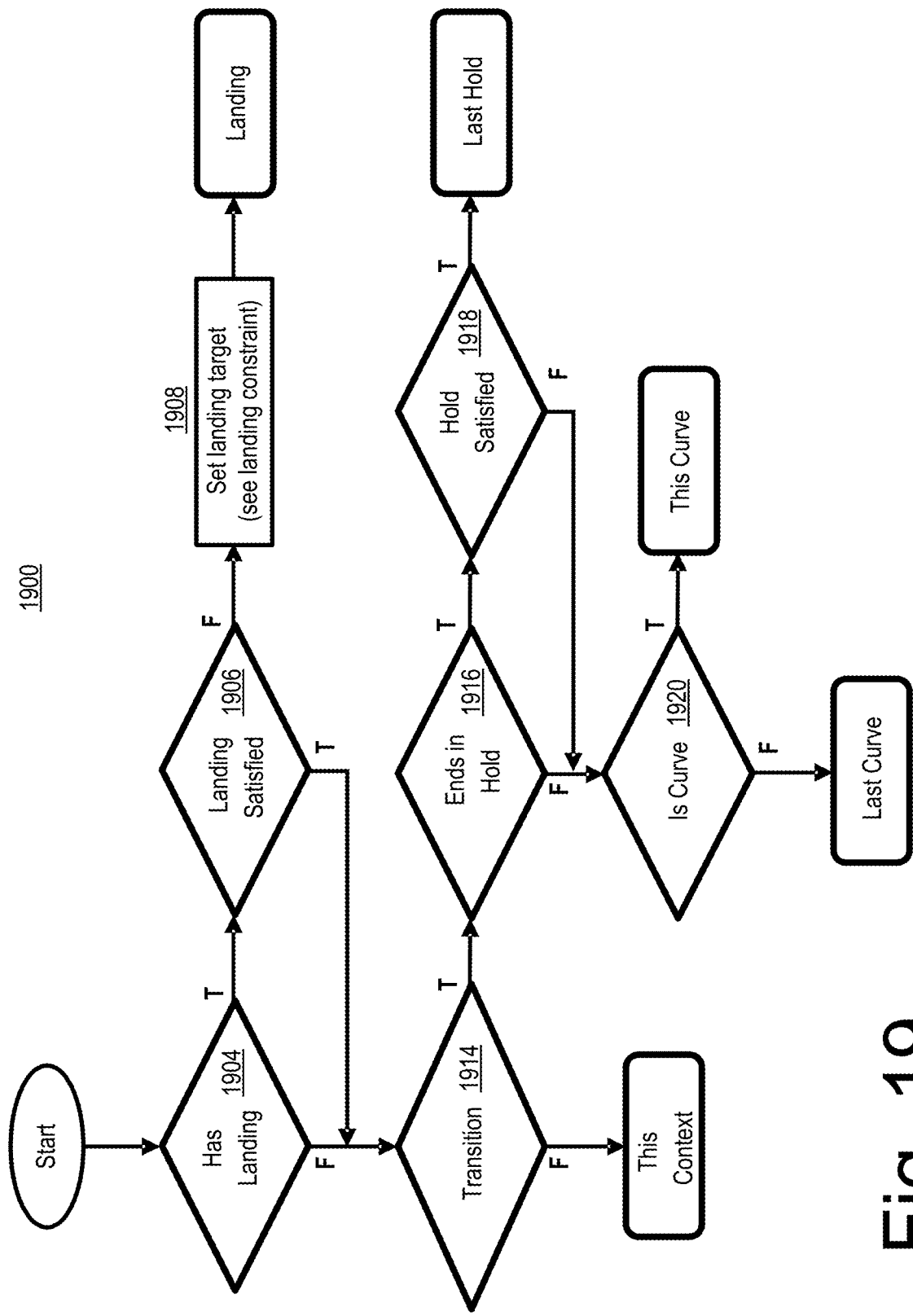
FIG. 19 shows an example of a method.

FIG. 19 shows an example of a method 1900 that includes various decision blocks. Such blocks can provide for making various decisions that can provide for context assignment. For example, consider condition based context assignment where conditions can include "has landing" (e.g., a target section contains a landing constraint); landing satisfied (e.g., a landing constraint has been satisfied); transition (e.g., a section contains sections from two or more context categories); "ends in hold" (e.g., a last section in a target section is from the hold category); hold satisfied (e.g., constraints for last hold section are met); and "is curve" (e.g., nearest point on a planned trajectory is within context from the curve category).

As shown in the example of FIG. 19, the method 1900 includes various decision blocks such as a "has landing" decision block 1904, a landing satisfied decision block 1906, a transition decision block 1914, an "ends in hold" decision block 1916, a hold satisfied decision block 1918, and an "is curve" decision block 1920. As indicated, yes and no or true (T) and false (F) decision may be made by the decision blocks 1904, 1906, 1914, 1916, 1918 and 1920. As indicated, such decisions can end in target related outcomes (e.g., assignments, characterizations, etc.) such as set landing target per the block 1908 that sets to landing, last hold where hold is satisfied, this curve, where "is curve" is true (T) and last curve where "is curve" is false (F). Further, where "has landing" is false (F) per the block 1904 and where transition is false (F) per the block 1914, the method 1900 can proceed to "this context", which may be akin to a single target approach as various conditions have been either satisfied or do not exist. As explained, the method 1900 can provide for assigning the appropriate context to each target.

As shown in the example of FIG. 19, some examples of context categories include, but are not limited to: hold (e.g., vertical, horizontal, tangent, etc.); curve (e.g., curve, nudge, nudge to vertical, horizontal nudge, etc.); and target (e.g., landing, etc.).

As an example, a method can include generating a working plan while performing directional advising. Such a method can include generating trajectory options and ranking different trajectory options (e.g., candidates) based on system and/or user settings. As an example, a method can include recommending different trajectory options. As an example, a method can include aiming at multiple targets at the same time. As an example, a method can include taking into account a region or regions of hit/miss areas/volume around a hole bottom position (e.g., consider a cone approach or another approach). As an example, a method can include exposing multiple trajectory candidates to a user and/or a machine for selection and/or implementation.

As to hit/miss criteria, for example, to help assess whether a target is achievable, consider an approach that provide a mechanism or mechanisms to determine if a particular target (position and orientation) can be achieved from a current bit location (e.g., HB). In such an example, an algorithm can operate independent of a BHA and may take into account one or more of the foregoing factors: current bit location, target location, tool steering capacity, neutral build rate, and neutral turn rate.

As an example, a hit/miss mechanism can include using a trajectory generator to generate a minimum dogleg severity (DLS) solution from a bit location (HB) to a target where the solution honors position and orientation at the two end points. In such an example, the trajectory can be resampled into sections, for example, with length equal to one drilling unit (DU). In such an approach, each section can be evaluated using scheduler equations to determine the steering capacity required by the tool to traverse that section, taking into account the estimated neutral build/turn rate of the BHA in the current formation. In such an example, where a section of the minimum DLS trajectory requires a steering capacity greater than that estimated by an inference engine, then that target can be considered unachievable, otherwise the target can be deemed to be an achievable target.

As to scheduler equations that can derive slide length/steering ratio provided a starting point and an end point for one DU/reference point, consider the following example, which may be utilized as an option where, for example, the aforementioned cone approach to hit/miss may be utilized as another option.

Definitions

Let:
 l be the length of the drilling unit (DU)
 SL be the slide length for that drilling unit
 SR=SL/l be the percentage of sliding/steering ratio
 $Inc_1, Az_1$ be inclination and azimuth at the start of the DU
 $Inc_2, Az_2$ be inclination and azimuth at the end of the DU
 BR be build rate, $BR_0$ be build rate tendency on rotation
 WR be walk rate (turn rate in the coordinate of the tool axis), $WR_0$ be walk rate tendency on rotation
 Y be motor yield or dogleg capability of the motor while steering 100%

As to deriving the slide length and the toolface, that extends from the point $MD_1$, $Inc_I$, $Az_1$ to the point $MD_2$, $Inc_I$, $Az_2$, consider the definition above, where $l=MD_2-MD_1$. In such an example, the build rate and the turn rate for that DU can follow the following equations:

$$BR=(1-SR)BR_0+YSR\cos(TF)$$

$$WR=(1-SR)WR_0+YSR\sin(TF)$$

Note that the TF that is considered is the toolface taking into account any offset that might exist. Additionally, consider the following relationships:

$$\frac{\Delta Inc}{l} = BR \text{ and } \frac{\Delta Az}{l}\sin(Inc_2) = WR$$

where it can be assumed that change in the sinus of the inclination is sufficiently small; otherwise a suitable alternative equation may be utilized.

In such an example, a switching value can be utilized along with a minimum between $Inc_1$ and $Inc_2$ where, for example, a minimum of approximately zero may call for the walk rate to be kept at approximately zero (e.g., regardless of the actual changes in azimuth). As an example, a second-degree equation may be obtained that lends itself to a solution. In such an example, as long as the dogleg capability is higher than the absolute norm of the build and turn tendency during rotation, a suitable solution can be provided.

As to an extra constraint on the SR value, as it is a percentage of the DU, it can be expected to be between 0 and 1, which may help to assure a solution with physical meaning can be generated where, once the steering ratio is determined, the toolface can be determined.

Figure 20:
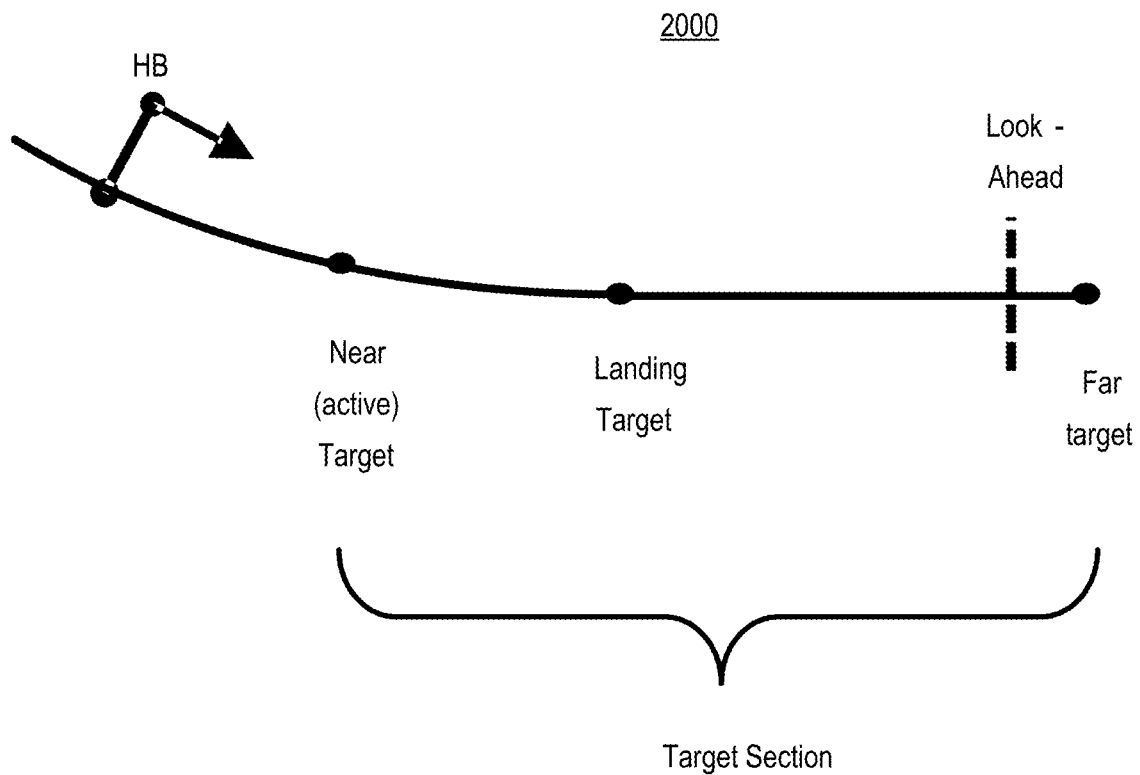
FIG. 20 shows an example of a plot.

FIG. 20 shows an example graphic 2000 that includes a portion of a trajectory along with a HB point where an active target is shown as being prior to a landing target where a far target exists outside of a look-ahead distance. In the example of FIG. 20, a distance is also shown between the HB point and a closest point on the trajectory (e.g., planned trajectory). From the near (active) target to the far target, a target section can be defined. As explained, a method can include determining how to drill from the HB point in a manner that returns to a point on the planned trajectory.

Figure 21:
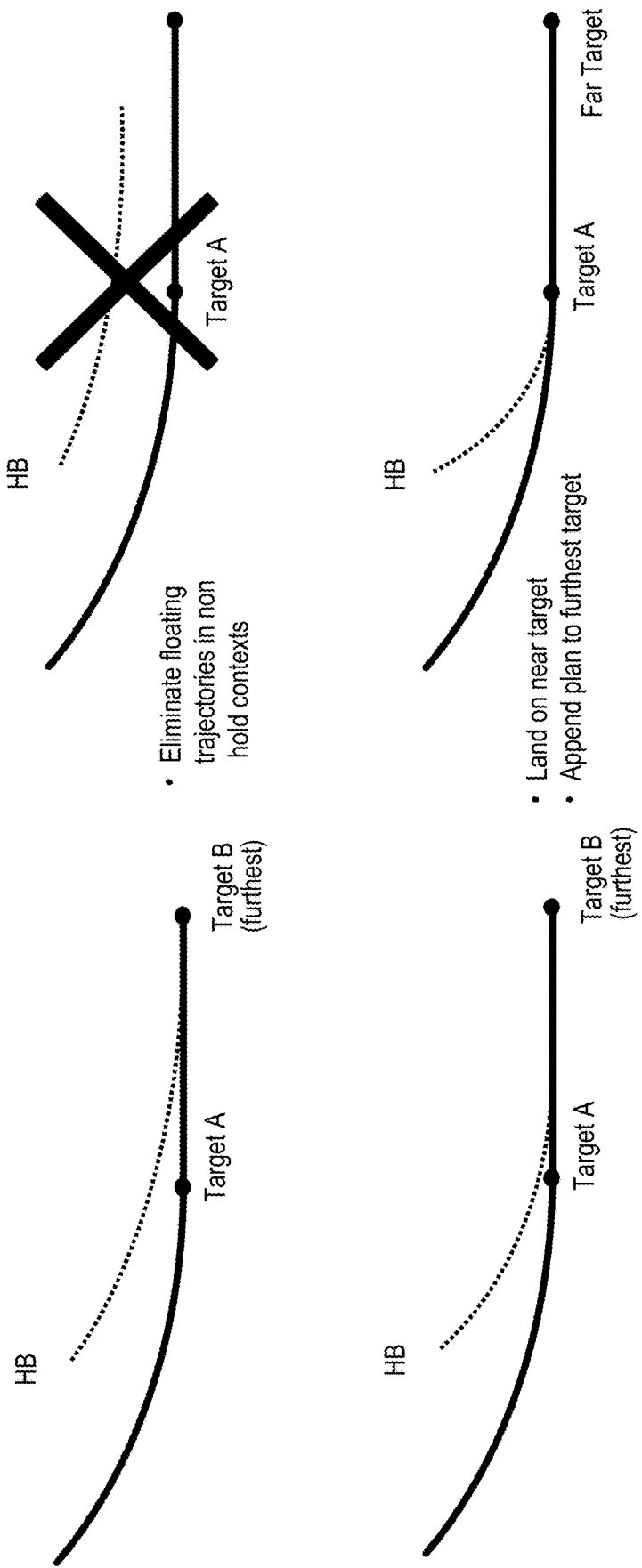
FIG. 21 shows examples of plots.

FIG. 21 shows example graphics 2100 as to various targets where a floating trajectory can be excluded if such an option is generated. In the examples, three of them show how a plan can be adjusted to return to a planned trajectory; whereas, one shows exclusion of a floating trajectory.

Figure 22:
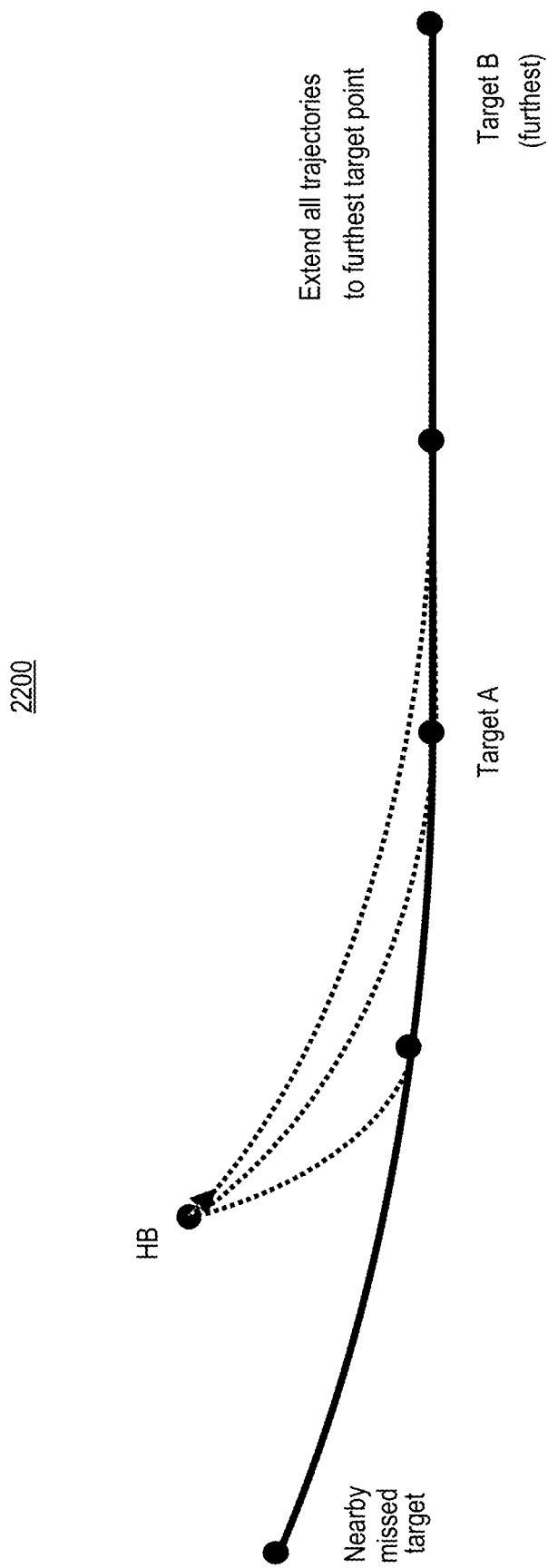
FIG. 22 shows an example of a plot.

FIG. 22 shows an example graphic 2200 of various paths from a HB point to a planned trajectory where a nearby missed point is shown along with a target A and a target B, being further away from the HB point than target A. In such an approach, trajectory candidates can be extended to target B, while one or more of the trajectory candidates may pass through target A. As an example, a method can include adding virtual targets and utilizing one or more solvers that respect both position and orientation. As an example, a method can utilize land-on-line solvers with targets near/in hold contexts. As shown, a method can utilize one or more targets far ahead of a look-ahead distance.

Figure 23:
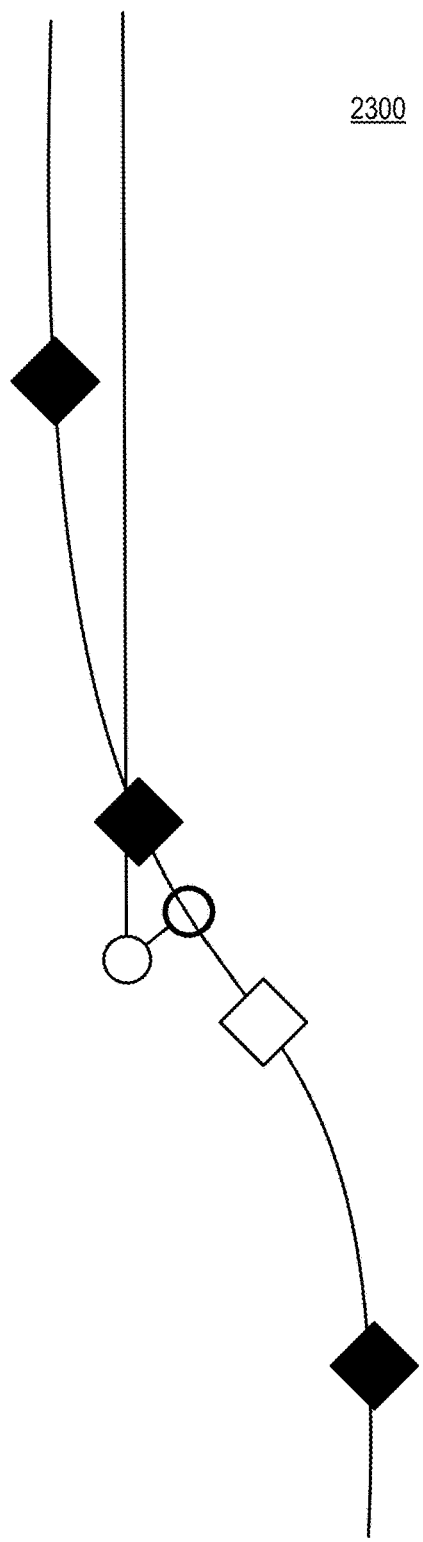
FIG. 23 shows an example of a plot.

FIG. 23 shows an example of a graphic 2300. As explained, an approach may be a single-target approach or a multi-target approach where the single-target approach selects a single active target, for example, as the nearest target in a list that lays ahead of a current HB point. As explained, a multi-target approach may consider conditions/targets past or behind a current target and provide for reliable and consistent handling of section transitions. For example, consider a target section that is a sub-section of a planned trajectory that contains at least one achievable target point. In such an example, a method can include imposing a minimum look-ahead (e.g., minimum target section length) where at least one included and achievable target is at least that distance away. In such an example, the method can include one or more nearby target points that may be behind, or that may be ahead but are not achievable. In such an approach, these target points can be used to define one or more contexts and/or constraints.

As mentioned, a trajectory generator may generate floating trajectories that do not reconnect with a planned trajectory. In various instances, a floating trajectory can fail to convey how return to a plan is possible. To address such scenarios, a method can include selecting a current HB point and an end point and requiring that a trajectory generator generates trajectories that share both points. In such an approach, the trajectories may terminate on common plane when in long hold contexts.

Figure 24:
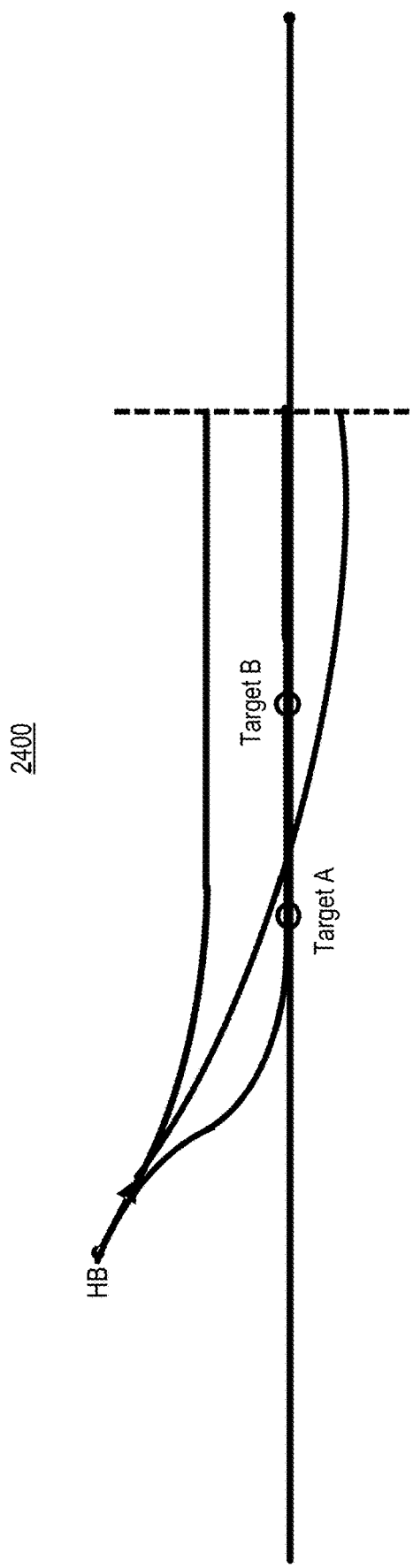
FIG. 24 shows an example of a plot.

FIG. 24 shows an example of a graphic 2400 that provides for defining hold contexts. In hold contexts, and away from transitions, trajectories may have a floating endpoint, but terminate at the same plane. As shown in FIG. 24, the three trajectories terminate at a plane that is beyond the target B where one is above the planned trajectory, one is below the planned trajectory and one is on the planned trajectory.

As explained, in a single-target approach, constraints can be tied to an active target (AT) where, for example, activating a target enables constraints for that target. As an example, a multi-target approach can provide for implementation of constraints that reflect an objective. For example, constraints can be tied to context, which can represent "what is a driller trying to do" by looking at where a HB point is in relation to one or more nearby targets.

Figure 25:
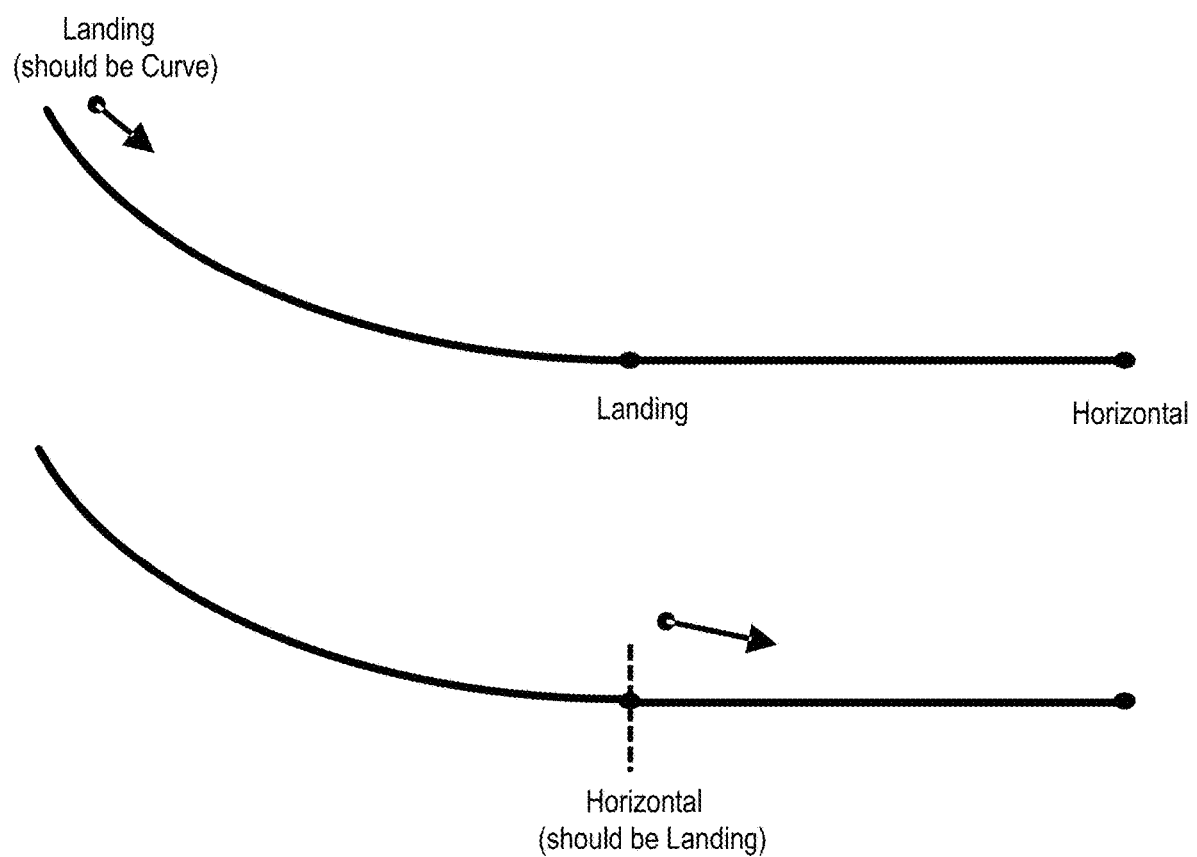
FIG. 25 shows examples of plots.

FIG. 25 shows example graphics 2500 pertaining to context. As explained, context can consider nearby past/future sections, relax an active target from driving context (e.g., arbitrarily near or far), and represent "what is a driller doing" (e.g., landing, returning to plan, etc.). As explained, context can be determined by looking at various target points within a look-ahead target section where, for example, context advancement in transition regions may be driven by constraints. As shown in FIG. 25, one graphic pertains to the context "should be curve" while another graphic pertains to the context "should be landing". Such contexts can inform a multi-target approach to trajectory generation and/or ranking and/or selection.

Figure 26:
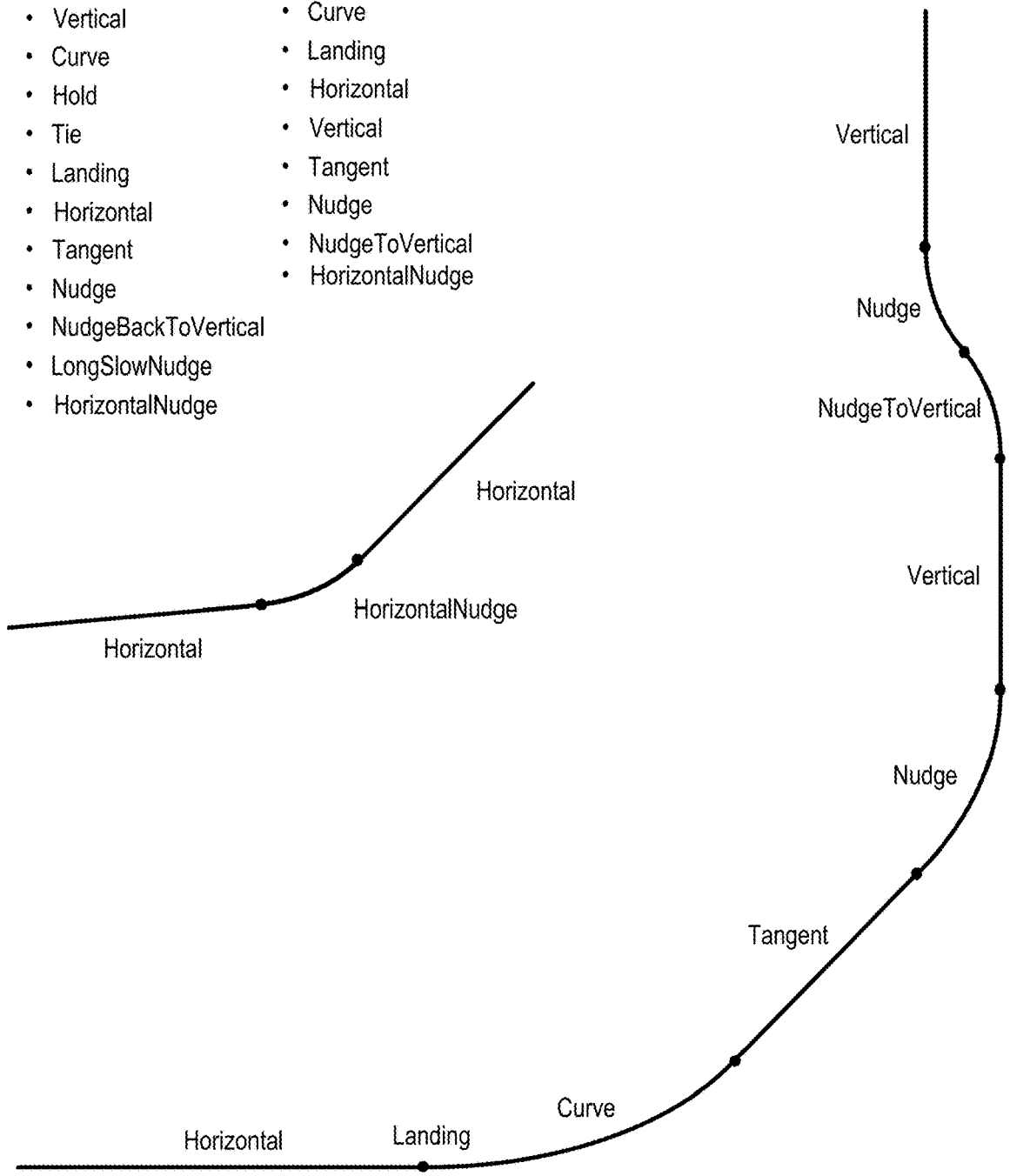
FIG. 26 shows examples of plots.

FIG. 26 shows example graphics 2600 along with various examples of section type and context type. As to section type, consider one or more of unknown, vertical, curve, hold, tie, landing, horizontal, tangent, nudge, nudge back to vertical, long slow nudge, horizontal nudge, etc. As to context type, consider one or more of unknown, curve, landing, horizontal, vertical, tangent, nudge, nudge to vertical, horizontal nudge, etc.

FIG. 27 shows example graphics 2700 of curve to hold scenarios.

FIG. 28 shows example graphics 2800 of end in curve scenarios.

FIG. 29 shows example graphics 2900 of hold-curve-hold scenarios.

Figure 30:
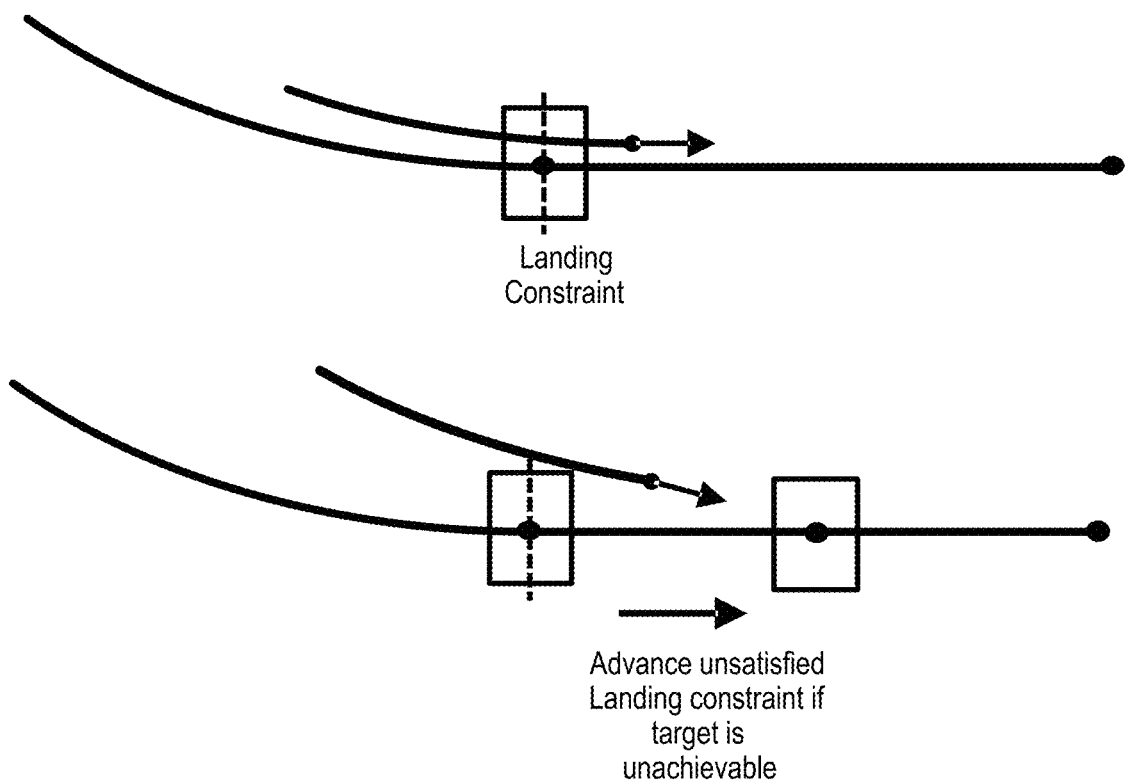
FIG. 30 shows examples of plots.

FIG. 30 shows example graphics 3000 of landing constraint scenarios. In such an approach, a method can include projecting backwards to determine if a landing constraint was satisfied at a landing target. In such an example, if an unsatisfied landing target is unachievable, the landing constraint is advanced to a new landing target further down along the planned trajectory. In such an example, the method can ignore an unsatisfied landing constraint once it passes beyond target section.

Figure 31:
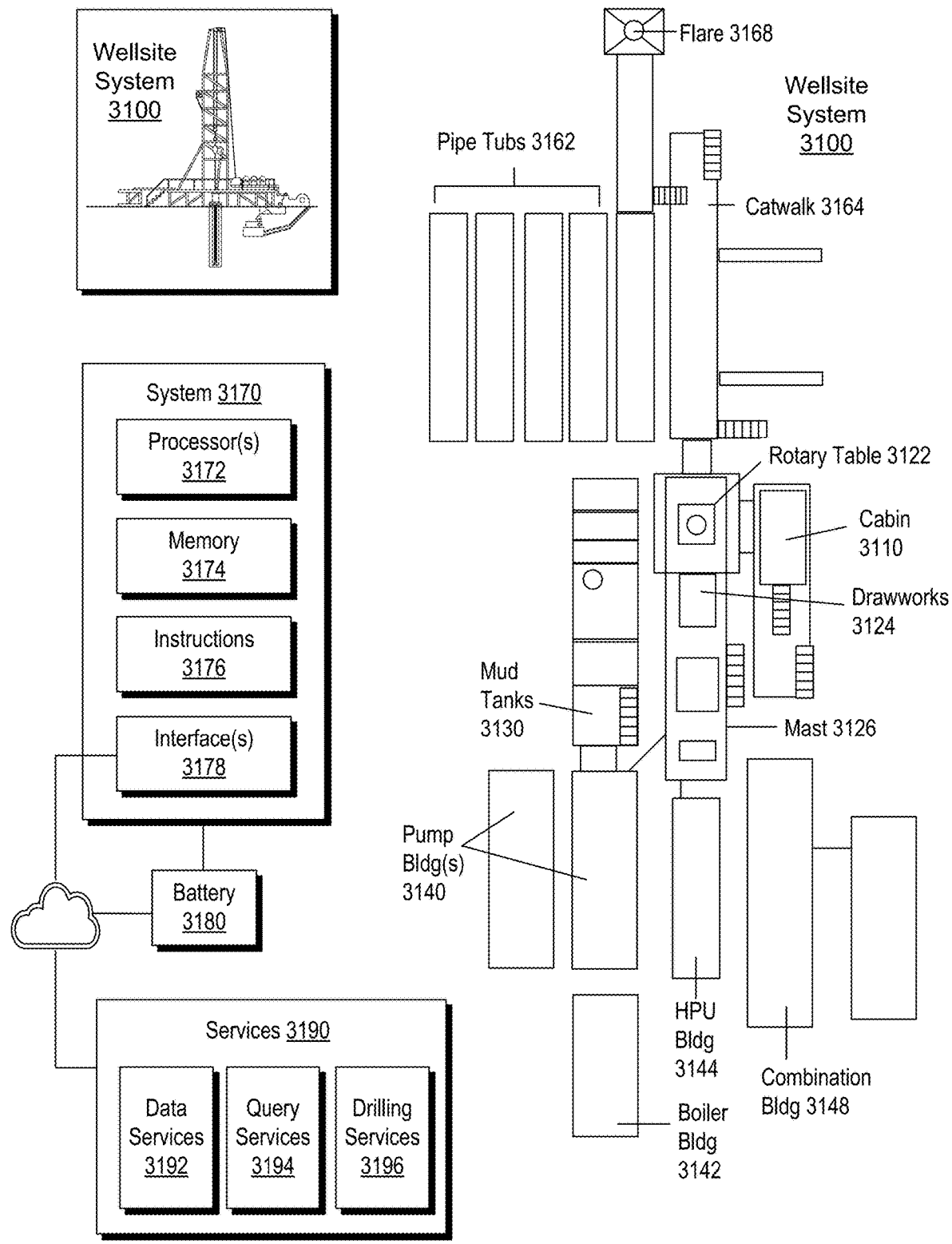
FIG. 31 shows an example of a system.

FIG. 31 shows an example of a wellsite system 3100, specifically, FIG. 31 shows the wellsite system 3100 in an approximate side view and an approximate plan view along with a block diagram of a system 3170.

In the example of FIG. 31, the wellsite system 3100 can include a cabin 3110, a rotary table 3122, drawworks 3124, a mast 3126 (e.g., optionally carrying a top drive, etc.), mud tanks 3130 (e.g., with one or more pumps, one or more shakers, etc.), one or more pump buildings 3140, a boiler building 3142, an HPU building 3144 (e.g., with a rig fuel tank, etc.), a combination building 3148 (e.g., with one or more generators, etc.), pipe tubs 3162, a catwalk 3164, a flare 3168, etc. Such equipment can include one or more associated functions and/or one or more associated operational risks, which may be risks as to time, resources, and/or humans.

As shown in the example of FIG. 31, the wellsite system 3100 can include a system 3170 that includes one or more processors 3172, memory 3174 operatively coupled to at least one of the one or more processors 3172, instructions 3176 that can be, for example, stored in the memory 3174, and one or more interfaces 3178. As an example, the system 3170 can include one or more processor-readable media that include processor-executable instructions executable by at least one of the one or more processors 3172 to cause the system 3170 to control one or more aspects of the wellsite system 3100. In such an example, the memory 3174 can be or include the one or more processor-readable media where the processor-executable instructions can be or include instructions. As an example, a processor-readable medium can be a computer-readable storage medium that is not a signal and that is not a carrier wave.

FIG. 31 also shows a battery 3180 that may be operatively coupled to the system 3170, for example, to power the system 3170. As an example, the battery 3180 may be a back-up battery that operates when another power supply is unavailable for powering the system 3170. As an example, the battery 3180 may be operatively coupled to a network, which may be a cloud network. As an example, the battery

3180 can include smart battery circuitry and may be operatively coupled to one or more pieces of equipment via a SMBus or other type of bus.

In the example of FIG. 31, services 3190 are shown as being available, for example, via a cloud platform. Such services can include data services 3192, query services 3194 and drilling services 3196. As an example, the services 3190 may be part of a system such as the system 1700 of FIG. 17.

As an example, the system 3170 may be utilized to generate one or more rate of penetration drilling parameter values, which may, for example, be utilized to control one or more drilling operations.

Figure 32:
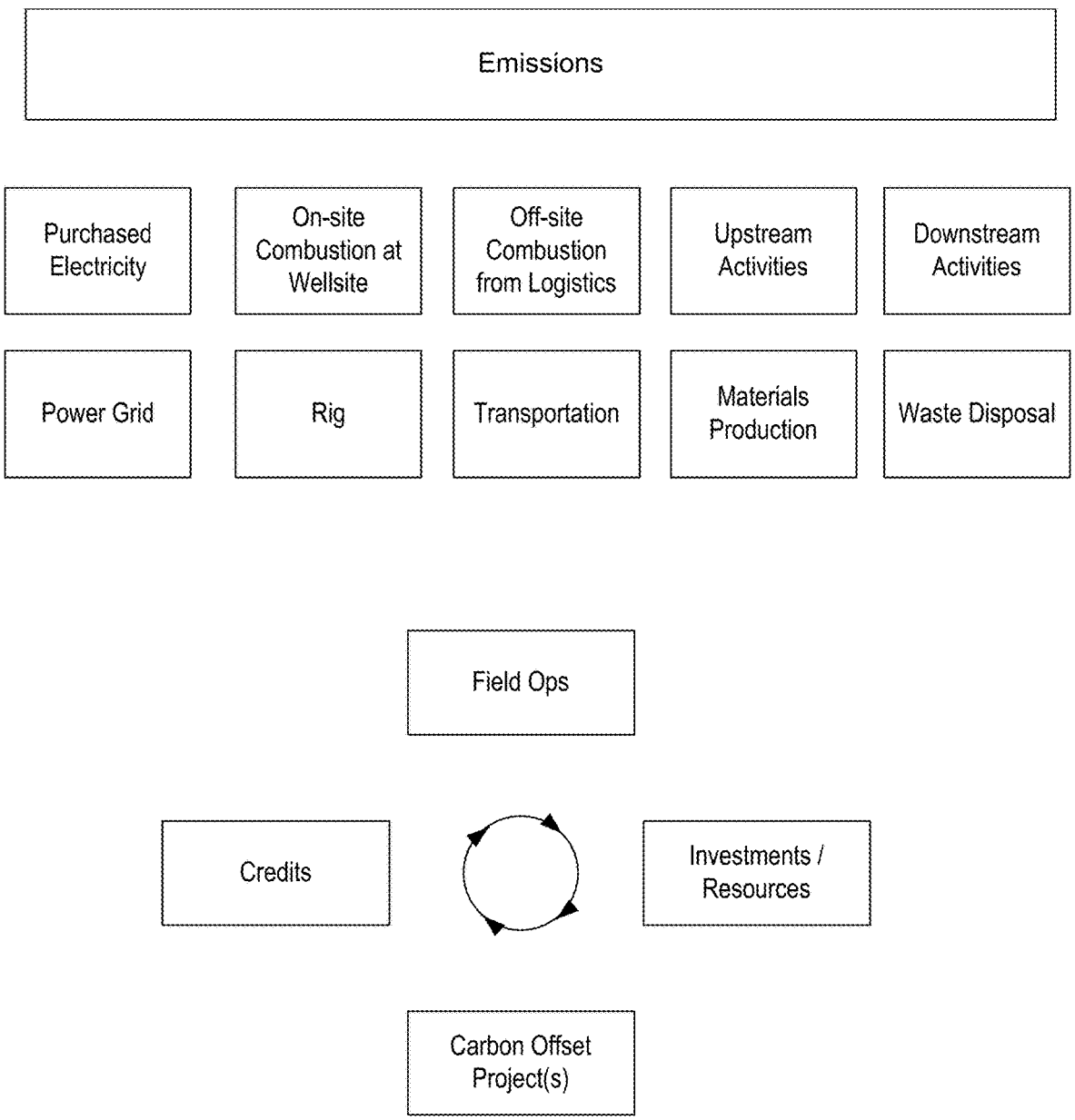
FIG. 32 shows an example of a system.

FIG. 32 shows an example of an emissions framework 3200. As shown, emissions can include considerations as to electricity from a grid (e.g., solar, wind, hydroelectric, biomass, sea motion, power plant, etc.), on site combustion, off site combustion (e.g. logistics, etc.), upstream activities (e.g., production of materials, etc.), downstream activities (e.g., waste disposal, reprocessing, remediation, etc.). FIG. 32 also shows a cycle involving field operations, investments/resources, carbon offset project(s) and credits.

A carbon offset is an investment in an activity that reduces carbon emissions. The reduction in carbon emissions is represented by a carbon credit. The credit, usually verified by a third party, signifies that greenhouse gas emissions are lower than they would have been had no one invested in the offset. One credit equals one metric ton of carbon dioxide prevented from entering the atmosphere. The credit purchaser can use the credit for carbon accounting.

As an example, for field operations in an area with little renewable power, the field operations may be performed in a manner to reduce electricity usage through energy efficiency improvements, which can include optimization of field operations. In such a scenario, a power provider and/or a power consumer may explore providing and/or consuming more "green" power. Where such options may not be readily attainable (e.g., additional green energy sources close to field operations, no plans to build more in the near future, etc.), it may be possible to use offsets to fund projects that reduce greenhouse gas emissions, indirectly reducing a total carbon footprint. For example, if a large farm produces animal waste near a field operation, such as livestock waste for production of methane (a particularly potent greenhouse gas that can be more than 20 times contributing as carbon dioxide), a project that allows the farm to collect waste and produce methane, as a financial sponsor, the field operations entity may receive credit (e.g., for acting in a manner reducing global greenhouse gas emissions. As an example, a credit may be applied to a carbon "footprint" that can offset emissions, for example, from using non-renewable energy.

Figure 33:
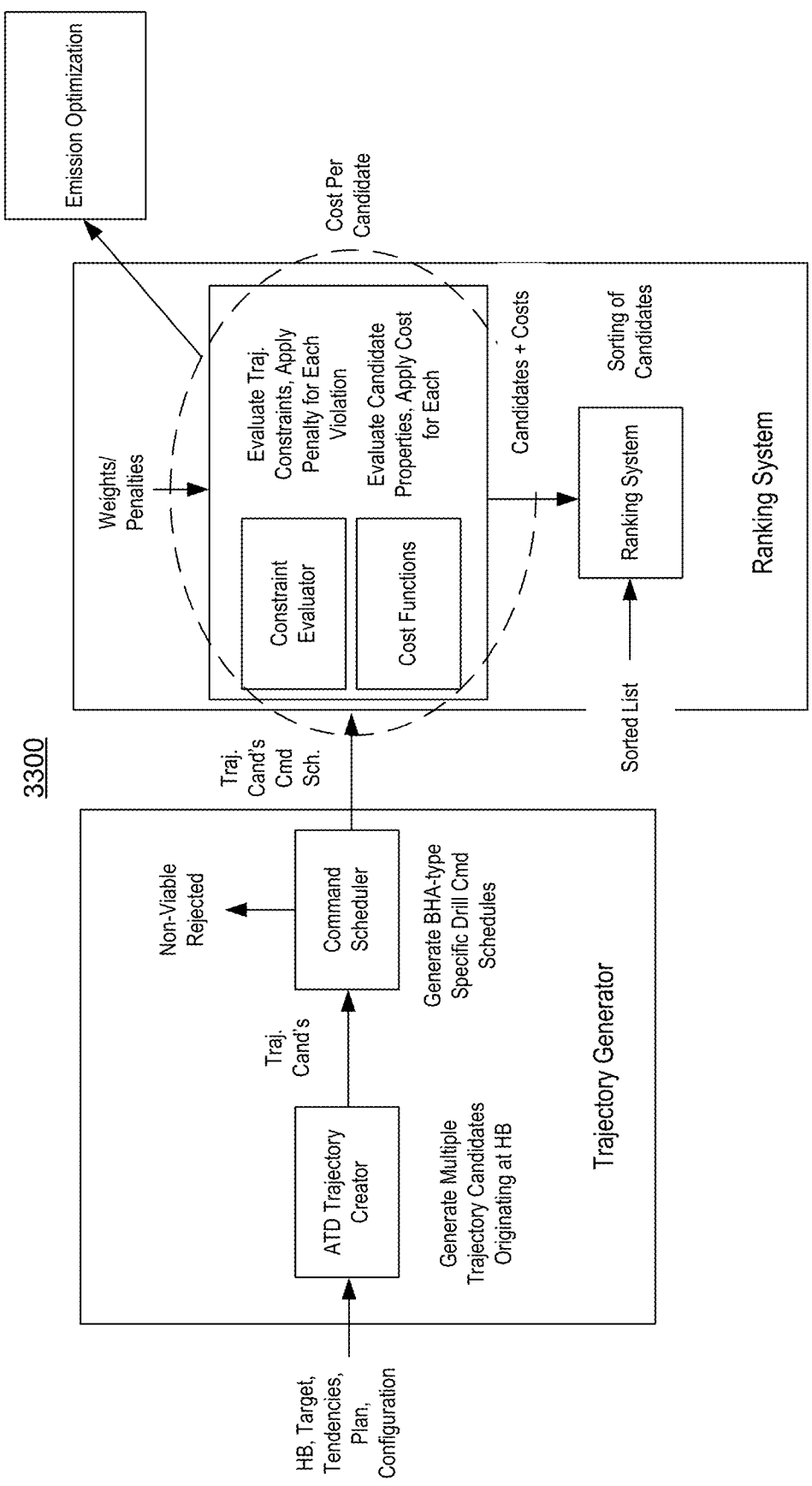
FIG. 33 shows an example of a system.

FIG. 33 shows an example of a system 3300 that includes a trajectory generator and a ranking system (see also FIG. 4 and FIG. 5). As shown, the trajectory generator can include a creator and a scheduler and the ranking system can include a constraint evaluator, a cost function library, a ranking system and one or more optimization features such as, for example, an emissions optimization engine. As shown, factors such as weights/penalties may be applied, cost per candidate computed, evaluation of trajectory candidates, etc. As to an emissions optimization engine, consider an engine that can consider one or more aspects of the framework 3200 of FIG. 32. In such an example, one or more pieces of equipment of the system 3100 of FIG. 31 may be taken into account, along with various actions, materials, etc., associated with such equipment. For example, consider the flare 3168 as burning (combusting) gas that may be produced by a well where one or more trajectories may be rated as to construction thereof with respect to amount of gas generated and amount of gas to be combusted, which may take into account one or more facilities for storage, compression, transport, etc., of generated gas. For example, a LNG tank or LNG pipeline may be available at or near the wellsite system. As an example, a trajectory (e.g., planned operations to construct a well, etc.) may be optimized such that gas produced is effectively accounted for, which may include reduction of demand for flaring, if that may outweigh savings in other aspects (e.g., a saving in mud reprocessing or disposal may offset a reduction in demand for flaring, etc.).

In the example system 3100 of FIG. 31, energy consuming and/or emissions generating equipment can include the rotary table 3122, the drawworks 3124, the pumps 3140, the flare 3168, etc. As an example, transport of pipe, mud, etc., may be taken into account. One or more completions actions may be taken into account as well such as, for example, cementing. Where a well is in an unconventional field, hydraulic fracturing may be performed, which may demand water, sand (e.g., proppant, etc.), chemicals, etc. As an example, a system can account for energy consumption/emissions generation of one or more types of field operations, including materials, materials process, materials disposal, etc. As mentioned, mud may be taken into account as a drilling fluid where a mud may be oil based or water based. In various instances, mud can come into contact with hydrocarbons during drilling activities. Mud may be subject to processing for purposes of disposal, re-use, re-purposing, etc. Where a trajectory (e.g., a candidate) reduces demands for processing, etc., such a trajectory may provide an opportunity to reduce emissions and/or energy use. In various examples, a "systems approach" can be applied where a boundary or boundaries are defined with respect to one or more aspects of field operations.

As an example, a system can provide for automatic, semi-automatic and/or manual selection of aspects to consider when optimizing operations. For example, if a property is selected for consideration and that property does not impact optimization, it may be deemed of lesser concern than one or more other properties. As an example, a scope of a systems approach may be considered to be defined by a number of selectable properties. For example, selectable properties may pertain to flaring, mud, water, sand, chemicals, etc. As an example, an optimization may provide output as to one or more opportunities for utilization of credits, conservation of credits, carbon offsets, etc.

As an example, a method can include deciding when to implement planning, re-planning, etc., which may be during a planning process, during operations, etc. For example, a method can include directional advising as to direction drilling that defines a strategy for returning back to plan and aiming for a planned target(s). Such a method can aim to define a working plan moving forward considering efficiency, performance as well as current context and expectation of future context by analysis of parameters optimization.

As explained, a method can aim to define a tailored workflow for working plan generation based on automatic trajectory generation augmented with a ranking system that can select the best option(s) for a given set up of properties.

As an example, a system such as the system 3300 of FIG. 33 can be extensible with possibly many different properties that may be selectably added, removed, etc., from a ranking system (e.g., using a mathematical description of these properties, etc.).

As an example, a system may be implemented in a real time or near real time manner, for example, during execution of activities in the field and/or may be used for a planning phase to derive a plan that meets desired metrics to deliver a plan during an execution phase.

As explained, a system can include various cost properties and constraints, which may be selectable automatically, semi-automatically and/or manually. For example, consider previously mentions cost properties and additional cost properties such as, for example, carbon emissions, production index (e.g., a metric for hydrocarbon production), and effect on a drilling campaign. As to a drilling campaign, it may involve a field with a number of wells where, for example, some equipment may be utilized at one or more of the wells. For example, consider mobile rigs, wireline trucks, etc.

For a campaign, cost properties may consider factors such as drainage area, number of fractures, number of fracture stages, mobility of water pumps, mobility of sand trucks, etc. As an example, a system may be operatively coupled to a framework that can provide for optimization of well placement such as pad placement. In such an example, a number of pads can be determined where one or more wells may be drilled directionally from each pad. In such an example, each pad may include a number of wells that defines a drainage area. As an example, where fracturing is involved, well trajectories may be planned in a manner with respect to field stress such that fractures are generated in a particular direction. As an example, a campaign approach may aim to assure that fractures from one well do not interfere with another well or fractures from one or more other wells.

As to other campaign concerns, consider how drilling of a well and/or production from a well may impact one or more reservoir properties. For example, consider impact on temperature distribution, pressure distribution (e.g., pore pressure, etc.), permeability, etc. As an example, an assessment may consider formation of emulsions (e.g., microemulsions) due to drilling and/or production from a well. As an example, an assessment may consider one or more enhanced oil recovery (EOR) and/or one or more artificial lift strategies, which may be part of a plan (e.g., in the long-term, etc.). For example, consider a waterflooding strategy, a gas lift strategy, an electric submersible pump (ESP) strategy, etc. Such strategies can be related to changes in a reservoir, for example, where pressure as a driving force diminishes, an artificial lift strategy may be considered, which can have associated cost properties, constraints, etc. (e.g., as to energy utilization, production, etc.).

As to carbon emissions, one or more cost properties may pertain to energy source. For example, where multiple sources exist, such sources may have associated cost properties, which may relate to the underlying process as to how such energy has been generated. For example, consider solar, wind turbine, sea wave, hydroelectric, coal, nuclear, etc. As an example, a facility may consider cost properties as to energy storage, which may be local or remote. For example, consider one or more battery banks that may be available for storage of energy, particularly where energy generation occurs during times of non-utilization or low utilization. In such an example, a more steady supply may be provided to a field site such that peaks and valleys are reduced or minimized. For example, consider a local battery storage facility that can store energy (e.g., from local and/or remote sources) and supply energy to equipment to perform field operations (e.g., drilling, etc.).

As to constraints, as an example, a constraint or constraints may be specified as to emissions, for example, to limit emissions, limit use of credits, etc. As an example, a constraint may be placed on mud, for example, as to a limit of hydrocarbon contamination that may make re-use of the mud problematic, particularly for a campaign. For example, where a campaign involves drilling of multiple wells, environmental savings may be had by re-use of mud. However, if such mud accumulates too much oil during drilling of a well or wells, it may be unsuitable for use in drilling a subsequent well (e.g., without processing to remove oil, etc.). As an example, constraints may aim to balance re-use and disposal along with a possibility of processing for purposes of re-use and/or disposal. As an example, cost properties may be assigned to mud, mud processing, mud disposal, etc.

As an example, one or more frameworks may be utilized where various cost properties and/or constraints are considered. For example, for hydraulic fracturing, consider the VISAGE framework, the MANGROVE framework, etc. As to waterflooding, consider a reservoir simulator (e.g., ECLIPSE, INTERSECT, etc.). As to flaring of gas, consider one or more combustion simulators. As to processing and/or disposal of mud, consider one or more mud process simulators, etc.

As an example, where modeling, simulation, etc., are integrated into a workflow, such activities may be performed for a selected number of candidates. For example, consider a top 5 or a top 3 candidates as being selected for evaluation, further optimization, etc., which may call on one or more types of frameworks (e.g., simulators, etc.).

As an example, one or more frameworks that can aid in reducing energy consumption during operations may be utilized. In various instances, oil and gas extraction activities can create about 10 percent of current total E&P-related emissions. Such emissions primarily consist of $CO_2$ generated by fuel combustion to power rigs and other related infrastructure.

As an example, a system may consider onshore and/or offshore capabilities. For example, for offshore, an electrification project may be implemented; whereas, for mobile rigs, some challenges may exist to electrification as units may be moved on a regular basis and demand their own mobile source of power.

As explained, a system that can generate trajectories with associated actions can provide an opportunity to reduce $CO_2$ emissions, for example, by improving operational efficiency. As explained, in addition to operational efficiency, source of energy or sources of energy may be considered. As an example, a system may operate on a component or project basis, which may result in reduced rig time, reduced transportation requirements, and improved fuel efficiency of generating systems that supply power to the rig and other infrastructure.

As an example, emissions associated with drilling projects may be reduced by using fluid technologies that have less $CO_2$ embedded during their manufacturing process compared with traditional materials.

As an example, a system may provide for access to a portfolio of data for so-called transition technologies, which may include drilling-efficiency enablers, cements, frac fluids with a low $CO_2$ footprint, and power management systems that aim to maximize rig generator efficiency. As an example, a system may aim to reduce an emissions footprint while maximizing the value of field operations.

As an example, a system may implement an intelligent power management framework, which can be a predictive power management system that reduces emissions, fuel consumption, and engine run time on a rig through a combination of automated software, energy storage system, and hydrogen. For example, a system may provide for selection of such a framework where the framework can be expected to manage operations in an energy efficient manner in real time at a rig site. For example, consider an automated framework that controls rig engines, an energy storage system, and a hydrogen system to work in conjunction to produce the desired outcome of reduced emissions, reduced fuel consumption, and reduced engine hours and wear or a combination thereof.

As an example, an automated engine framework can include an adaptive start and stop feature based on one or more factors such as, for example, rig-generator load, which may provide for optimizing engine performance to reduce fuel consumption and emissions. As an example, a framework can utilize look-ahead information, which may be in the form of a trajectory with associated activity information, downhole data, and/or surface data. In such an example, such information may be used to predict future power demand of a rig. As an example, when power demand is low, an intelligent power management framework can divert excess energy to a battery system. And, when a rig demands more power, it can draw from the battery reserve rather than revving up the generator. Such an approach may aim to provide a more consistent, optimal load on an engine or engines.

As an example, an intelligent power management framework can provide for tailoring to one or more objectives, which may be based on equipment type, available energy, field campaign, etc. Such an approach may aim to provide for fuel efficiency, emissions, and engine life optimization.

Figure 34:
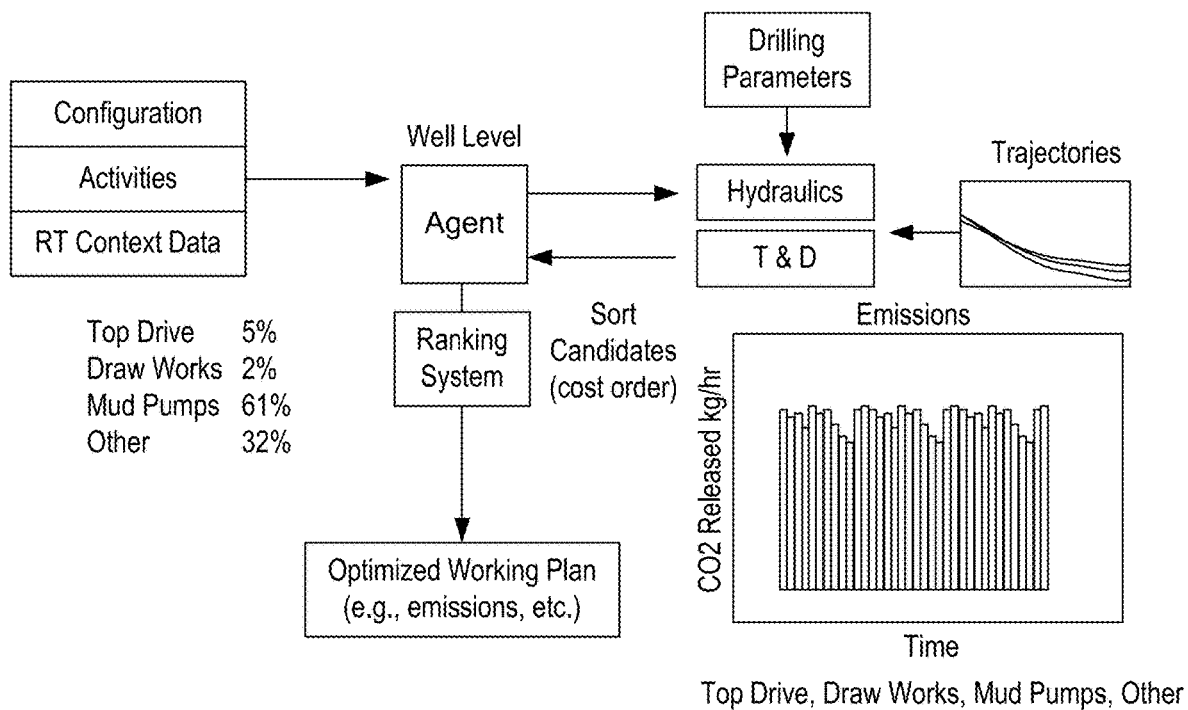
FIG. 34 shows an example of a system.

FIG. 34 shows an example of a system 3400 where an agent can operate in combination with one or more frameworks. For example, consider a framework that can generate top trajectory candidates (e.g., a ranked list of candidates, etc.), a framework that can perform hydraulics computations (e.g., simulations, etc.), a framework that can perform torque and drag computations (e.g., simulations, etc.), etc. As shown, the agent can be coupled to a ranking system that can provide for output of ranked candidates as processed and/or assessed by the agent. For example, the agent may receive configuration information, activity information and real time contextual information along with framework information for trajectories. As an example, the system 3400 may process trajectories one at a time or may operate in parallel. As explained, ranking may occur at one or more points within a system. As an example, the agent may output information as to emissions for various activities associated with a trajectory such that the trajectory can be assessed with respect to one or more other trajectories. As shown, an optimized working plan may be output that is optimized with respect to at least emissions (e.g., per implementation of the agent, etc.).

In the example of FIG. 34, a graphic is shown, which may be part of a graphical user interface (GUI) that can be rendered to a display. As shown, the graph can include information as to CO2 released by various activities, which can include top drive (e.g., or rotary table), drawworks (or draw works), mud pumps, and other ("hotel", etc.). As shown in an example table, energy may be split into groups such as rotational power, hydraulic power and hoisting power. As shown, rotational power can consider torque and RPM, hydraulic power can consider pump pressure and flow rate, and hoisting power can consider hook load and tripping speed. As explained with respect to the system 3100 of FIG. 31, a wellsite can include various types of equipment that can perform various functions where each may be categorized appropriately. As explained, other activities can include flaring, gas production, gas re-use (e.g., for artificial lift), gas generated power, etc.

FIG. 35 shows some examples of equations 3500 that may be utilized by an agent (or agents) such as the agent in the system 3400 of FIG. 34. As shown, energy for drill to depth may be determined using various parameters (e.g., standpipe pressure (SPP) and flow rate (Q)), where energy can depend on measured depth (MD), flow rate, rate of penetration (ROP or Rop), RPM (or Rpm), density, etc. As shown, integration may be performed with respect to time for increases in measured depth. As to trip out energy, consider hook load (HL), BHA, density, dog leg severity (DLS), etc., which may be integrated with respect to time. As to mechanical energy, consider utilization of RPM and torque as may be integrated with respect to time as measured depth is increased (e.g., during drilling, etc.).

As explained, a trajectory may be a candidate that can be assessed using one or more frameworks and an agent or agents. In such an approach, the candidate can be compared to one or more other candidates where an optimal candidate may be selected for field implementation. As explained, a system may provide for field operation optimizations during execution. For example, real time data may be received, which may optionally provide for re-planning, if appropriate. As explained, a real time energy optimization type of framework may be implemented, which may be specified according to a selected trajectory (candidate) for implementation.

Figure 36:
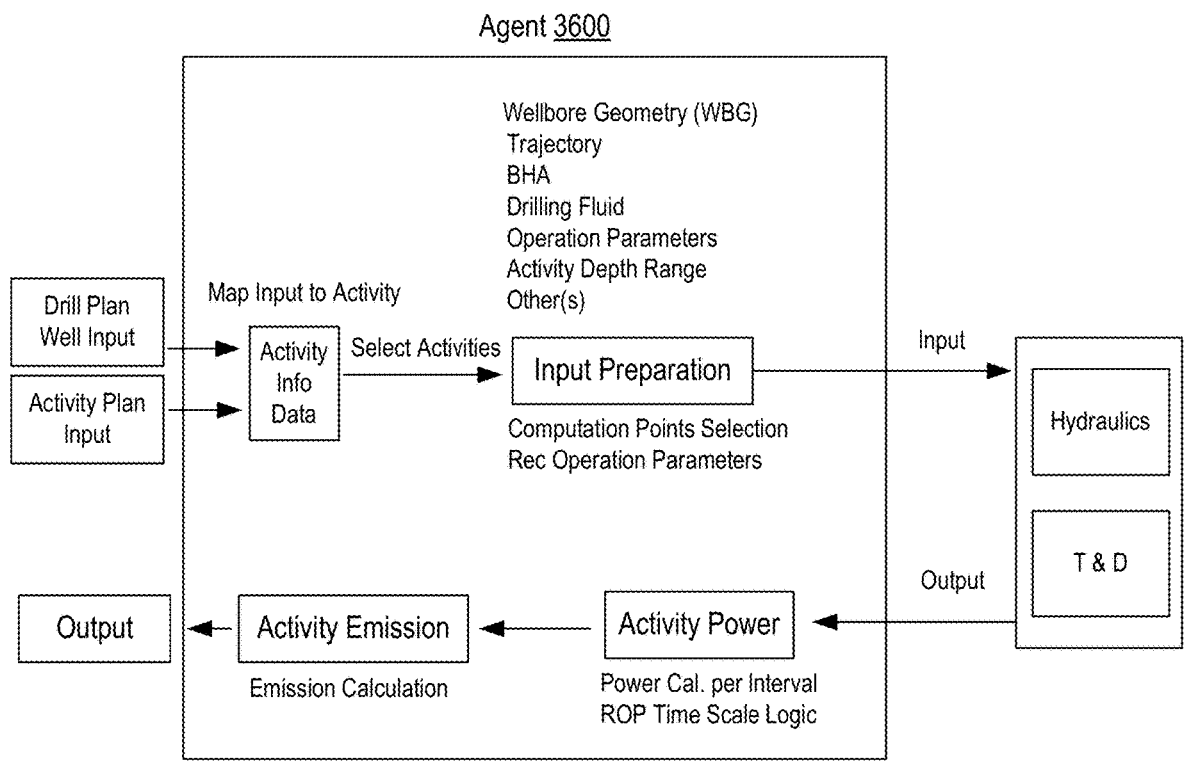
FIG. 36 shows an example of an agent.

FIG. 36 shows an example of an agent 3600, which includes various components such as an input component for mapping input to activity, a selection component, an input preparation component, an activity power component and an activity emission component. As shown, the agent 3600 can be operatively coupled to one or more frameworks such as, for example, a hydraulics framework and a torque and drag framework. The agent 3600 can receive input from a drill plan for a well and/or an activity plan (e.g., noting that a candidate may include drill plan and activity plan information). As shown, the agent 3600 can output information as to emissions and/or energy utilization. As an example, such an agent may be suitable for handling one or more aspects of energy, emissions, etc., and may, for example, utilize one or more types of equations such as one or more of the equations as shown in FIG. 35. As explained, aspects such as source of energy, flaring, mud, water, sand, production index, campaign, etc., may be considered. An agent such as the agent 3600 may provide for options as to various components, materials, sources, etc., and may be extensible to link to one or more frameworks that can provide for input for making energy and/or emissions assessments; noting that the hydraulics and torque and drag frameworks are provided as some of various examples of frameworks that may be utilized.

As explained, a system may aim to augment a ranking system that can provide for selection of the best option(s) for a given set up of properties with additional properties taking into account both sustainability and the effect on the reservoir development.

Some example properties can include: carbon emission for each trajectory/option, production index for each option, effect on drilling campaign, effect on future field development, effect on sustainability for an entire project, etc.

In terms of constraints, consider one or more examples such as: limit of carbon emissions not to be exceeded, limit areas for the purpose of reservoir field development, etc.

As an example, a method can include generating a working plan while performing directional advising; generating trajectory options; ranking different trajectory based on system or user set up; recommending different trajectory options; applying selectable properties to a ranking system for tailored applications; taking into account carbon emission during WPG; taking into account production index during WPG; taking into account the effect on the drilling campaign during WPG; linking with a drill planning engine to generate optimized planned trajectory; linking with a drill planning engine to initialize properties and constraints of a WPG system; etc.

FIG. 37 shows examples of graphical user interfaces (GUIs) 3710 and 3720 of a framework that can provide for power management. As explained, a system may provide for an assessment option that can call for implementation of one or more features of a power management framework. As shown, a framework may provide for consideration of energy, power utilization, emissions, etc. In the example of FIG. 37, the GUI 3720 can be a dashboard for power required and energy storage where, for example, an indicator can be used as battery reserve(s). As shown, power required may be rendered with respect to a plot, which may show one or more operations that utilize power and may, for example, show estimated power requirements for future operations (e.g., according to a plan, etc.). As indicated, a power demand with look-ahead may be implemented, for example, using a predictive trained machine learning model.

Figure 38:
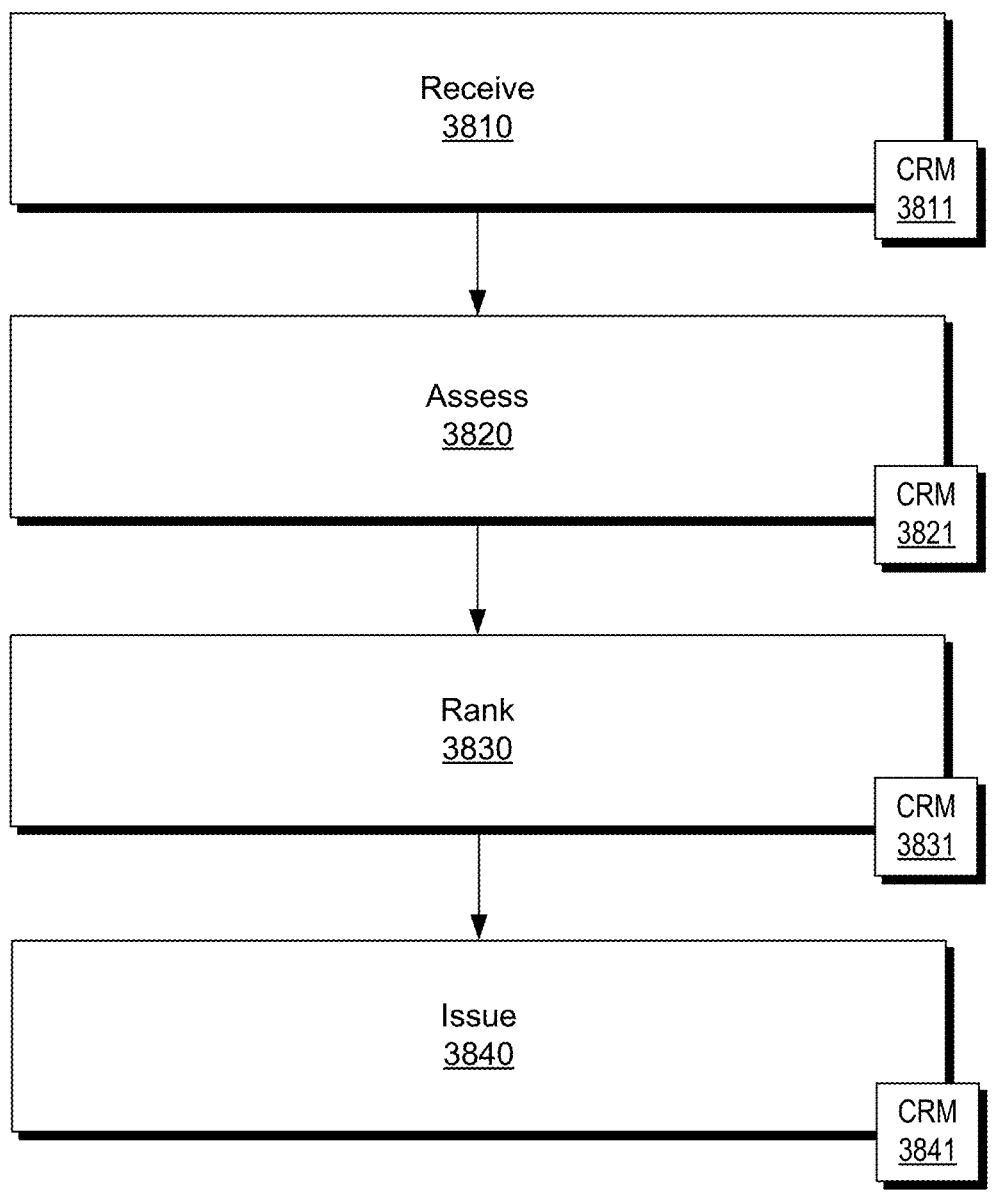
FIG. 38 shows an example of a method.

FIG. 38 shows an example of a method 3800 that can include a reception block 3810 for receiving a candidate for a trajectory and associated activities for a well; an assessment block 3820 for assessing emissions for the candidate; and a ranking block 3830 for ranking the candidate with respect to at least one other candidate. Such a method can include issuing one or more control actions with respect to one or more of the ranked candidates 3840.

As shown in FIG. 38, the method 3800 may be implemented via one or more computer-readable media (CRM) per blocks 3811, 3821, 3831 and 3841, which may, for example, be implemented using a system such as a computing system (see, e.g., the example system 300 of FIG. 3, the example system 3170 of FIG. 31, etc.). Such blocks can include processor-executable instructions.

As an example, a method can include receiving a candidate for a trajectory and associated activities for a well; assessing emissions for the candidate; and ranking the candidate with respect to at least one other candidate. In such an example, the assessing can include accessing one or more frameworks for determining energy demands for one or more of the associated activities. For example, consider the assessing emissions depending on the determined energy demands.

As an example, a method can include assessing emissions for one or more members selected from a group of rotational energy, hydraulic energy and hoisting energy.

As an example, a method can include ranking via assessing a source of energy. For example, consider the source of energy as being a source selected from a renewable source of energy and a non-renewable source of energy.

As an example, ranking can include assessing availability of carbon credits. As an example, ranking can include assessing availability of one or more carbon offset opportunities.

As an example, assessing can include assessing emissions as to drilling fluid. For example, consider assessing drilling fluid that includes assessing re-use of and/or disposal of drilling fluid.

As an example, assessing can include assessing flaring demand for gas produce by the well. In such an example, efficiency of flaring may be considered and/or storage and/or transport of gas.

As an example, a method can include selecting factors as cost properties or as constraints. For example, consider a production index cost property, a field campaign cost property, a carbon emissions cost property, etc. As an example, a constraint can include a carbon emissions limit.

As an example, a method can include implementing an agent. For example, consider an agent that includes an activity power component and an activity emissions component. In such an example, an activity power component may account for generation of gas such as gas that may be flared, stored, etc. As an example, an activity power component may account for one or more battery related activities.

As an example, a system can include one or more processors; memory accessible to at least one of the one or more processors; processor-executable instructions stored in the memory and executable to instruct the system to: receive a candidate for a trajectory and associated activities for a well; assess emissions for the candidate; and rank the candidate with respect to at least one other candidate.

As an example, one or more computer-readable storage media can include processor-executable instructions to instruct a computing system to: receive a candidate for a trajectory and associated activities for a well; assess emissions for the candidate; and rank the candidate with respect to at least one other candidate. As an example, a computer-program product may be provided as a non-transitory, physical medium that is not a carrier wave that includes instructions executable by one or more processors.

FIG. 39 shows an example of a graphical user interface (GUI) 3900 that includes various interactive graphical controls for adjusting weights, penalties, etc., with respect to candidates where, for example, a table of candidate related information can be rendered for various parameters, costs, etc. In such an example, a user may interact with the GUI 3900 to cause updates to candidates and related information (e.g., per a recalculation button, etc.). As an example, the GUI 3900 may include features for rendering trajectories, for example, as in the example of FIG. 16. As an example, the plot 1600 may be interactive with the GUI 3900 such that a selection on the plot 1600 can cause highlighting and/or rendering of information such as in a table form. As an example, the GUI 3900 can include one or more energy related weights, penalties, etc. For example, consider power utilization, emissions, etc., as being considered by a trajectory generator and/or a ranking system (e.g., as part of a WPG, etc.).

Figure 40:
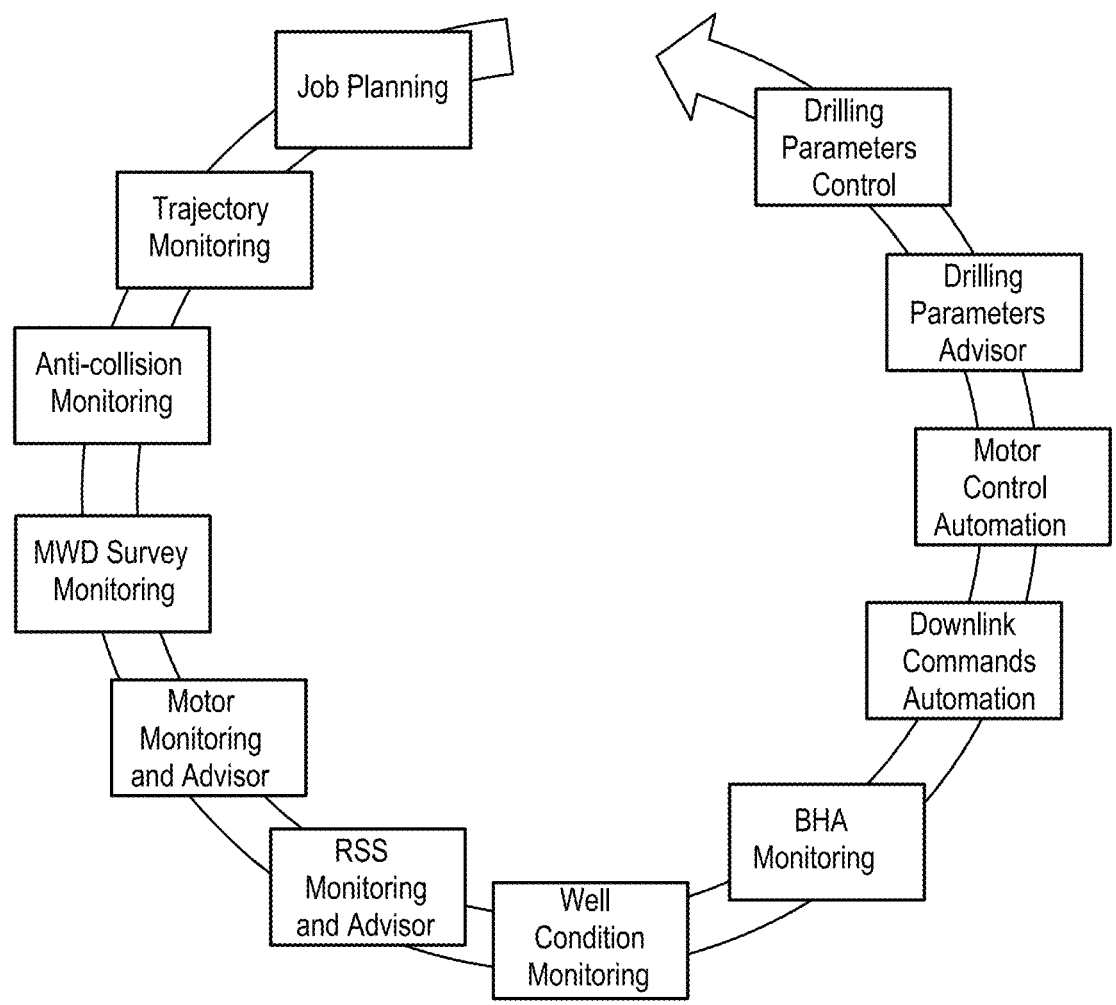
FIG. 40 shows an example of a method.

FIG. 40 shows an example of a method 4000 that may be implemented, for example, by an autonomous directional drilling planning and execution framework. As explained, directional drilling can be a mix between science and art performed by experts in the field. As an example, an autonomous directional drilling framework can combine planning and execution to achieve consistent performant directional drilling operations accessible for easy remote operations. Such a framework can combine planning and execution of autonomous decision making along with options for monitoring at a rig site or remote from a rig site.

Such an approach can include receiving downhole data, which may be real-time data (see, e.g., the system 1700 of FIG. 17).

As an example, a framework can deliver a plan and provide information as to learnings that took place via offset analysis, including trajectory optimization models, machine learning models to derive steering tendencies, and risks, along with the specificities and efficiencies analysis of the BHA. As an example, a framework can include execution components that provide for autonomous decision making. In such an approach, the framework can interact with one or more planning components during execution. In such an example, interactions can be with a user from the rig or in town, surface automation equipment, a driller, and/or downhole tools via telemetry uplink and downlink. An execution workflow can combine data analytics, physics-based simulation, and offset analysis to achieve more consistent directional drilling performance.

As an example, a framework can provide for self-driving a BHA for directional drilling operations. As an example, a method can include automatic evaluation of a current bit position (e.g., current hole bottom (HB)) with respect to an initial generated plan (e.g., or revised plan, etc.). As an example, a framework can provide for automatic evaluation of maximum dogleg capability of a BHA and capability to examine health of the BHA and automatic derivation of an optimized working plan (e.g., automated WPG, etc.). Such an approach can facilitate getting to a desired target location rapidly with a minimized risk of failure. As an example, a framework can perform actions on a system level with interdependencies between the different components considered.

As an example, a framework can provide for autonomous directional drilling that enables benefits such as consistent performance with improved cost per foot, reduced HSE risks, and leveraged expertise via remote operations. Such an approach can enable efficient, fast, and controlled directional drilling without compromising durability or reliability of the equipment.

As explained, directional drilling that, due to the advanced complexity of the wells being drilled today, poses greater risk and reward scenarios for proper planning and execution. Yet, as explained, directional drilling may still be considered to be a mix between science and art (e.g., as performed by experts in the field).

As an example, a framework can implement techniques for planning and execution. Such techniques may include autonomous decision making, machine control via the surface automation, advanced monitoring tools for users either on the rig or in town, and downhole intelligence.

As the energy market evolves, participants in the drilling domain are insisting that wells be drilled faster and with a reduced operations cost and footprint, while assuring quality wellbores to reduce complications during casing and completion phases. In general, it is desired that the overall time to construct a well be decreased while wells become drilled with more consistency.

As an example, a framework can utilize digital technologies such as digital communications and interconnectivity, real-time data management, data analytics, smart sensors, automation, machine learning, cloud computing and availability of compute power on the edge. As an example, a framework may rely on a digital ecosystem, spanning physically from one or more wellsites to one or more remote operations offices. In such an example, the framework may cover end-to-end well construction processes from planning to execution, while achieving a range of objectives. As explained, an ecosystem may be instrumented, automated, connected and integrated. Data generated may be recorded, curated and analyzed in order to draw correlations quickly and learn new process adjustments in a continuous way.

Autonomous directional drilling capabilities aims at achieving more consistent results, in terms of well trajectory quality, reduction of tortuosity, optimization of time to reach the target and achieving a competent wellbore. By enabling remote monitoring and control workflows, demand for onsite personnel is reduced, which reduces their exposure to risk zones and simplifies logistics. In an office environment, experienced staff can supervise a wider range of operations and consult with experts, providing assistance to less experienced employees and helping them make safe decisions. As an example, a framework can operate to provide an overall reduction in the carbon footprint while promoting sustainability in the well construction.

Figure 41:
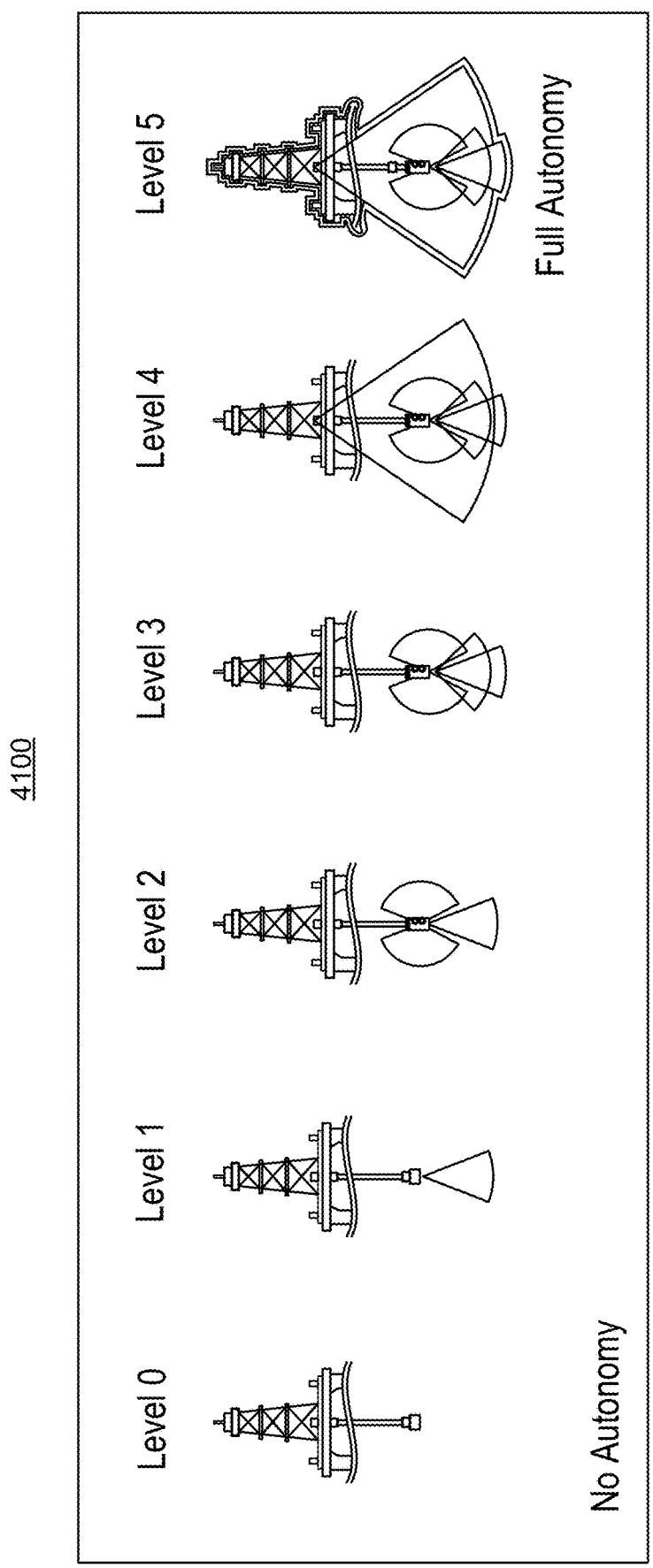
FIG. 41 shows an example of a system.

FIG. 41 shows an example of a system 4100 with various examples or levels of autonomy as to a BHA, which can be, at level 5, a fully autonomous self-steering BHA. By leveraging a digital ecosystem, autonomous capabilities may be structured in 6 levels (0 to 5) to help contextualize building blocks and related functionalities. Throughout these levels there is a differentiation between automation and autonomous capabilities, whereby the latter can be defined by intelligence, complexity and decision-making ability.

In the example of FIG. 41, the first three levels, 0 through 2, highlight capabilities driven by monitoring, assisting, and singular automation features for directional drilling workflows. Such features may include, for example, trajectory monitoring, projections, and downhole singular-automation algorithms such as inclination hold.

In the example of FIG. 41, at level 3, a framework may combine multiple support features and unify them with an intelligent system supporting analytical decision making with the physical automation of the steering process. At level 3, a system can possess complete awareness of a directional drilling workflow and help manage decisions. At level 4, a framework can provide multidisciplinary well-construction workflows with rig automation in harmony within an on-target well delivery solution. For example, consider an automated directional driller (ADD) framework that is natively embedded inside a rig automation system. At level 5, a framework may utilize subsurface formation evaluation data (e.g., LWD data, etc.) to impact geo-steering and place wells in real time. At level 5, a BHA can be completely autonomous.

Figure 42:
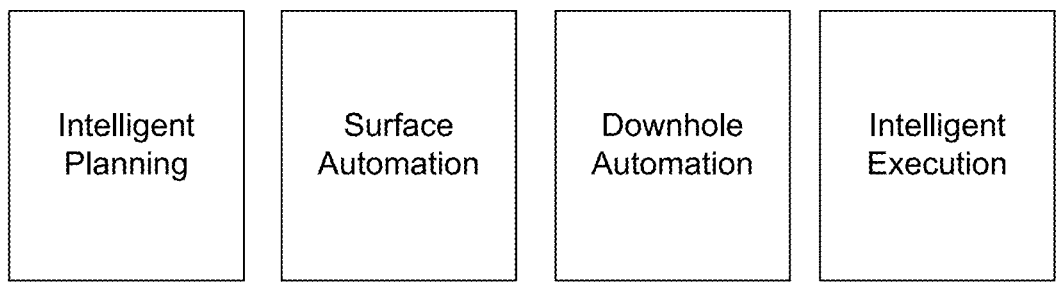
FIG. 42 shows an example of a framework.

FIG. 42 shows an example of framework components 4200, which include intelligent planning and intelligent execution capabilities along with surface automation components that may be used to complement a suite of downhole automation features in steering tools and in a BHA. As explained, a framework can include plan generation features, which include trajectory generation features where, for example, a BHA may be controlled in a manner that utilizes a single-target or a multi-target approach. In such an example, one or more environmental and/or energy related parameters can be taken into account, for example, to perform directional drilling using the BHA in an optimal manner.

As an example, an integrated data architecture may unify such components and provide cohesion across various workflows. As an example, starting in a planning phase, associated digital data may be passed onto an intelligent execution component to drive the surface automation and the downhole automation components. As an example, once an execution phase is completed, an approach may leverage data streams to close a feedback loop that can drive further refinements of one or more machine learning (ML) models in an intelligent planning phase to start a cycle, repeat a cycle, etc. As an example, the framework components 4200 can be extensible such that they may evolve with technology and progress towards higher levels of autonomy with improved confidence (e.g., lesser demands for oversight, lesser risks, etc.).

As an example, a framework can include an intelligent execution component that interacts with other components and manages information sharing between them.

Figure 43:
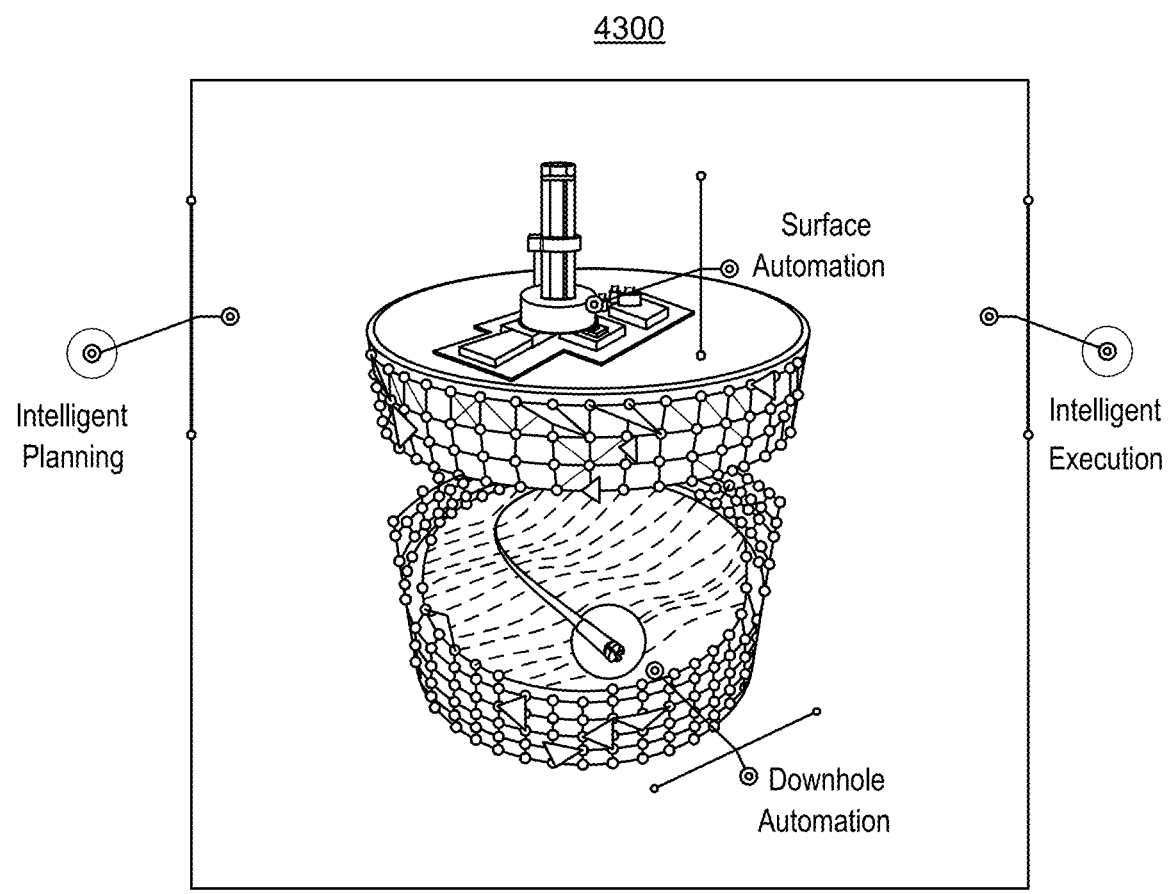
FIG. 43 shows an example of a graphical user interface.

FIG. 43 shows an example of graphical user interface (GUI) 4300 for a scenario where the framework 4200 of FIG. 42 can provide for intelligent planning, intelligent execution, surface automation and downhole automation. In the example scenario, a BHA may be operated at one or more levels of automation where, for example, level switching may occur, optionally automatically. For example, consider an automated WPG that can generate, rank and select a trajectory, which may be for a current HB point. In such an example, the WPG trajectory may be assessed with respect to levels of automation, for example, using one or more limits of BHA capabilities, formation characteristics, etc., where an appropriate level of automation can be selected and implemented.

As an example, in a pre-job planning stage, an understanding of steering performance of a tool may be a factor. In such an example, a model may be used to predict BHA directional tendency in the place of, or in collaboration with, one or more physics-based models. For example, a physics-based model may be based on the finite element method and a detailed representation of steering mechanisms (e.g., push or point the bit), which allows for calculation of BHA deformation, forces and displacements. Such a model propagates a wellbore iteratively to get a transient well propagation behavior, as well as a terminal DLS of a propagated hole. While physics models can provide quite accurate tendency predictions, predictions as to tendency behaviors can be improved using historical data. For example, consider using such historical data for training and/or re-training one or more ML models, which, as mentioned, may be utilized in combination with one or more physics based models. As an example, a predictor or predictive model can be a hybrid model that combines machine learning techniques and physics techniques. As an example, a hybrid machine learning strategy may be utilized that combines historical data with one or more physics based models (e.g., taking advantage of machine learning capabilities and synergies with domain knowledge).

Figure 44:
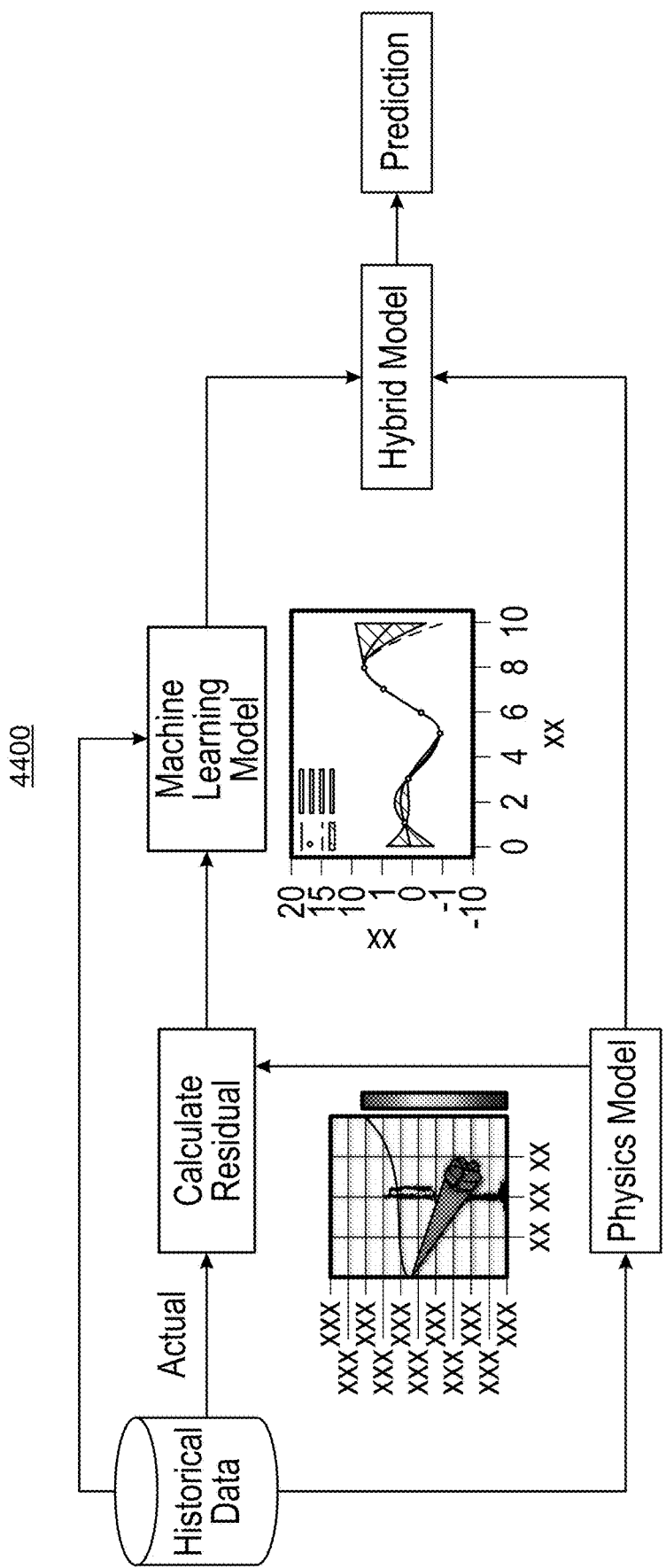
FIG. 44 shows an example of a system.

FIG. 44 shows an example of a system 4400 for generation of a hybrid model that can make predictions. In such an example, predictions can be based on data received during planning and/or data received in real-time during plan execution. In the example of FIG. 44, the physics model (e.g., physics based model) can be utilized to generate residuals, for example, with respect to historical data. A residual may be considered an error as to real data and a model-based result. In the approach of FIG. 44, the ML model can learn errors of the physics model and provide for adjustments to output of the physics model. For example, if the ML model learns that the physics model has error for certain ranges of parameter values, the ML model may output one or more adjustment values to adjust one or more results of the physics model. In the example of FIG. 44, a plot is illustrated as an example of how variations may be accounted for through use of a ML model. In the example of FIG. 44, the system 4400 can include training the ML model or another ML model using the historical data to generate a result that may be compared to a result of a physics model or, for example, to generate another type of result that is not computed by the physics model. In such an approach, the system 4400 can still be considered a hybrid approach where output such as predictions are based on one or more ML models and one or more physics models.

As an example, the system 4400 of FIG. 44 can involve collecting historical data for relevant BHA runs in a data store. From the data store, the system 4400 can feed inputs into the physics model, for example, to get a prediction of the steering response of a BHA. Such an approach may also involve getting the actual measurements of the DLS of a drilled hole from survey data, and calculating a residual. In such an approach, the system may train a ML model for the residual and combine it with the physics model. The hybrid model may then be used to predict the steering performance of a current BHA of a subject well.

As an example, an automated engineering analysis system can provide for engineering designs to be automatically validated, for example, by comparing predicted tool steering performance and a plan for a trajectory. In one embodiment, such an approach may be automated (e.g., without human intervention). As an example, with a hybrid model, BHA, trajectory and operating parameters can be optimized for improved performance before delivery to an intelligent execution component of a framework.

Figure 45:
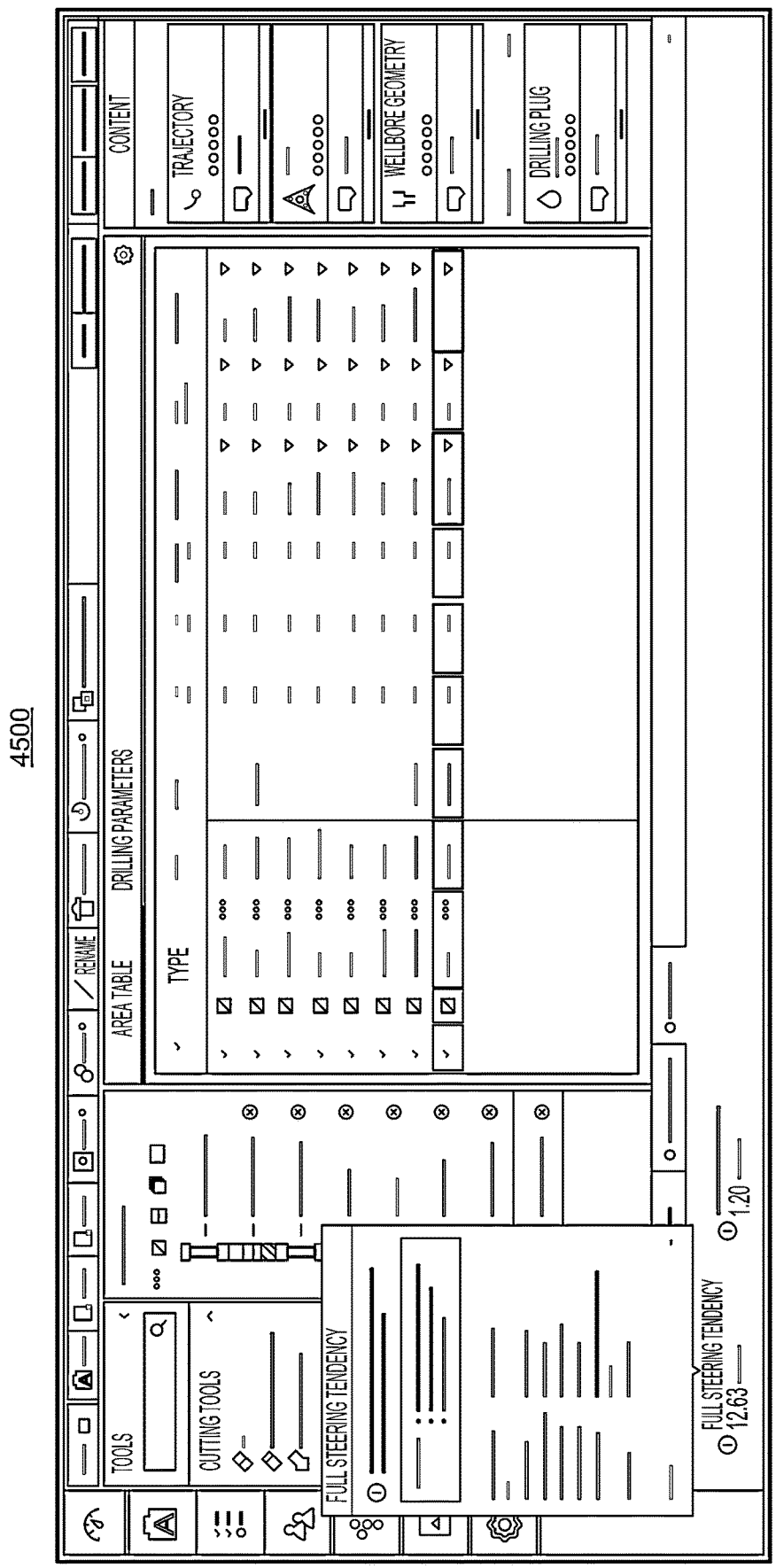
FIG. 45 shows an example of a graphical user interface.

FIG. 45 shows an example of a GUI 4500 that can include a graphical representation of a particular BHA full steering tendency information that can be generated and rendered, for example, in a pop-up panel. As an example, the GUI 4500 may be part of the DELFI environment, a drill operations framework, a drill planning framework, etc. (see, e.g., FIG. 1, FIG. 17, etc.).

In the example of FIG. 45, the GUI 4500 can render information as to a plan being derived for a particular run taking into consideration an approved initial trajectory, BHA capability and operating parameters using a hybrid model as shown in FIG. 44. As an example, such a GUI can include features for rendering power information, emissions information, etc. As an example, the GUI 4500 can be operatively coupled to or part of a WPG.

As mentioned, planning for execution can involve identifying relevant offset wells to consider for a subject well to be drilled. During the well execution, a ML model may be configured to learn (e.g., be trained and/or re-trained) from relevant offset wells and from a current subject well that is being drilled.

As an example, consider a method that includes defining p as a number of relevant offset wells where a ML scheme can determine how much importance or weight to assign to each of the offset wells, for example, in comparison to a weight of a subject well. In such an approach, noting $O_i$ as the weight for relevant offset well i, assuming for each offset well i, $O_i=w$ (e.g., uniform weight for all p offset wells) and noting C as the weight assigned for the current well, consider the following equation:

$$1 = \sum_{i=1}^{p} O_i C = pw + C$$

In the foregoing equation, $$\tau = \frac{C}{w}$$

can be defined as the ratio between the weight of the current well and the weight of an offset well such that:

If τ>1, Current well has more weight than 1 offset well.

If τ<1, Current well has less weight than 1 offset well.

Such an approach can provide an opportunity to balance out importance given to a current well compared to offset wells, for example, based on one or more of its data quality, level of trust as to the current well and how much experience has been gathered on historical datasets. In such an approach, as more wells are drilled, understanding of steering responses improves and model or models can become more accurate.

As to intelligent execution, it can refer to part of an ecosystem that integrates surface acquisition systems. For example, an intelligent execution platform can be part of a cloud-based solution that streamlines one or more workflows and allows for remote operations. Such an ecosystem may allow users to improve consistency in which decisions are made to reduce crew size and increase number of jobs a remote engineer can monitor.

As an example, an execution portion of a DDA may provide autonomous decision-making in real time. For example, consider a decision-making process that involves the following three actions: estimating of current states, monitoring system responses based on previous commands and predicting future behavior; defining and evaluating various possibilities using current context; and recommending an optimal path forward with commands to execute to achieve a path depending on downhole tool capabilities.

As an example, a method can include automating operations of one or more types of downhole tools. For example, consider automating operations of one or more of mud motors, rotary steerable systems (RSS) and at-bit steerable (ABS) systems.

As an example, a framework can provide for considering information from planning with offset analysis and adapting a hybrid model for real time execution; considering various downhole automation possibilities at a given time to optimize a recommended working trajectory execution, taking advantage of tool capabilities and minimizing unnecessary surface actions; considering real-time data information and derived tool health as well as tool state estimation at a given point in time to optimize current ongoing recommendation and recommend real time correction to handle deviations when it occurs. Such an approach can involve different computations and actions that can output an optimal recommendation, for example, for a fastest path with minimized risk based on the drilling constraints and the drilling context.

As to an optimal path recommendation, derivation can be via a WPG, for example, as explained with respect to FIG. 4 and FIG. 5, which may provide for a single-target approach and/or a multi-target approach and, for example, which may account for various factors, which may include energy, emissions, etc. (see, e.g. FIG. 32).

Figure 46:
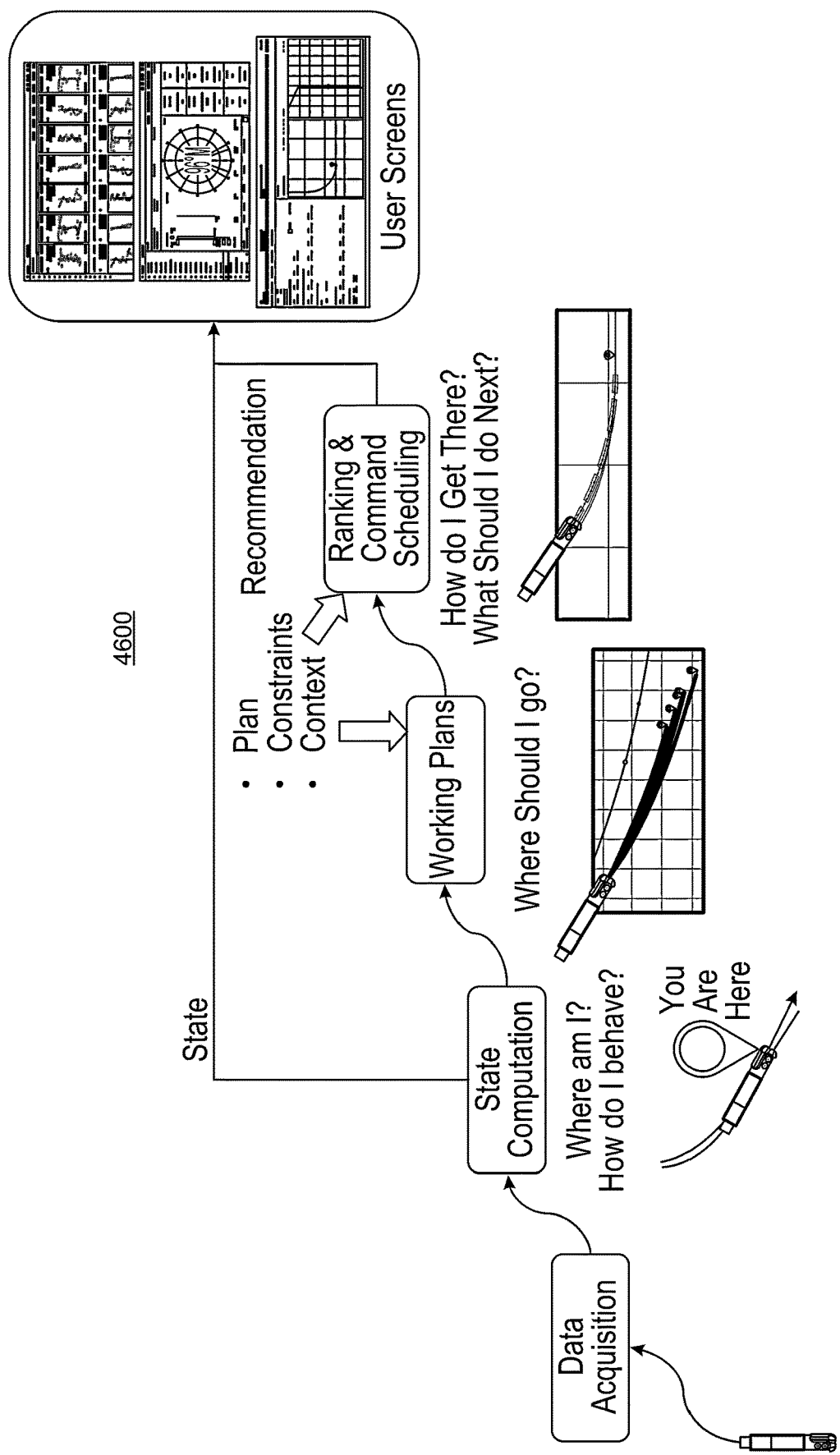
FIG. 46 shows an example of a workflow.

FIG. 46 shows an example of a workflow 4600 that includes data acquisition, state computation, working plans generation, ranking and command scheduling and user selections. As shown, such a workflow may be implemented during drilling operations at a site. For example, data acquired can be real-time data and state computation can compute a state of where a BHA or other tool is located in a wellbore. As to working plan generation, it can answer the question of where to proceed, which can be based on a current plan, constraints and context. As explained, ranking and command scheduling can be performed where commands can be suitable for automated and/or manual execution. Recommendations from such a workflow can be rendered to one or more displays where, for example, one or more GUIs can provide for user interactions (see, e.g., the plot 1600 of FIG. 16, the GUI of the system 3400 of FIG. 34, the GUIs 3710 and 3720 of FIG. 37, the GUI 3900 of FIG. 39, the GUI 4300 of FIG. 43, the GUI 4500 of FIG. 45, etc.).

As explained, a working plan can be or include trajectory to construct a path from a current bit location (HB point) to a next target. The construction of such a path may be performed in accordance with aiming at a target where, for example, various trajectory constraints can be considered. For example, consider one or more of the following constraints: allowable deviation from an original plan both in terms of position but also angular deviation; maximum dogleg capability of a steering assembly; recommended constraints by an automatic plan analysis that may be adjustable manually and/or automatically (e.g., according to user preferences, etc.); and allowable tortuosity, risk measures, hole quality, confidence level, etc.

As explained, working plan generation can be performed using a trajectory generator (e.g., for generating multiple trajectory candidates with different conditions) and a ranking system (e.g., for evaluating each of the generated candidates based on trajectory context, different properties, constraint violations, etc.). In such an approach, a WPG can output a single best candidate or few top ranked candidates.

As to the ranking system, it may operate based on a list of classification items that define features selected in order to rank the candidates. For example, consider candidate properties where some example of these properties can include: trajectory length, ROP, total steering length, toolface (TF) orientation, maximum steering ratio, average deviation from the plan, risk level, target constraints, angular deviation, tortuosity, DDI, hole quality, tool wear, number of downlinks, geomechanics, confidence level and production level index. For each property utilized, a weight $W_i$ can be defined based on trajectory context. In such an example, the weight can be associated with a cost function of the candidate to produce a total cost for each candidate trajectory as:

$$C_{prop} = \sum_i C_i W_i$$

Such a ranking system may be modular and extensible. Defining a ranking system in such a manner can facilitate adding additional candidate properties (e.g., according to mathematical and/or logical descriptions). For example, using a machine learning approach, a system may map out from historical data how easy or difficult it was to drill a path and define a drilling difficulty index from surface automation and add it to the foregoing equation. In such an example, one or more cost functions can be optimized in a manner that can account for ease and/or difficulty of drilling.

As an example, once an optimal path has been selected and steering commands to achieve the path are defined, there may be an additional optimization problem of defining a link with surface automation equipment to execute the optimal path efficiently. Such an approach can be performed in an iterative manner, for example, by deriving the optimal drilling parameters after the working plan has been generated or it may be performed simultaneously by incorporating surface automation constraints inside a ranking system (e.g., in an extensible manner, etc.).

As mentioned, an intelligent execution component may control steering commands whether it is for one or more of motor steering, RSS steering or ABS steering. In certain embodiments, a control layer may be provided when running an RSS or ABS tool (e.g., as to availability of direct downhole trajectory automation).

Figure 47:
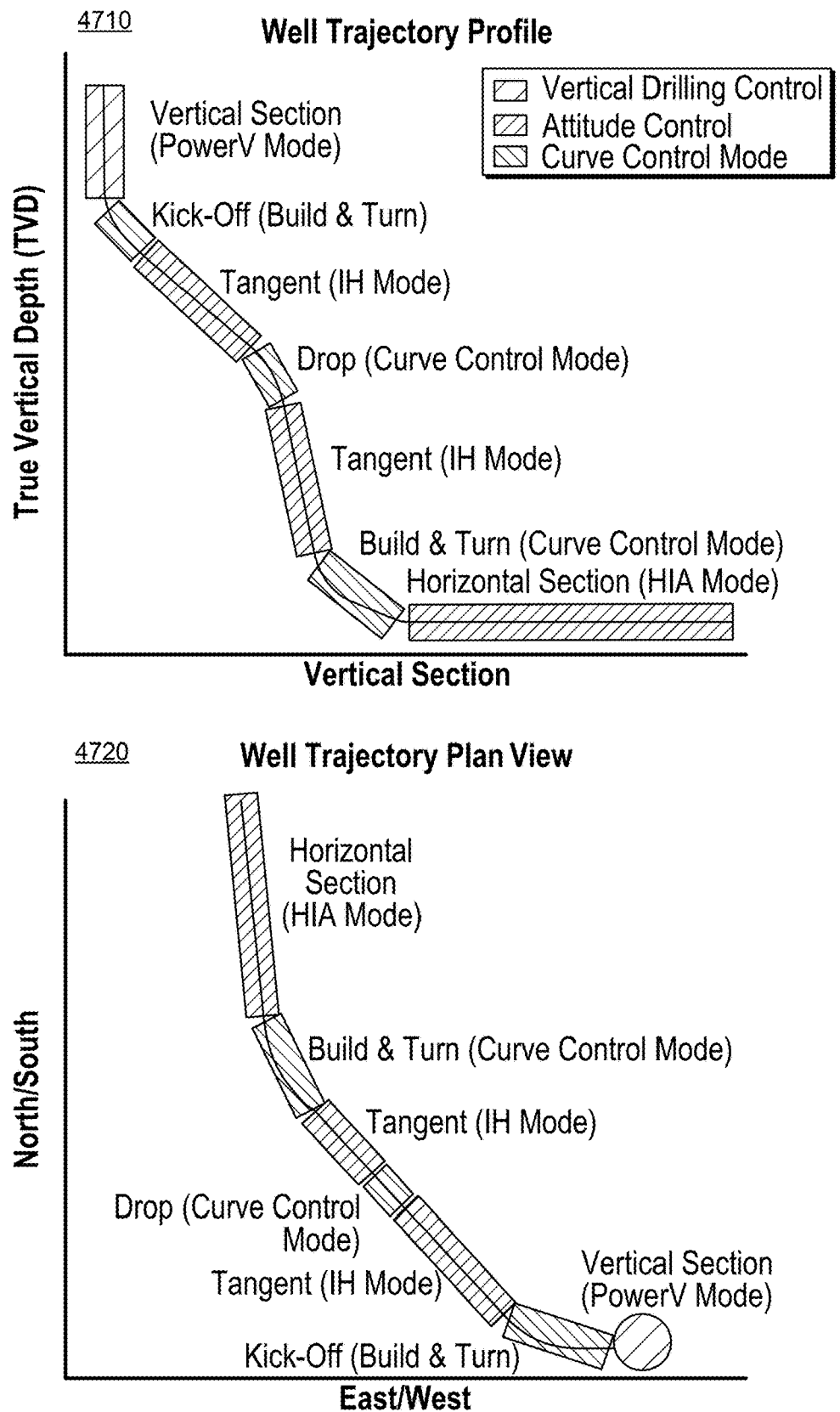
FIG. 47 shows examples of graphical user interfaces.

FIG. 47 shows example graphical user interfaces (GUIs) 4710 and 4720 for well trajectory profiles where the GUI 4710 shows a view with respect to true vertical depth and where the GUI 4720 shows a plan view with respect to north, south, east and west.

Downhole trajectory automation can involve a series of closed loop control modes for drilling different trajectory types in a well as illustrated in the GUIs 4710 and 4720. Such closed loop control modes may be managed by an intelligent execution component that defines when to enter or exit certain modes or simply run the downhole tool in manual mode with the intelligent execution component controlling settings of the manual mode with the help of the surface automation where a link is available.

As an example, downhole automation may provide improvements in one or more of borehole quality; operations efficiency; minimum variability (de-skilling); compensation (de-manning); activity management (de-manning); operations integrity; etc.

As an example, consider downhole automation that provides for one or more of the following example modes: PowerV as a vertical closed loop drilling mode to enable holding a vertical line; IH as a closed loop inclination hold control for maintaining a defined inclination; HIA as a closed loop control of inclination and azimuth for tangents and laterals; Curve Control Mode as a closed loop control of the curve be it 2D or 3D curves. In FIG. 47, various modes are illustrated where transitions from one mode to another can occur, as appropriate.

Figure 48:
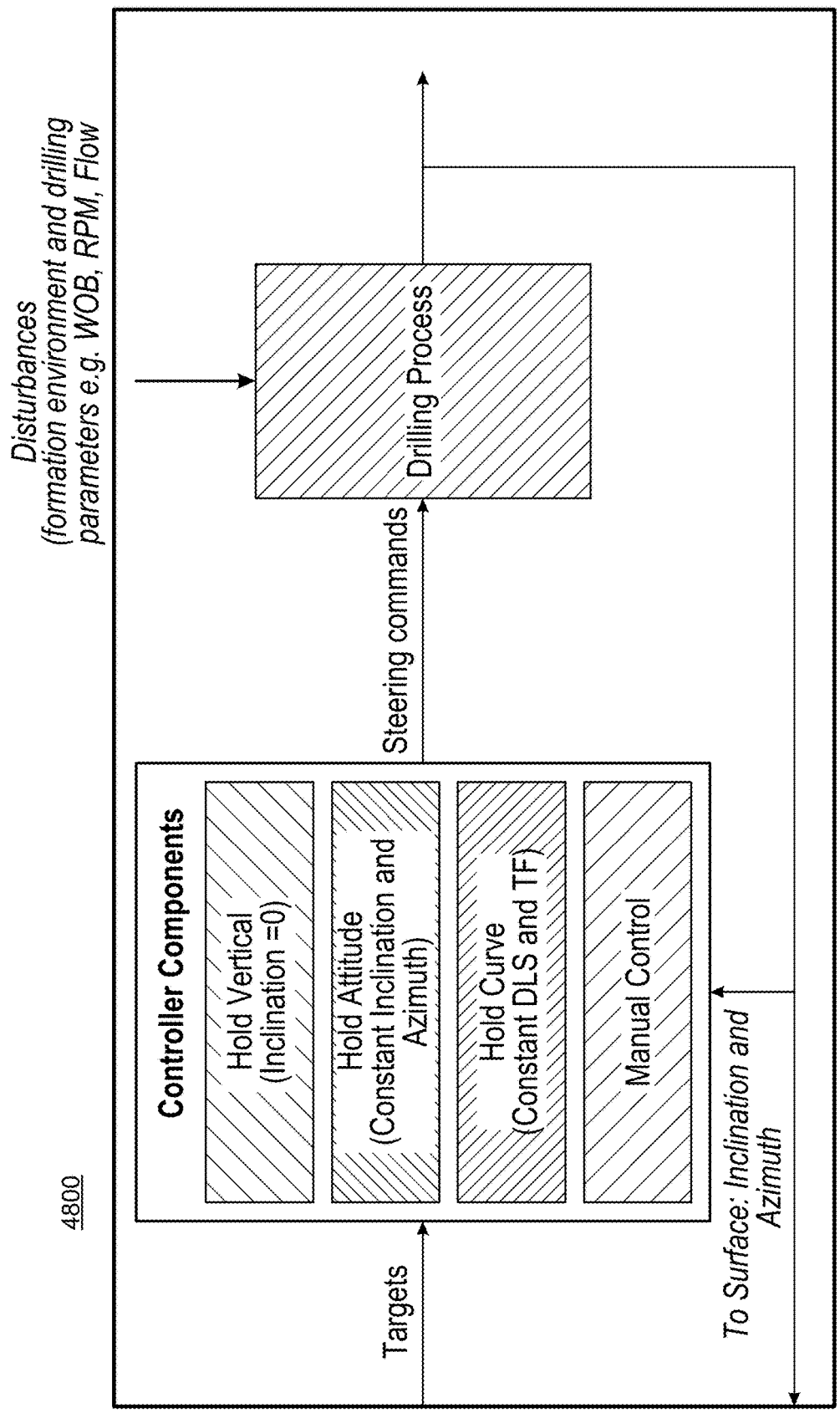
FIG. 48 shows an example of a system.

FIG. 48 shows an example of a closed-loop controller 4800 with various controller components. In the example of FIG. 48, one or more of the aforementioned modes (e.g., PowerV, IH, HIA, etc.) may evolve as to automatically maintain a given attitude. As an example, the Curve Control Mode may allow an RSS or ABS tool to auto-adjust its steering given a DLS (e.g., in deg/100 ft) and TF (e.g., in deg) to maintain a smooth curve with a steady DLS.

As an example, a user may interact with a system at different levels of automation. As to the level 4 example, consider real-time steering decisions being made by an intelligent execution component. As an example, a directional driller (DD) can have a role as a supervisor of a system where the DD may be free of day-to-day decision making. In such a scenario, the intelligent execution component can share with the DD (e.g., via a DD counsel) information regarding a planned versus actual trajectory, which can include the current working plan that is being followed, the current targets being aimed at, the different sequence of downhole automation modes to be executed and the drilling commands. Such a system can also share contextual information to highlight different risk zones and the choices it is making. In such an approach, a DD can intervene as appropriate where intervention may be exceptional as for most of the cases, the system would make appropriate decisions.

As an example, a motor workflow enabling motor run monitoring and real-time motor recommendations with slide/rotate sequence advising may be configured using a framework such as the framework 4200. For example, during field tests, a set of 10 wells were evaluated as to: estimation of states, definition of multiple options, and choice of recommendations. The data indicated that estimation of the states of the wells during drilling could be improved because, often, when the states were estimated accurately, a good decision could be made by the system.

As an example, for a mud motor job, an intelligent execution component can automatically detect when to slide and when to rotate, estimate steering capacity and locate a drill bit location. To evaluate performance of such a system, several performance indicators can be used such as, slide detection estimation errors; bit position estimation errors; steering capacity estimation errors; and recommendations evaluation.

Figure 49:
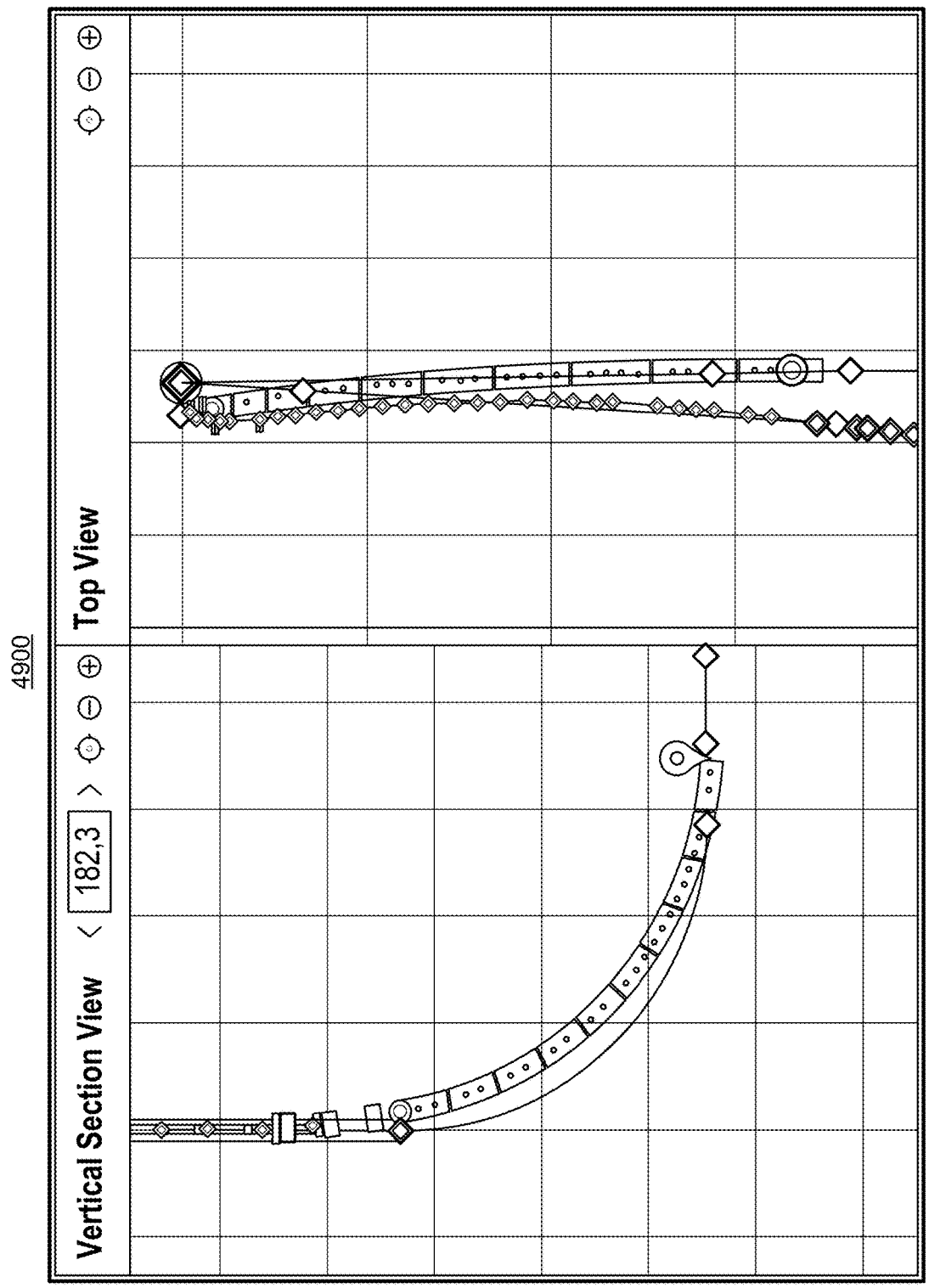
FIG. 49 shows examples of graphical user interfaces.

FIG. 49 shows example graphical user interfaces (GUIs) 4900 of a vertical section view and a top view of a geologic environment. In the example of FIG. 49, the various points can represent target points as may be computed using a framework (e.g., a system, etc.). As shown, an actual path can deviate from a planned path where a framework, at an acceptable level of automation, may cause the actual path to re-enter the planned path or otherwise approach it. In such an example, where sliding and rotating modes are implemented, the GUIs 4900 may indicate such changes.

Figure 50:
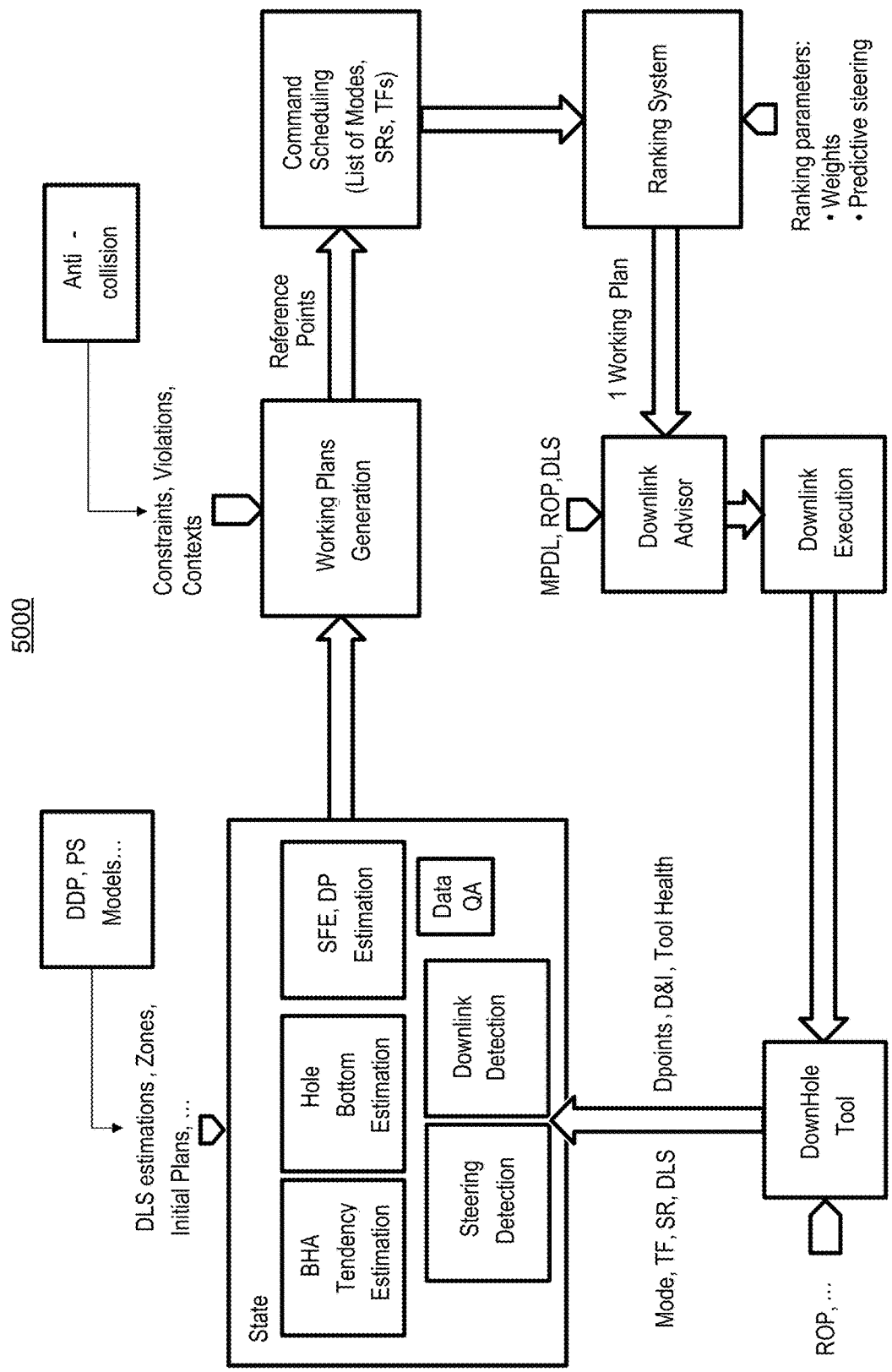
FIG. 50 shows an example of a system.

FIG. 50 shows an example of a system 5000 that can include various features of the system 400 of FIG. 4 and FIG. 5. In the example of FIG. 50, the system 5000 can provide for various downhole tool automation tasks such as, for example, RSS tasks. As explained, where various downhole communication links are provided, a working plan can be generated for use by a downhole advisor that can provide commands for downhole execution, for example, via a downlink execution component. In such an approach, a downhole tool or downhole tools can transmit information uphole (e.g., to surface) for purposes of state estimation. In such an example, a state estimation component can include a downlink detection component where, upon receipt of information from a downhole tool or downhole tools, the state estimation component can perform state estimation, which can include one or more of BHA tendency estimation, hole bottom (HB) estimation, steering factor efficiency (SFE), DP estimation, etc. In such an approach, one or more state estimations can be provided to the working plan generator (WPG) such that additional trajectories can be generated, ranked, selected, etc. As shown, an anti-collision component may provide information to the WPG where, for example, a well is being drilled proximate to one or more other wells. As an example, the system 5000 may be utilized for one or more drilling techniques/technologies. For example, consider directional drilling via use of a mud motor, RSS, etc.

FIG. 51 shows example tables 5100 for results for different parameters of state estimation and slide detection. In results in the tables 5100 show acceptable accuracy of the models evaluating the different parameters in between surveys. In the example of FIG. 51, the results were computed without continuous direction and inclination (D&I) information available during the run. When adding continuous D&I information in the computation of state parameters, bit position and steering capacity, the accuracy is increased by about 20 percent on average where impact is more relevant for the wells with the highest estimation errors.

On the set of 10 wells, 551 recommendations were evaluated provided by a projection engine for motor jobs. The results, as shown in FIG. 51, indicate that more than 95 percent of the recommendations provided by the projection engine were considered valid. Considering the fact that the projection engine is re-evaluating the context at each survey and is providing a new recommendation considering this new context, an incorrect recommendation can be quickly identified and corrected to avoid impacting the real-time job in the case that it is strictly followed.

FIG. 52 shows various graphical user interfaces 5200 that include plots of slide efficiency factor where each plot includes information corresponding to a particular portion of a wellbore (e.g., per measured depth (MD)), along with average ROP. As shown, ROP varies considerably (e.g., 33 ft/h to over 69 ft/h). The plots of FIG. 52 provide information as to how effective each of the slides performed has been. Such plots may be generated and/or rendered in real-time for evaluation and manual and/or automated adjustments of one or more drilling parameters of sliding for improving and/or maintaining a desired level of efficiency.

As mentioned, addressing curves for downhole automation can be a challenge for drilling part of a trajectory using direct closed-loop control inside a downhole tool. Curve control can be implemented as part of an ADD. In various trials, curve control was performed during five runs where the curve control mode was engaged from about 20 degrees inclination. In such an example, both 2D and 3D curves were drilled successfully over MD of up to 600 ft. In these trials, the runs were performed with both RSS and ABS system assemblies in different hole sizes. Desired DLSs ranged from about 3 deg/100 ft to 12 deg/100 ft with tool ROP ranging from about 40 ft/hr to about 140 ft/hr. These data indicate successful implementation of a curve control mode in both 2D and 3D well trajectories.

Figure 53:
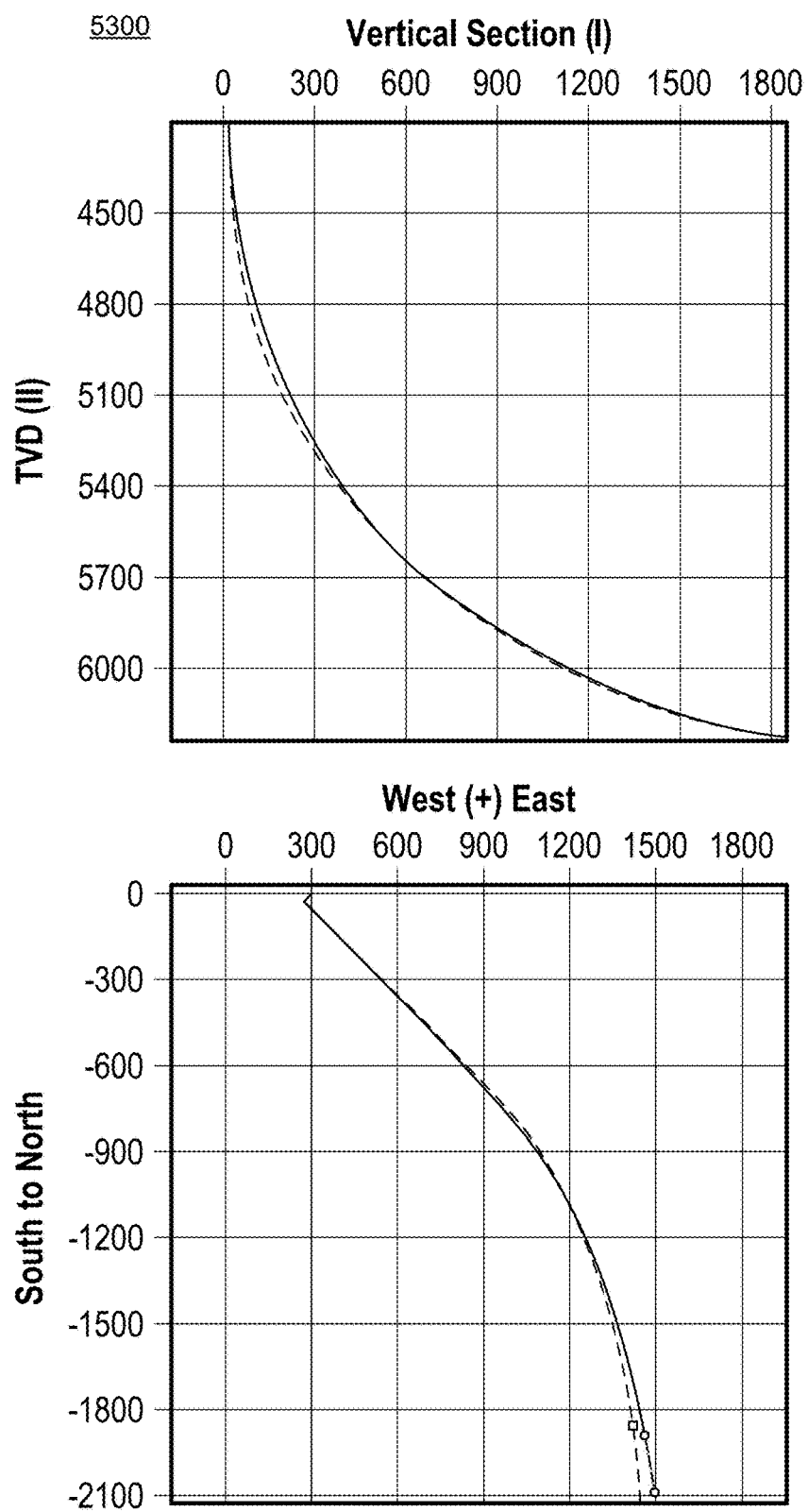
FIG. 53 shows examples of plots.

FIG. 53 shows example plots 5300, which may be rendered as part of a GUI or GUIs. The plots 5300 show the planned trajectory (dashed) and the actual trajectory (solid line) for one of the curve control field test runs (e.g., automated curvature control mode). The data demonstrated the effectiveness of the curve control mode.

The field test also showed that ROP was faster than in the offset wells in curve control test runs; and in some cases as much as 60 percent faster, and trajectory was controlled with less surface interventions (e.g., as measured by number of downlinks) than in a manual mode for drilling such a curve. Between 50 and 75 percent fewer downlinks were experienced compared to previous offset wells.

As an example, an automated approach can be implemented for one or more other types of modes, such as drilling to a landing point where the HIA mode is engaged. Such a mode was tested in hole sizes up to 14.75 inch with DLS requirements as low as 2 deg/100 ft.

Figure 54:
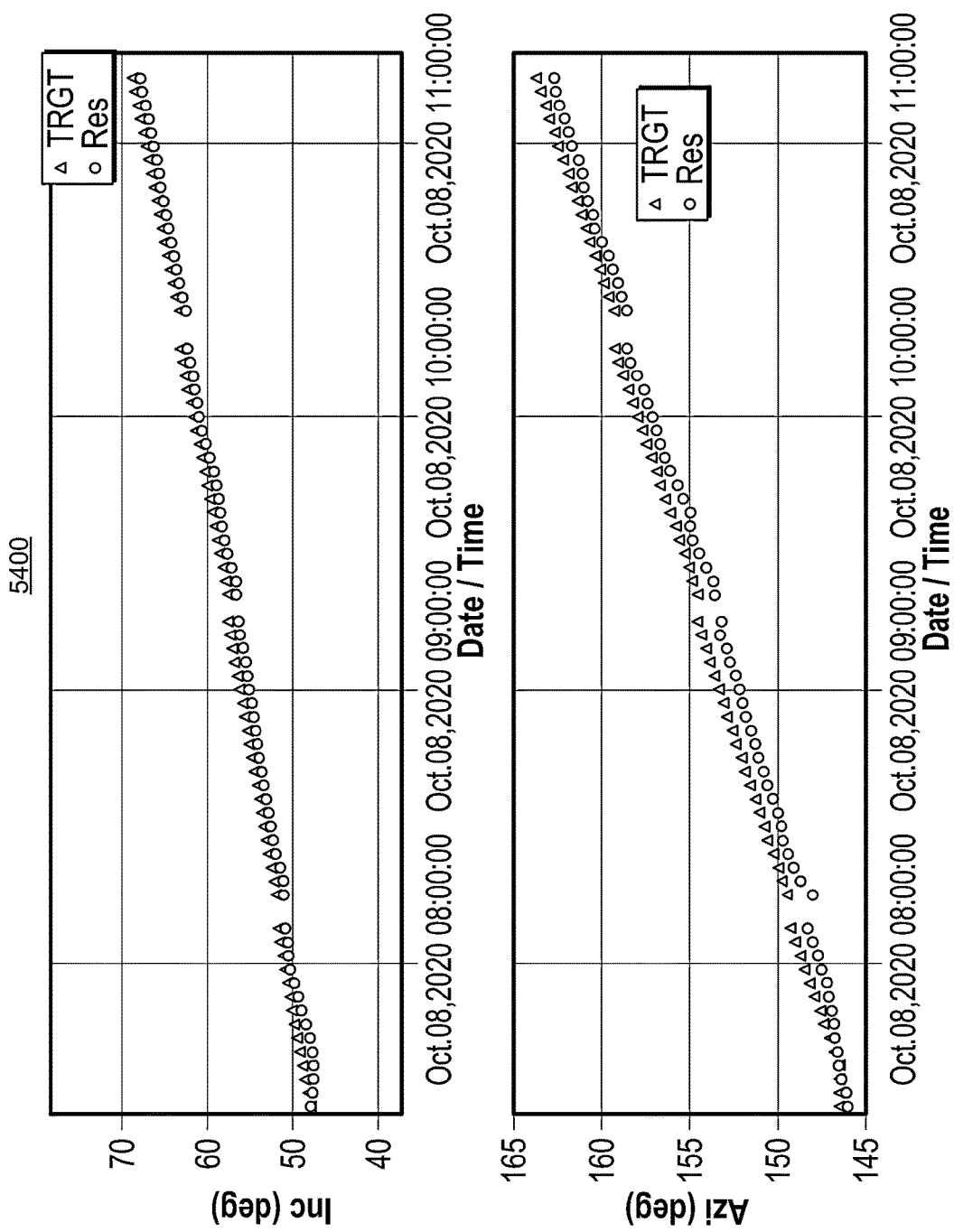
FIG. 54 shows examples of plots.
Figure 55:
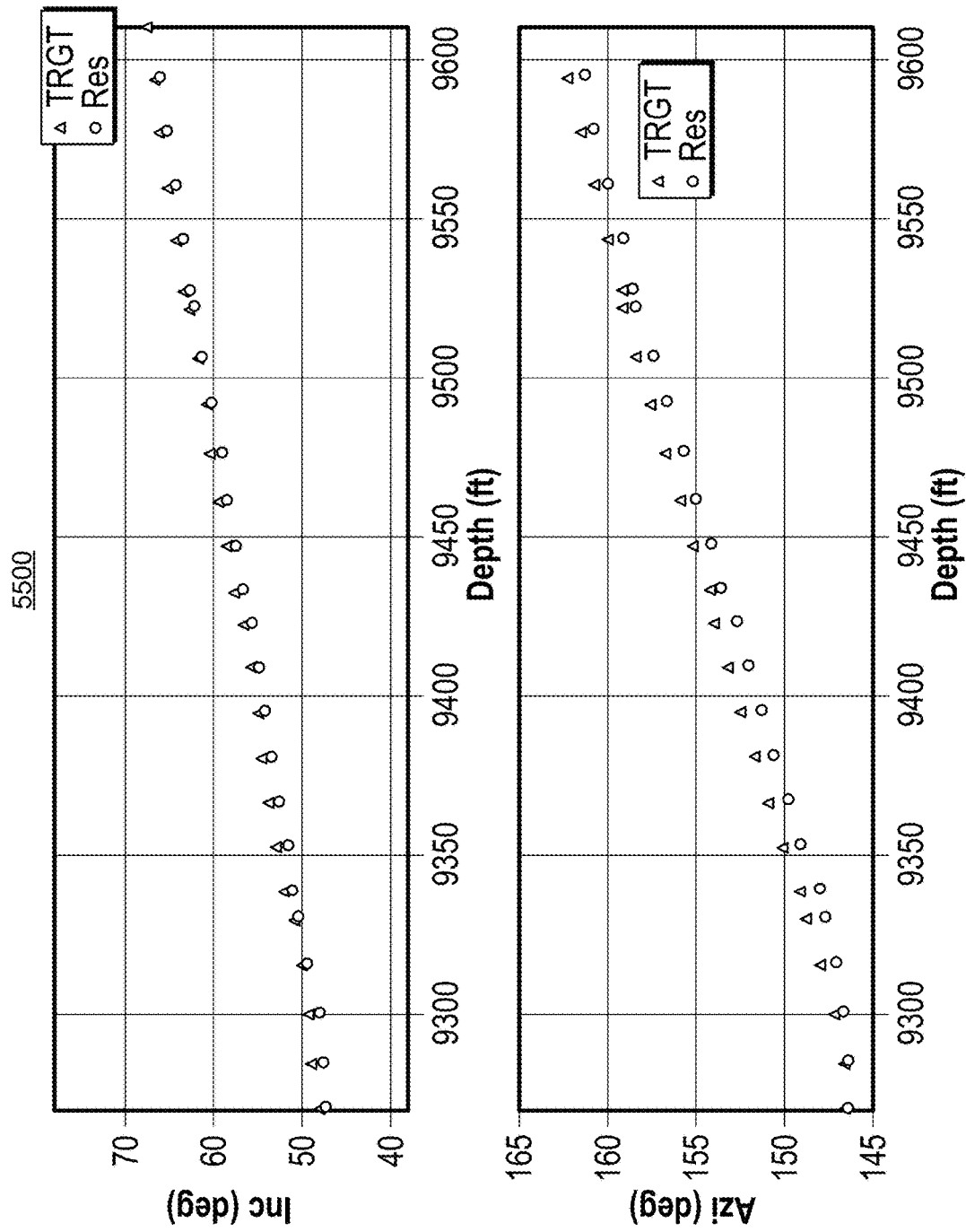
FIG. 55 shows examples of plots.

FIG. 54 and FIG. 55 show example plots 5400 and 5500 for an example of a constant curvature drilled with the downhole curve control mode with a target DLS=7 deg/100 ft and a TF=36 deg. These target values of DLS and TF are converted to matching target attitudes (inclination and azimuth); these values are shown in time, in the plots 5400, and depth, in the plots 5500, as triangles. The continuous inclination and azimuth responses are superimposed in the plots 5400 and 5500 as green circles.

The plots 5400 presents the dump data as recorded in the tool, and the plots 5500 presents the real-time surface data as transmitted to the surface and converted to depth-domain. As shown, the downhole curve control kept both expected inclination and azimuth within a close range of the curve requirement, which resulted in a smooth curve being drilled with minimum surface intervention.

Figure 56:
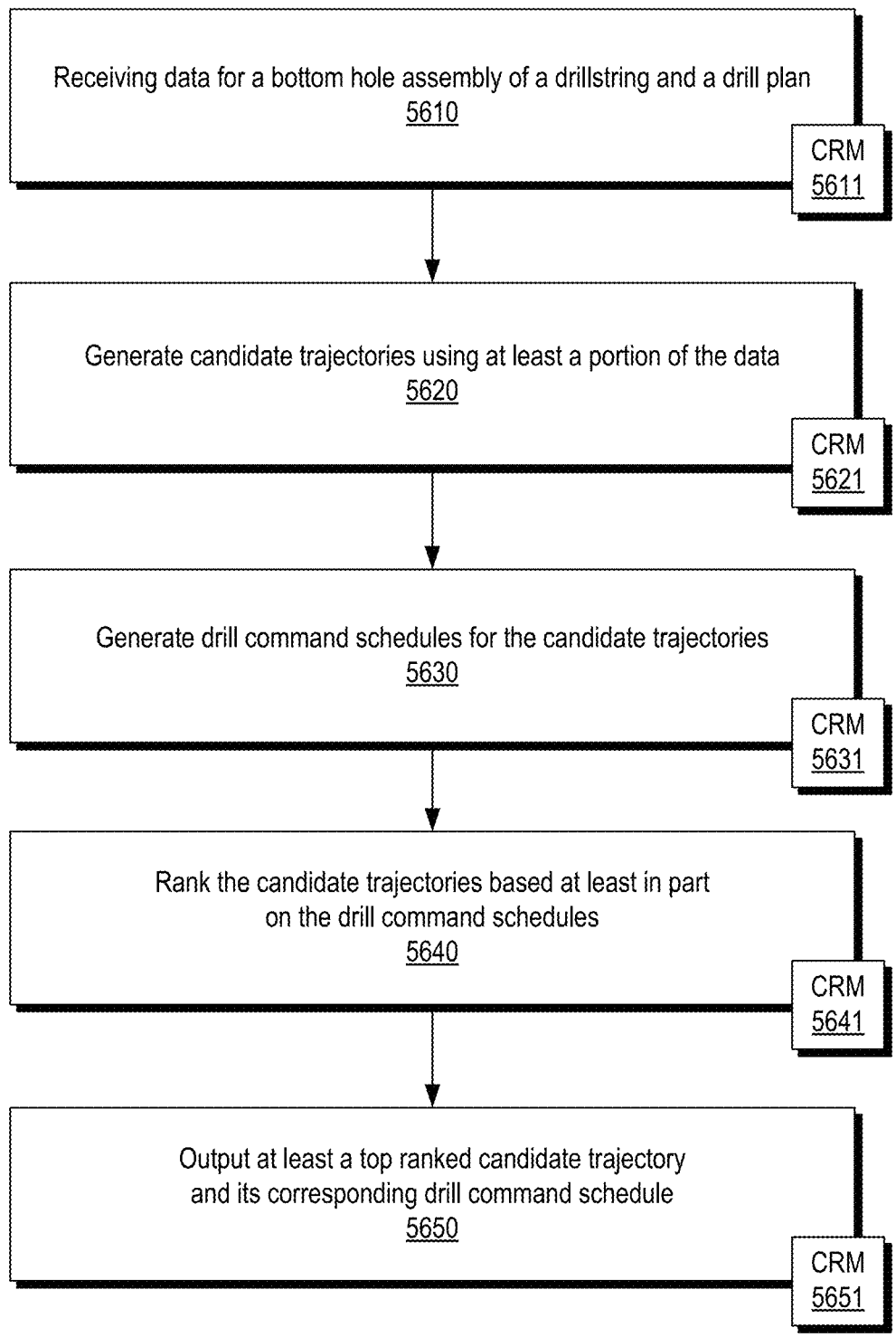
FIG. 56 shows an example of a method.

FIG. 56 shows an example of a method 5600 that can include a reception block 5610 for receiving data for a bottom hole assembly of a drillstring and a drill plan; a generation block 5620 for generating candidate trajectories using at least a portion of the data; a generation block 5630 for generating drill command schedules for the candidate trajectories; a ranking block 5640 for ranking the candidate trajectories based at least in part on the drill command schedules; and an output block 5650 for outputting at least a top ranked candidate trajectory and its corresponding drill command schedule.

As shown in FIG. 56, the method 5600 may be implemented via one or more computer-readable media (CRM) per blocks 5611, 5621, 5631, 5641 and 5651, which may, for example, be implemented using a system such as a computing system (see, e.g., the example system 300 of FIG. 3, the example system 3170 of FIG. 31, the example system 5000 of FIG. 50, etc.). Such blocks can include processor-executable instructions.

As explained, various systems, methods, etc., can implement one or more mL models. As to types of ML models, consider one or more of a support vector machine (SVM) model, a k-nearest neighbors (KNN) model, an ensemble classifier model, a neural network (NN) model, etc. As an example, a machine learning model can be a deep learning model (e.g., deep Boltzmann machine, deep belief network, convolutional neural network, stacked auto-encoder, etc.), an ensemble model (e.g., random forest, gradient boosting machine, bootstrapped aggregation, AdaBoost, stacked generalization, gradient boosted regression tree, etc.), a neural network model (e.g., radial basis function network, perceptron, back-propagation, Hopfield network, etc.), a regularization model (e.g., ridge regression, least absolute shrinkage and selection operator, elastic net, least angle regression), a rule system model (e.g., cubist, one rule, zero rule, repeated incremental pruning to produce error reduction), a regression model (e.g., linear regression, ordinary least squares regression, stepwise regression, multivariate adaptive regression splines, locally estimated scatterplot smoothing, logistic regression, etc.), a Bayesian model (e.g., naïve Bayes, average on-dependence estimators, Bayesian belief network, Gaussian naïve Bayes, multinomial naïve Bayes, Bayesian network), a decision tree model (e.g., classification and regression tree, iterative dichotomiser 3, C4.5, C5.0, chi-squared automatic interaction detection, decision stump, conditional decision tree, M5), a dimensionality reduction model (e.g., principal component analysis, partial least squares regression, Sammon mapping, multidimensional scaling, projection pursuit, principal component regression, partial least squares discriminant analysis, mixture discriminant analysis, quadratic discriminant analysis, regularized discriminant analysis, flexible discriminant analysis, linear discriminant analysis, etc.), an instance model (e.g., k-nearest neighbor, learning vector quantization, self-organizing map, locally weighted learning, etc.), a clustering model (e.g., k-means, k-medians, expectation maximization, hierarchical clustering, etc.), etc.

As an example, a system may utilize one or more recurrent neural networks (RNNs). One type of RNN is referred to as long short-term memory (LSTM), which can be a unit or component (e.g., of one or more units) that can be in a layer or layers. A LSTM component can be a type of artificial neural network (ANN) designed to recognize patterns in sequences of data, such as time series data. When provided with time series data, LSTMs take time and sequence into account such that an LSTM can include a temporal dimension. For example, consider utilization of one or more RNNs for processing temporal data from one or more sources, optionally in combination with spatial data. Such an approach may recognize temporal patterns, which may be utilized for making predictions (e.g., as to a pattern or patterns for future times, etc.).

As an example, the TENSORFLOW framework (Google LLC, Mountain View, California) may be implemented, which is an open source software library for dataflow programming that includes a symbolic math library, which can be implemented for machine learning applications that can include neural networks. As an example, the CAFFE framework may be implemented, which is a DL framework developed by Berkeley AI Research (BAIR) (University of California, Berkeley, California). As another example, consider the SCIKIT platform (e.g., scikit-learn), which utilizes the PYTHON programming language. As an example, a framework such as the APOLLO AI framework may be utilized (APOLLO.AI GmbH, Germany). As mentioned, a framework such as the PYTORCH framework may be utilized.

As an example, a training method can include various actions that can operate on a dataset to train a ML model. As an example, a dataset can be split into training data and test data where test data can provide for evaluation. A method can include cross-validation of parameters and best parameters, which can be provided for model training.

The TENSORFLOW framework can run on multiple CPUs and GPUs (with optional CUDA (NVIDIA Corp., Santa Clara, California) and SYCL (The Khronos Group Inc., Beaverton, Oregon) extensions for general-purpose computing on graphics processing units (GPUs)). TENSORFLOW is available on 64-bit LINUX, MACOS (Apple Inc., Cupertino, California), WINDOWS (Microsoft Corp., Redmond, Washington), and mobile computing platforms including ANDROID (Google LLC, Mountain View, California) and IOS (Apple Inc.) operating system based platforms.

TENSORFLOW computations can be expressed as stateful dataflow graphs; noting that the name TENSORFLOW derives from the operations that such neural networks perform on multidimensional data arrays. Such arrays can be referred to as "tensors".

As an example, a method can include receiving data for a bottom hole assembly of a drillstring and a drill plan; generating candidate trajectories using at least a portion of the data; generating drill command schedules for the candidate trajectories; ranking the candidate trajectories based at least in part on the drill command schedules; and outputting at least a top ranked candidate trajectory and its corresponding drill command schedule. In such an example, ranking can include assessing violations of one or more constraints and/or determining costs according to one or more cost functions.

As an example, a method can utilize one or more cost functions that can include, for example, equipment related cost functions, distance related cost functions, etc. As an example, cost functions can include at least one energy cost function for assessing energy utilization based at least in part on a drill command schedule. As an example, cost functions can include at least one emission cost function for assessing emissions generation based at least in part on a drill command schedule.

As an example, a method can include assessing emissions generation by assessing emissions for one or more members selected from a group of rotational energy utilization emissions, hydraulic energy utilization emissions and hoisting energy utilization emissions.

As an example, a method can include receiving data in real-time during a drilling operation; generating candidate trajectories using at least a portion of the real-time data; generating drill command schedules for the candidate trajectories; ranking the candidate trajectories based at least in part on the drill command schedules; and outputting at least a top ranked candidate trajectory and its corresponding drill command schedule. In such an example, ranking can include assessing violations of one or more constraints and/or determining costs according to one or more cost functions.

As an example, real-time data can include hole bottom position where candidate trajectories extend from the hole bottom position to an active target position.

As an example, real-time data can include hole bottom position where candidate trajectories extend from the hole bottom position to a target selected from multiple targets. In such an example, a method can include, prior to generating candidate trajectories, generating the multiple targets to include at least one achievable target.

As an example, a method can include receiving real-time data that include hole bottom position, prior to generating candidate trajectories, determining a closet point on a pre-determined planned trajectory to the hole bottom position, scanning forward in space until encountering at least one achievable target on the pre-determined planned trajectory that is at least one look-ahead distance, and including targets on the pre-determined planned trajectory within a proximity distance of the hole bottom position. In such an example, the method may include assessing the targets within the proximity distance according to one or more hit or miss criteria. For example, consider, based at least in part on the assessing the targets within the proximity distance, generating context information, constraint information or context and constraint information for the ranking of the candidate trajectories.

As an example, a method can include determining that a landing constraint is not satisfied for landing prior to drilling of a lateral portion of a borehole and, responsive to determining that an unsatisfied landing target is unachievable, applying the landing constraint to target generation for generating at least one landing target for the candidate trajectories.

As an example, a method can include selecting one of the drill command schedules and communicating at least one command to the bottom hole assembly of the drillstring. In such an example, the selected drill command schedule can correspond to a top ranked candidate trajectory or one of a member of highly ranked candidate trajectories. In such an example, a method can include receiving data from the bottom hole assembly and estimating a downhole state using at least a portion of the data from the bottom hole assembly. In such an example, a method can include generating additional candidate trajectories based at least in part on the estimated downhole state. As an example, a downhole state can be or include a directional drilling state (see, e.g., the example system 5000 of FIG. 50, etc.).

As an example, a system can include one or more processors; memory accessible to at least one of the one or more processors; processor-executable instructions stored in the memory and executable to instruct the system to: receive data for a bottom hole assembly of a drillstring and a drill plan; generate candidate trajectories using at least a portion of the data; generate drill command schedules for the candidate trajectories; rank the candidate trajectories based at least in part on the drill command schedules; and output at least a top ranked candidate trajectory and its corresponding drill command schedule.

As an example, one or more computer-readable storage media can include processor-executable instructions to instruct a computing system to: receive data for a bottom hole assembly of a drillstring and a drill plan; generate candidate trajectories using at least a portion of the data; generate drill command schedules for the candidate trajectories; rank the candidate trajectories based at least in part on the drill command schedules; and output at least a top ranked candidate trajectory and its corresponding drill command schedule.

As an example, a computer program product that can include computer-executable instructions to instruct a computing system to perform one or more methods such as one or more of the methods described herein (e.g., in part, in whole and/or in various combinations).

The embodiments disclosed in this disclosure are to help explain the concepts described herein. This description is not exhaustive and does not limit the claims to the precise embodiments disclosed. Modifications and variations from the exact embodiments in this disclosure may still be within the scope of the claims.

Likewise, the steps described need not be performed in the same sequence discussed or with the same degree of separation. Various steps may be omitted, repeated, combined, or divided, as appropriate. Accordingly, the present disclosure is not limited to the above-described embodiments, but instead is defined by the appended claims in light of their full scope of equivalents. In the above description and in the below claims, unless specified otherwise, the term "execute" and its variants are to be interpreted as pertaining to any operation of program code or instructions on a device, whether compiled, interpreted, or run using other techniques.

Certain of the claims below may include numbered lists. The numbers are provided as an organizational tool to aid in readability. The numbers themselves do not indicate an expected order of configuration or execution or otherwise have substantive meaning. For United States applications, the claims that follow do not invoke section 112(f) unless the phrase "means for" is expressly used together with an associated function.

What is claimed is:

1. A method comprising:
   receiving a planned trajectory for a bottom hole assembly of a drillstring to reach a final target from a surface, wherein the planned trajectory includes one or more possible targets on a path to the final target; and
   during drilling of the planned trajectory with the bottom hole assembly:
      receiving data for the bottom hole assembly associated with the bottom hole assembly implementing the planned trajectory;
      based on the data, determining that a hole bottom position of the bottom hole assembly has deviated from the planned trajectory;
      generating a set of candidate trajectories for the bottom hole assembly to return to the planned trajectory using at least a portion of the data, wherein each candidate trajectory of the set of candidate trajectories is aimed at a respective one of the one or more possible targets on the path to the final target, wherein the set of candidate trajectories includes one or more first candidate trajectories configured to return the bottom hole assembly to the planned trajectory at a target A of the one or more possible targets on the path to the final target and one or more second candidate trajectories configured to return the bottom hole assembly to the planned trajectory at a target B of the one or more possible targets on the path to the final target, and wherein the target B is at a different position on the path to the final target than the target A;
      generating a drill command schedule for each candidate trajectory of the set of candidate trajectories, wherein the drill command schedules provide hardware specific drill command sequences for respective candidate trajectories of the set of candidate trajectories;
      ranking each candidate trajectory of the set of candidate trajectories based on a cost for each candidate trajectory to reach its respective possible target on the path to the final target, wherein the cost for each candidate trajectory is based on a plurality of weighted steering properties and a plurality of weighted steering violations for each candidate trajectory;
      identifying a top ranked candidate trajectory based on its associated cost;
      outputting at least the top ranked candidate trajectory and its corresponding drill command schedule;
      appending the top ranked candidate trajectory to the planned trajectory at the hole bottom position to generate an appended planned trajectory; and
      communicating the hardware specific drill command sequences of the drill command schedule for the top ranked candidate trajectory to control the bottom hole assembly of the drillstring to access the final target from the hole bottom position via the appended planned trajectory.

2. The method of claim 1, further comprising determining a trajectory context for the respective possible target associated with each candidate trajectory, and wherein ranking each candidate trajectory is based on the associated trajectory context and a future context for a future possible target of the one or more possible targets that is positioned further on the planned trajectory.

3. The method of claim 2, wherein the trajectory context for the respective possible target associated with each candidate trajectory is based on one or more past possible targets of the one or more possible targets that the hole bottom position has passed.

4. The method of claim 2, wherein the trajectory context for the respective possible target associated with each candidate trajectory is based on one or more unachievable possible targets of the one or more possible targets that are unachievable from the hole bottom position.

5. The method of claim 2, wherein the trajectory context includes one or more of curve, landing, horizontal, vertical, tangent, nudge, nudge to vertical, or nudge to horizontal.

6. The method of claim 1, wherein the target A is an active target of the planned trajectory and the target B is further along the planned trajectory than the active target.

7. The method of claim 1, wherein receiving the data for the bottom hole assembly includes receiving the data in real-time during a drilling operation.

8. The method of claim 7, wherein ranking each candidate trajectory of the set of candidate trajectories includes removing one or more floating candidate trajectories of the set of candidate trajectories.

9. The method of claim 1, wherein generating the set of candidate trajectories includes removing one or more unachievable targets from the one or more possible targets.

10. The method of claim 1, further comprising, prior to generating the set of candidate trajectories:
    determining a closest point on the planned trajectory to the hole bottom position;
    scanning forward in space until encountering an achievable target of the one or more possible targets on the planned trajectory that is at least one look-ahead distance; and including, for the set of candidate trajectories, proximity targets of the one or more possible targets that are on the planned trajectory within a proximity distance of the hole bottom position.

11. The method of claim 10, further comprising assessing the proximity targets within the proximity distance according to one or more hit or miss criteria.

12. The method of claim 11, further comprising, based at least in part on the assessing the proximity targets within the proximity distance, generating context information, constraint information, or context and constraint information for the ranking of the candidate trajectories.

13. The method of claim 1, further comprising:
determining that a landing constraint is not satisfied for landing prior to drilling of a lateral portion of a borehole; and
responsive to determining that an unsatisfied landing target is unachievable, applying the landing constraint to target generation for generating at least one landing target for the candidate trajectories.

14. The method of claim 7, further comprising:
selecting one of the drill command schedules; and
communicating at least one command thereof to the bottom hole assembly of the drillstring.

15. The method of claim 14, further comprising:
receiving data from the bottom hole assembly; and
estimating a downhole state using at least a portion of the data from the bottom hole assembly.

16. The method of claim 15, further comprising generating additional candidate trajectories based at least in part on the estimated downhole state.

17. The method of claim 15, wherein the downhole state comprises includes a directional drilling state.

18. A system comprising:
one or more processors;
memory accessible to at least one of the one or more processors; and
processor-executable instructions stored in the memory and executable to instruct the system to:
receive a planned trajectory for a bottom hole assembly of a drillstring to reach a final target from a surface, wherein the planned trajectory includes one or more possible targets on a path to the final target; and
during drilling of the planned trajectory with the bottom hole assembly:
receive data for the bottom hole assembly associated with the bottom hole assembly implementing the planned trajectory;
based on the data, determine that a hole bottom position of the bottom hole assembly has deviated from the planned trajectory;
generate a set of candidate trajectories for the bottom hole assembly to return to the planned trajectory using at least a portion of the data, wherein each candidate trajectory of the set of candidate trajectories is aimed at a respective one of the one or more possible targets on the path to the final target, wherein the set of candidate trajectories includes one or more first candidate trajectories configured to return the bottom hole assembly to the planned trajectory at a target A of the one or more possible targets on the path to the final target and one or more second candidate trajectories configured to return the bottom hole assembly to the planned trajectory at a target B of the one or more possible targets on the path to the final target, wherein the target B is at a different position on the path to the final target than the target A;
generate a drill command schedule for each candidate trajectory of the set of candidate trajectories, wherein the drill command schedules provide hardware specific drill command sequences for respective candidate trajectories of the set of candidate trajectories;
rank each candidate trajectory of the set of candidate trajectories based on a cost for each candidate trajectory to reach its respective possible target on the path to the final target, wherein the cost for each candidate trajectory is based on a plurality of weighted steering properties and a plurality of weighted steering violations for each candidate trajectory;
identify a top ranked candidate trajectory based on its associated cost;
output at least the top ranked candidate trajectory and its corresponding drill command schedule;
append the top ranked candidate trajectory to the planned trajectory at the hole bottom position to generate an appended planned trajectory; and
communicate the hardware specific drill command sequences of the drill command schedule for the top ranked candidate trajectory to control the bottom hole assembly of the drillstring to access the final target from the hole bottom position via the appended planned trajectory.

19. One or more non-transitory computer-readable storage media comprising processor-executable instructions to instruct a computing system to:
receive a planned trajectory for a bottom hole assembly of a drillstring to reach a final target from a surface, wherein the planned trajectory includes one or more possible targets on a path to the final target; and
during drilling of the planned trajectory with the bottom hole assembly;
receive data for the bottom hole assembly associated with the bottom hole assembly implementing the planned trajectory;
based on the data, determine that a hole bottom position of the bottom hole assembly has deviated from the planned trajectory;
generate a set of candidate trajectories for the bottom hole assembly to return to the planned trajectory using at least a portion of the data, wherein each candidate trajectory of the set of candidate trajectories is aimed at a respective one of the one or more possible targets on the path to the final target, wherein the set of candidate trajectories includes one or more first candidate trajectories configured to return the bottom hole assembly to the planned trajectory at a target A of the one or more possible targets on the path to the final target and one or more second candidate trajectories configured to return the bottom hole assembly to the planned trajectory at a target B of the one or more possible targets on the path to the final target, wherein the target B is at a different position on the path to the final target than the target A;
generate a drill command schedule for each candidate trajectory of the set of candidate trajectories, wherein the drill command schedules provide hardware specific drill command sequences for respective candidate trajectories of the set of candidate trajectories;

rank each candidate trajectory of the set of candidate trajectories based on a cost for each candidate trajectory to reach its respective possible target on the path to the final target, wherein the cost for each candidate trajectory is based on a plurality of weighted steering properties and a plurality of weighted steering violations for each candidate trajectory;

identify a top ranked candidate trajectory based on its associated cost;

output at least the top ranked candidate trajectory and its corresponding drill command schedule;

append the top ranked candidate trajectory to the planned trajectory at the hole bottom position to generate an appended planned trajectory; and communicate the hardware specific drill command sequences of the drill command schedule for the top ranked candidate trajectory to control the bottom hole assembly of the drillstring to access the final target from the hole bottom position via the appended planned trajectory.

20. The method of claim 10, wherein the method is performed automatically and without user input.

* * * * *